(12) United States Patent
Yamazaki et al.

(10) Patent No.: US 11,785,827 B2
(45) Date of Patent: Oct. 10, 2023

(54) DISPLAY DEVICE AND DRIVING METHOD OF DISPLAY DEVICE

(71) Applicant: SEMICONDUCTOR ENERGY LABORATORY CO., LTD., Atsugi (JP)

(72) Inventors: Shunpei Yamazaki, Tokyo (JP); Kohei Yokoyama, Kanagawa (JP); Takaaki Nagata, Kanagawa (JP); Tatsuya Sakuishi, Kanagawa (JP); Akio Yamashita, Kanagawa (JP); Yasuhiro Jinbo, Kanagawa (JP); Hideaki Shishido, Kanagawa (JP); Tetsuji Ishitani, Kanagawa (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 0 days.

(21) Appl. No.: 17/521,283

(22) Filed: Nov. 8, 2021

(65) Prior Publication Data
US 2022/0130918 A1 Apr. 28, 2022

Related U.S. Application Data

(63) Continuation of application No. 16/346,660, filed as application No. PCT/IB2017/056781 on Nov. 1, 2017, now abandoned.

(30) Foreign Application Priority Data

Nov. 10, 2016 (JP) ................................. 2016-219350
Nov. 30, 2016 (JP) ................................. 2016-233422
May 19, 2017 (JP) ................................. 2017-099585

(51) Int. Cl.
*H10K 59/50* (2023.01)
*G02F 1/1333* (2006.01)
(Continued)

(52) U.S. Cl.
CPC ............ *H10K 59/50* (2023.02); *G02F 1/1368* (2013.01); *G02F 1/133345* (2013.01); *G02F 1/136286* (2013.01); *G02F 2203/64* (2013.01)

(58) Field of Classification Search
CPC ............. H01L 27/3232; H01L 27/3225; G02F 1/136286; G02F 1/136213; G02F 1/13624; G02F 1/136245; H10K 59/50
See application file for complete search history.

(56) References Cited

U.S. PATENT DOCUMENTS 6,211,933 B1  4/2001  Mizunuma et al.
6,816,140 B2  11/2004  Fujieda
(Continued)

FOREIGN PATENT DOCUMENTS

CN  001359022 A  7/2002
CN  001584671 A  2/2005
(Continued)

OTHER PUBLICATIONS

International Search Report (Application No. PCT/IB2017/056781) dated Feb. 13, 2018.
(Continued)

*Primary Examiner* — Jia X Pan
(74) *Attorney, Agent, or Firm* — NIXON PEABODY LLP; Jeffrey L. Costellia

(57) ABSTRACT

A display device that can switch between normal display and see-through display is provided. Visibility in see-through display is improved. A liquid crystal element overlaps with a light-emitting element. The light-emitting element, a transistor, and the like overlapping with the liquid crystal element transmit visible light. When the liquid crystal element blocks external light, an image is displayed with the light-emitting element. When the liquid crystal element transmits external light, an image displayed with the light-
(Continued)

emitting element is superimposed on a transmission image through the liquid crystal element.

10 Claims, 29 Drawing Sheets

(51) Int. Cl.
*G02F 1/1362* (2006.01)
*G02F 1/1368* (2006.01)

(56) References Cited

U.S. PATENT DOCUMENTS

| | | | |
|---|---|---|---|
| 7,248,235 B2 | 7/2007 | Fujii et al. | |
| 7,598,927 B2 | 10/2009 | Yamazaki et al. | |
| 8,456,382 B2 | 6/2013 | Yamazaki et al. | |
| 8,791,878 B2 | 7/2014 | Yamazaki et al. | |
| 8,957,889 B2 | 2/2015 | Miyake | |
| 9,305,988 B2 | 4/2016 | Miyake | |
| 9,443,455 B2 | 9/2016 | Hiroki et al. | |
| 9,558,687 B2 | 1/2017 | Hiroki | |
| 9,648,311 B2 | 5/2017 | Yoshino et al. | |
| 9,651,816 B2 | 5/2017 | Kim et al. | |
| 9,721,998 B2 | 8/2017 | Yamazaki | |
| 9,846,999 B1 | 12/2017 | Pickover et al. | |
| 9,857,867 B2 | 1/2018 | Kumar et al. | |
| 10,175,749 B2 | 1/2019 | Kumar et al. | |
| 10,218,967 B2 | 2/2019 | Hiroki | |
| 10,509,460 B2 | 12/2019 | Kumar et al. | |
| 2005/0041009 A1 | 2/2005 | Kuroda | |
| 2006/0193600 A1 | 8/2006 | Miyazawa | |
| 2007/0109465 A1 | 5/2007 | Jung et al. | |
| 2007/0138941 A1 | 6/2007 | Jin et al. | |
| 2011/0122344 A1 | 5/2011 | Matsumuro et al. | |
| 2011/0122355 A1 | 5/2011 | Matsumuro et al. | |
| 2011/0267279 A1 | 11/2011 | Alvarez Rivera et al. | |
| 2012/0249789 A1 | 10/2012 | Satoh | |
| 2013/0075594 A1 | 3/2013 | Kozuma | |
| 2013/0194167 A1 | 8/2013 | Yun et al. | |
| 2013/0314647 A1 | 11/2013 | Yim et al. | |
| 2014/0168263 A1 | 6/2014 | Avci et al. | |
| 2015/0022561 A1 | 1/2015 | Ikeda et al. | |
| 2015/0123896 A1 | 5/2015 | Tamaki | |
| 2016/0054173 A1 | 2/2016 | Kim et al. | |
| 2016/0154259 A1 | 6/2016 | Kim et al. | |
| 2016/0239937 A1 | 8/2016 | Kim et al. | |
| 2016/0260396 A1 | 9/2016 | Miyake et al. | |
| 2016/0299387 A1 | 10/2016 | Yamazaki et al. | |
| 2017/0219826 A1 | 8/2017 | Haseltine et al. | |
| 2017/0271415 A1 | 9/2017 | Yamazaki | |
| 2018/0026082 A1 | 1/2018 | Lee et al. | |
| 2018/0190735 A1 | 7/2018 | Son et al. | |
| 2020/0057330 A1 | 2/2020 | Yamazaki et al. | |
| 2020/0372779 A1 | 11/2020 | Moriya | |

FOREIGN PATENT DOCUMENTS

| | | | |
|---|---|---|---|
| CN | 001591523 A | 3/2005 | |
| CN | 001829305 A | 9/2006 | |
| CN | 001988169 A | 6/2007 | |
| CN | 102084412 A | 6/2011 | |
| CN | 102099848 A | 6/2011 | |
| CN | 102682688 A | 9/2012 | |
| CN | 102714710 A | 10/2012 | |
| CN | 103094307 A | 5/2013 | |
| CN | 103226929 A | 7/2013 | |
| CN | 103455212 A | 12/2013 | |
| CN | 104280917 A | 1/2015 | |
| CN | 104956428 A | 9/2015 | |
| CN | 105190409 A | 12/2015 | |
| CN | 106255999 A | 12/2016 | |
| EP | 1510994 A | 3/2005 | |
| EP | 1515295 A | 3/2005 | |
| EP | 1801881 A | 6/2007 | |
| EP | 2312559 A | 4/2011 | |
| EP | 2312560 A | 4/2011 | |
| EP | 2512133 A | 10/2012 | |
| EP | 2624300 A | 8/2013 | |
| EP | 2757549 A | 7/2014 | |
| EP | 3564946 A | 11/2019 | |
| EP | 3591646 A | 1/2020 | |
| JP | 09-113867 A | 5/1997 | |
| JP | 11-202332 A | 7/1999 | |
| JP | 2003-157029 A | 5/2003 | |
| JP | 2005-070074 A | 3/2005 | |
| JP | 2007-096055 A | 4/2007 | |
| JP | 2007-123861 A | 5/2007 | |
| JP | 2007-171932 A | 7/2007 | |
| JP | 2008-083510 A | 4/2008 | |
| JP | 2008-242134 A | 10/2008 | |
| JP | 2009-075610 A | 4/2009 | |
| JP | 2010-032642 A | 2/2010 | |
| JP | 2010-032643 A | 2/2010 | |
| JP | 2013-076994 A | 4/2013 | |
| JP | 2013-156635 A | 8/2013 | |
| JP | 2014-010460 A | 1/2014 | |
| JP | 2014164182 A | * 9/2014 | |
| JP | 2017-037288 A | 2/2017 | |
| JP | 2018-189937 A | 11/2018 | |
| KR | 10-0732849 | 6/2007 | |
| KR | 2011-0050434 A | 5/2011 | |
| KR | 2011-0053420 A | 5/2011 | |
| KR | 2013-0088686 A | 8/2013 | |
| TW | 201013285 | 4/2010 | |
| TW | 201013606 | 4/2010 | |
| TW | 201243433 | 11/2012 | |
| WO | WO-2010/010846 | 1/2010 | |
| WO | WO-2010/010847 | 1/2010 | |
| WO | WO-2013/180651 | 12/2013 | |
| WO | WO-2014/116014 | 7/2014 | |
| WO | WO-2016/166636 | 10/2016 | |
| WO | WO-2018/087625 | 5/2018 | |

OTHER PUBLICATIONS

Written Opinion (Application No. PCT/IB2017/056781) dated Feb. 13, 2018.
Chinese Office Action (Application No. 201780069478.1) dated Feb. 1, 2021.
Chinese Office Action (Application No. 201780069478.1) dated Jan. 26, 2022.
Chinese Office Action (Application No. 201780069478.1) dated May 25, 2022.

* cited by examiner

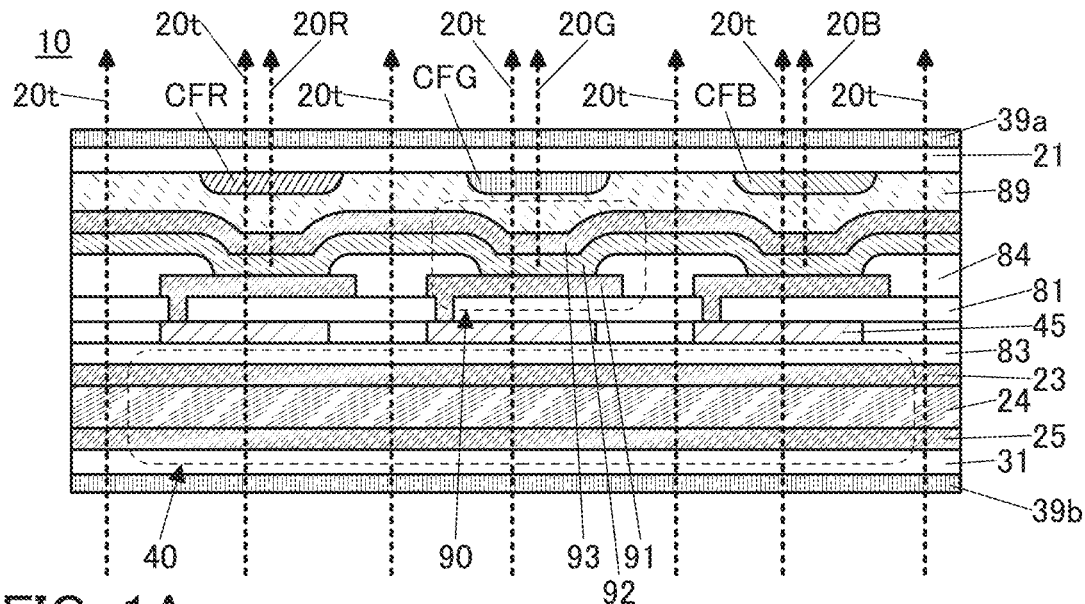
FIG. 1A
FIG. 1B
Emission mode (VR Mode)
FIG. 1C
See-through Mode (AR Mode)
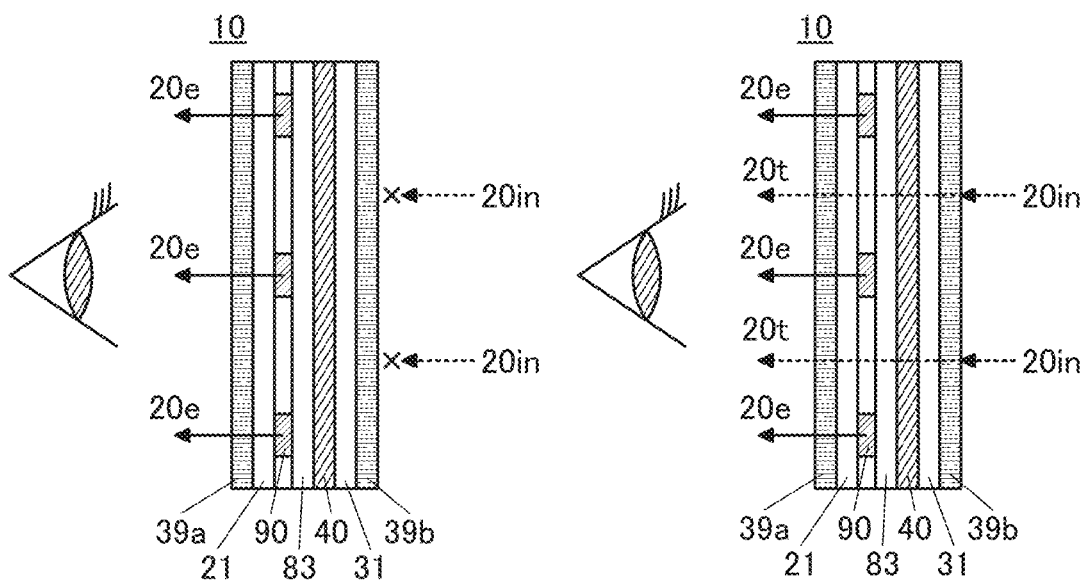

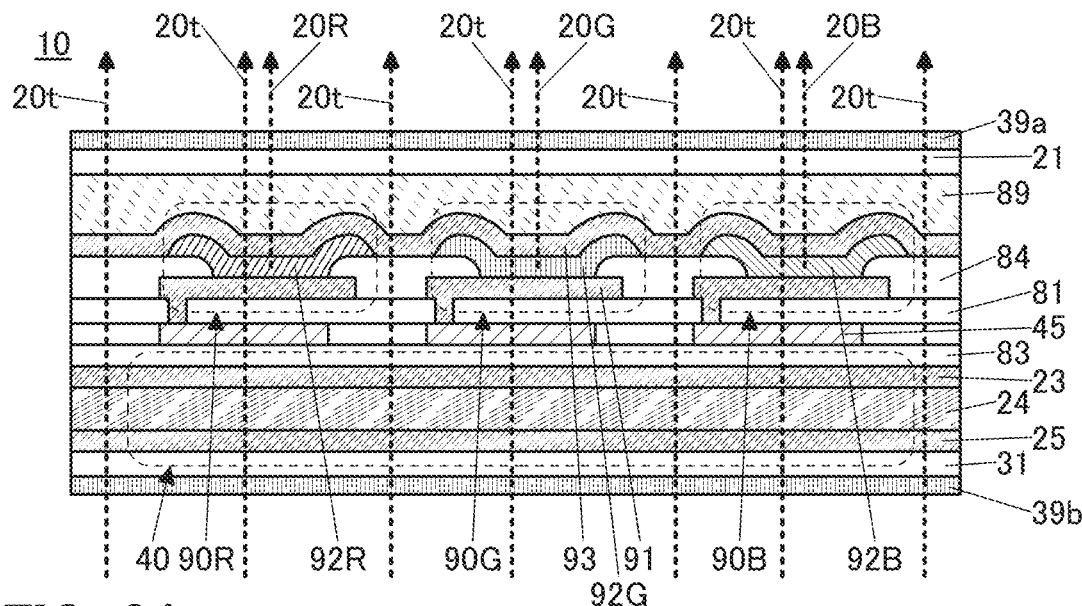
FIG. 2A
FIG. 2B
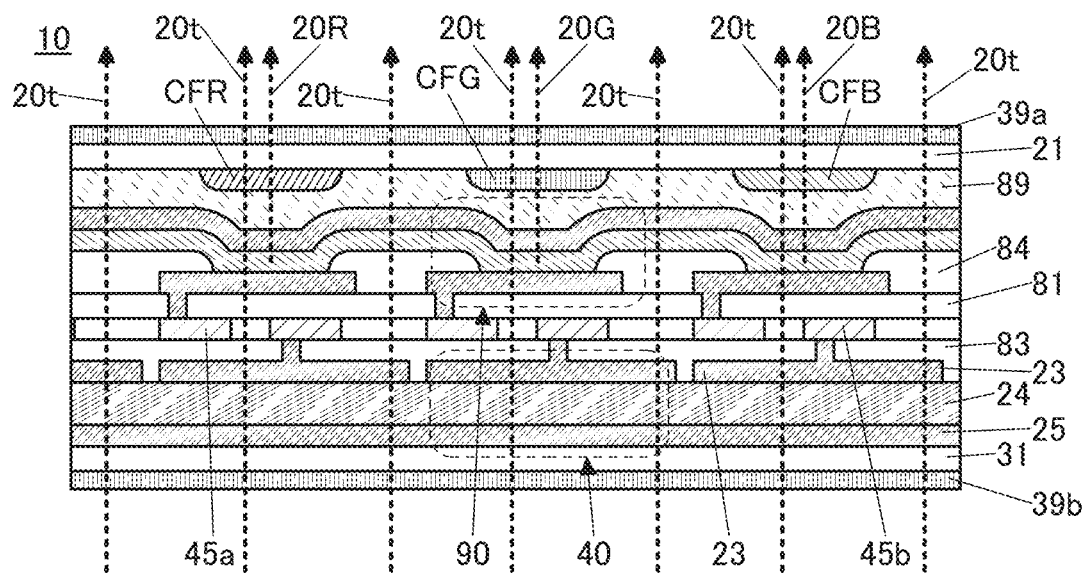

FIG. 3A1
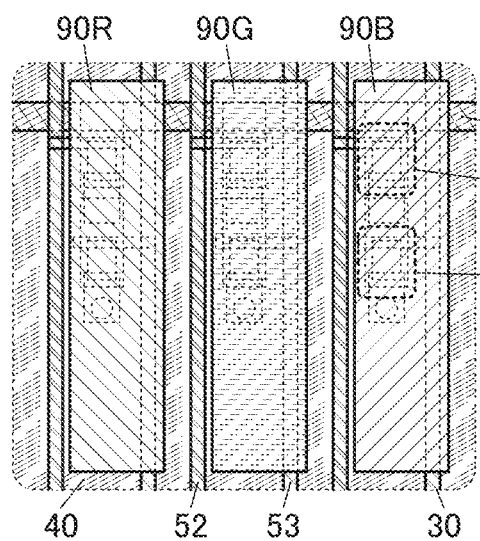
FIG. 3A2
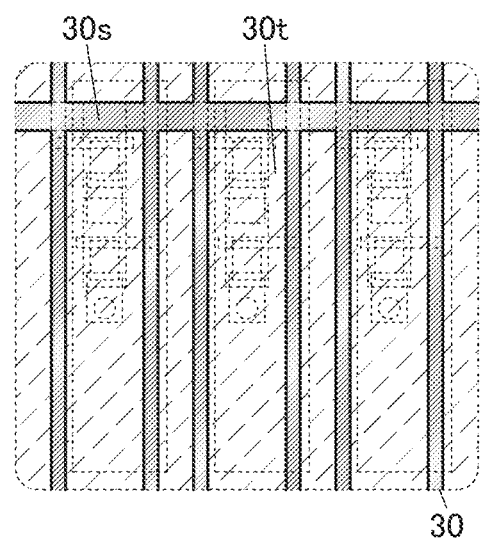
FIG. 3B1
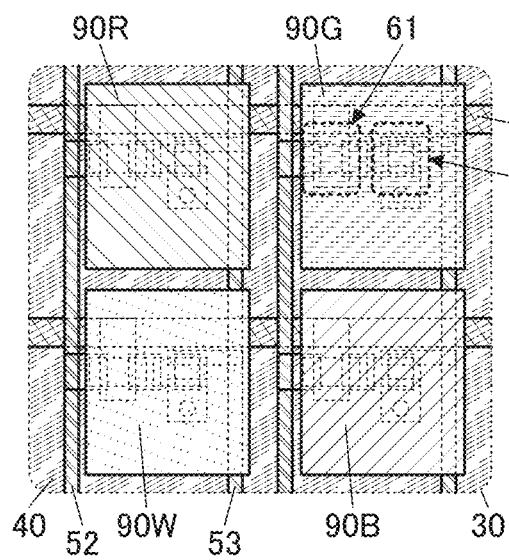
FIG. 3B2
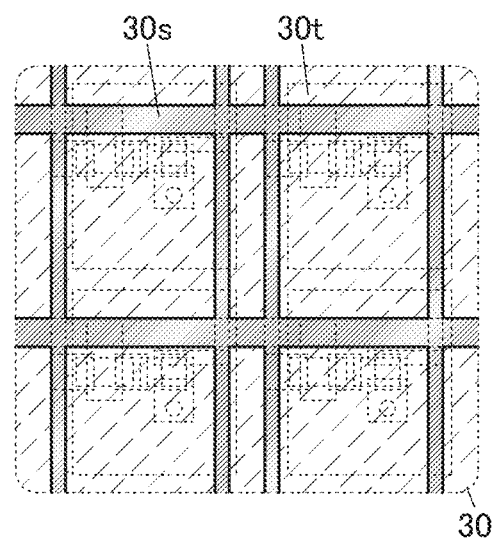

FIG. 4A1
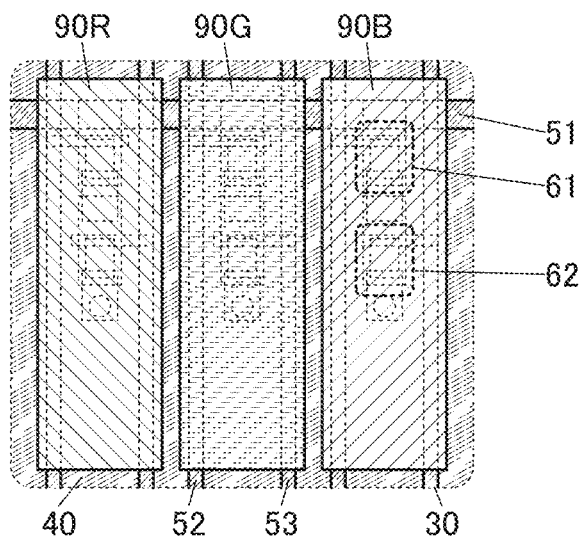
FIG. 4A2
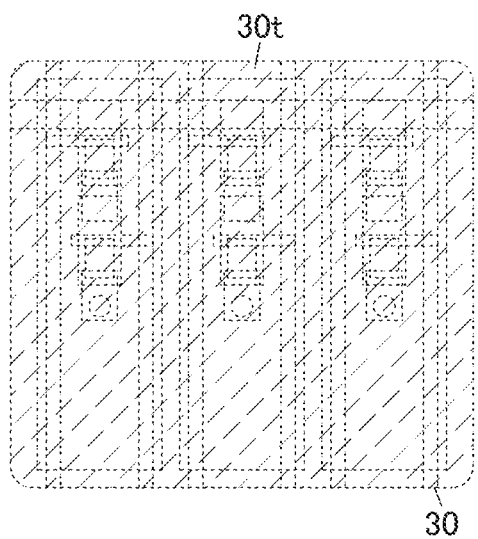
FIG. 4B1
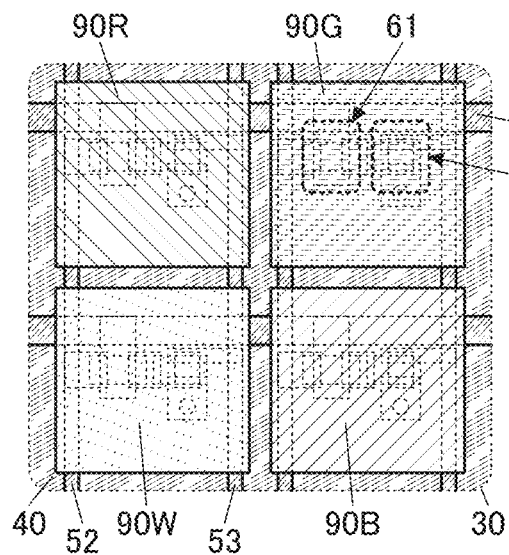
FIG. 4B2
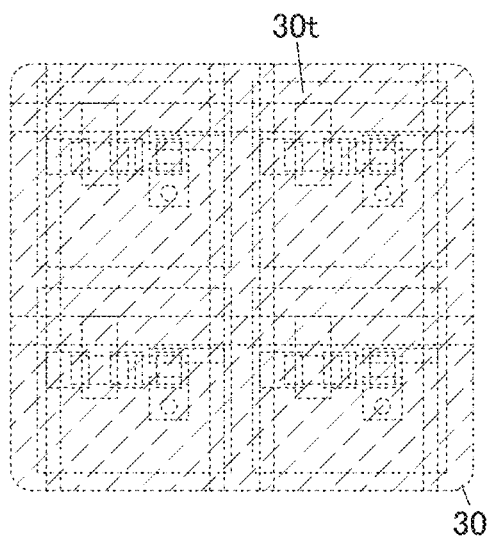

FIG. 8A
FIG. 8B
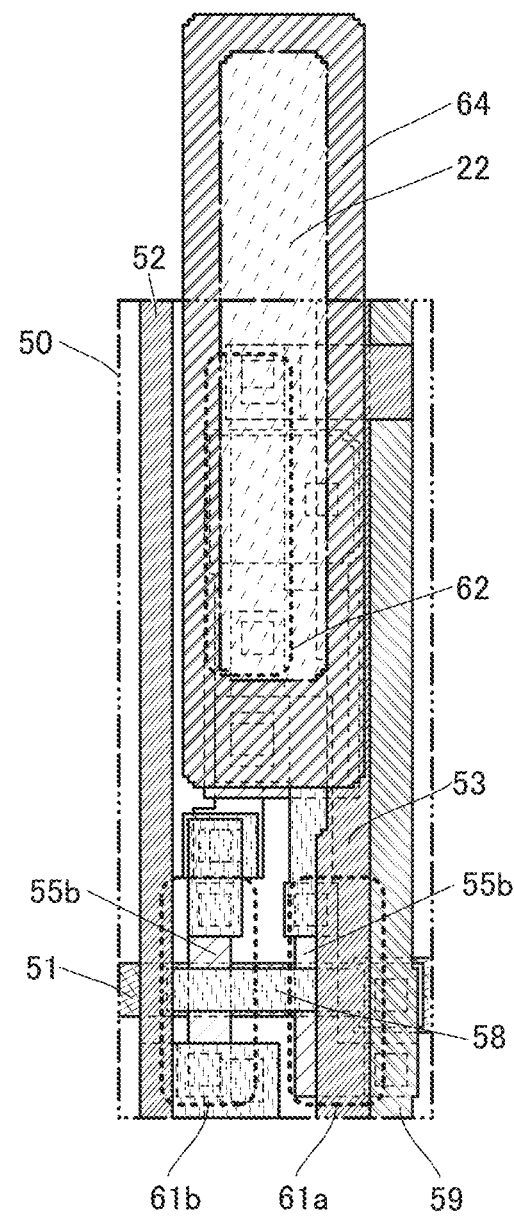
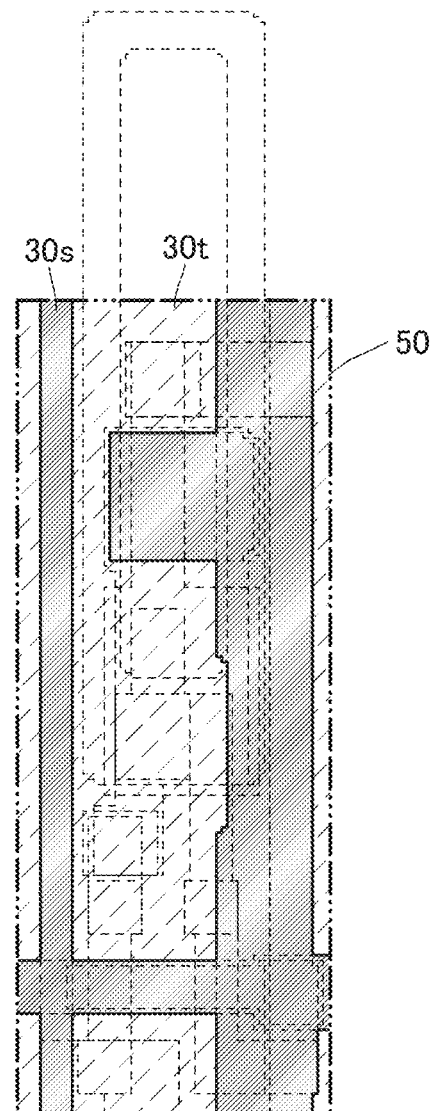

FIG. 9A
FIG. 9B
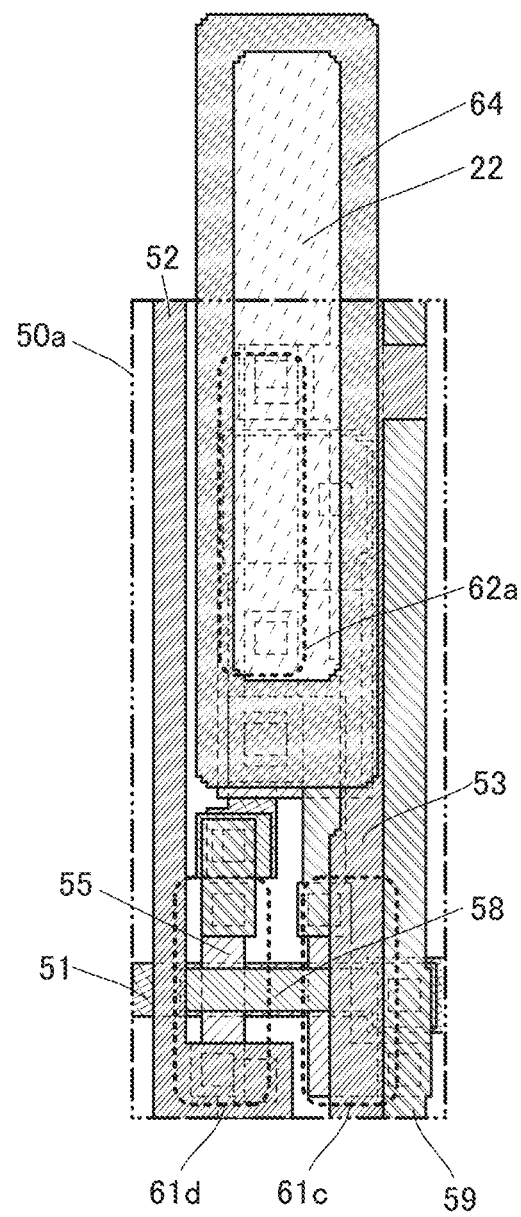
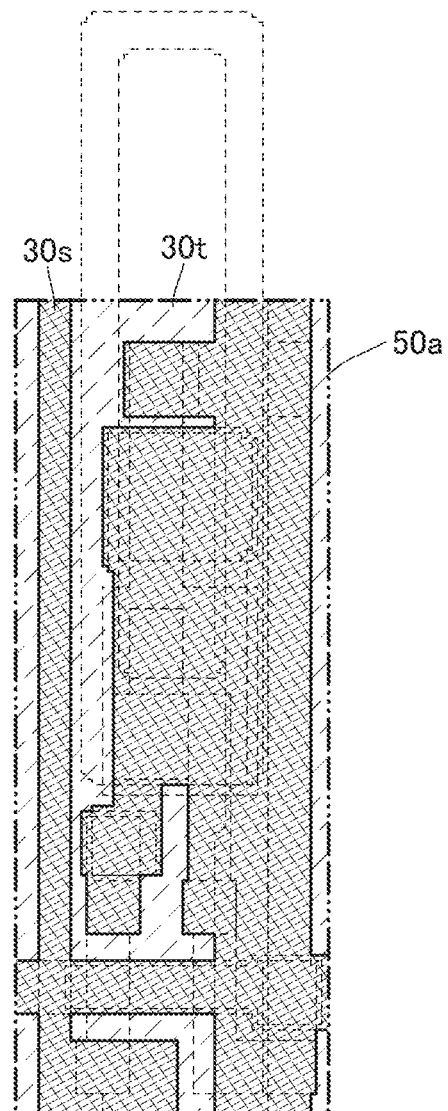

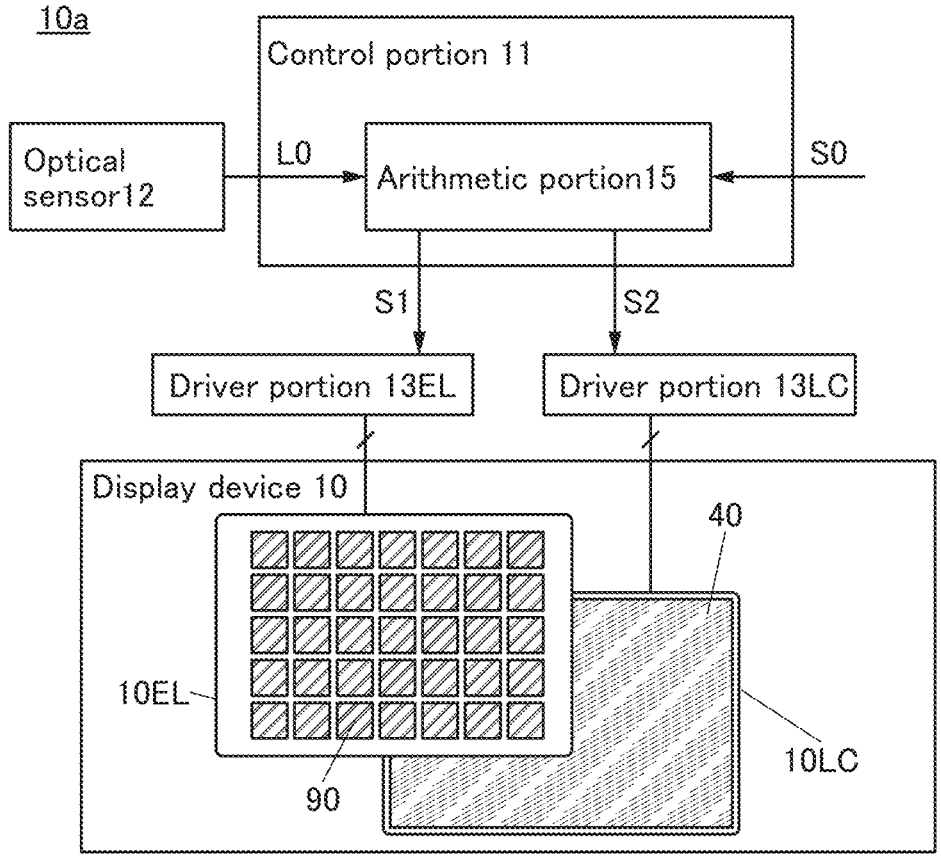

FIG. 11A1
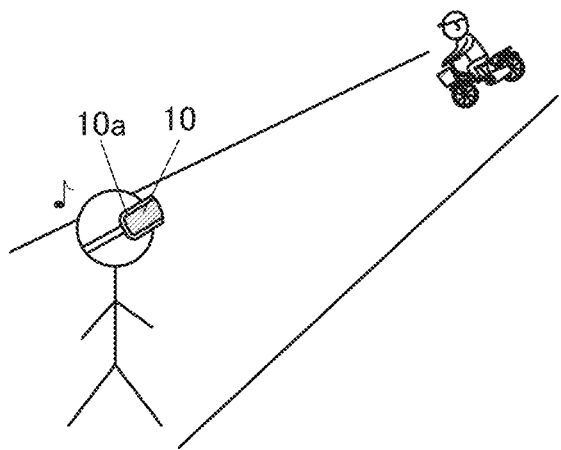
FIG. 11A2
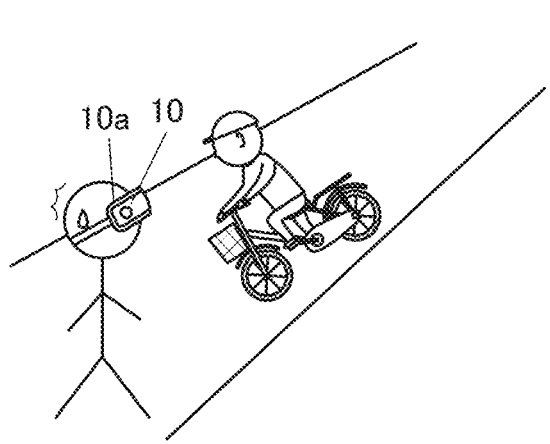
FIG. 11B1
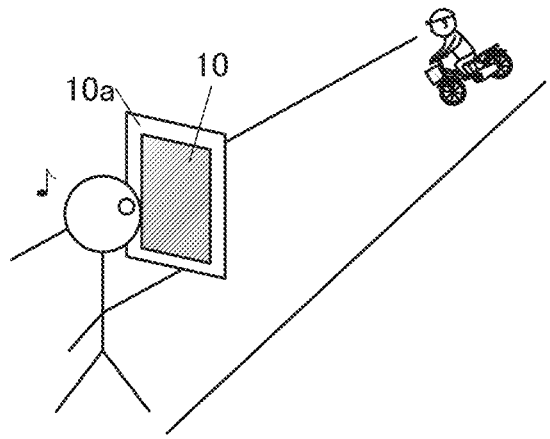
FIG. 11B2
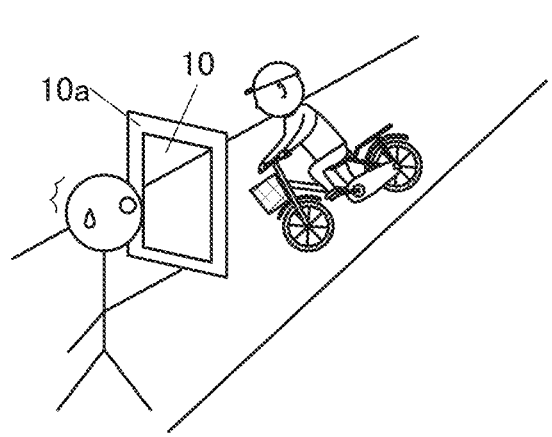

FIG. 13A1
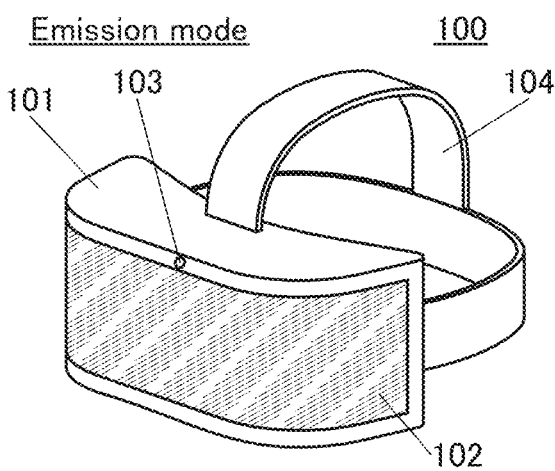
FIG. 13A2
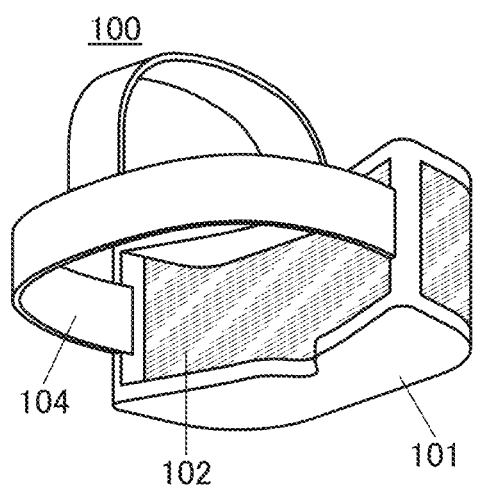
FIG. 13B
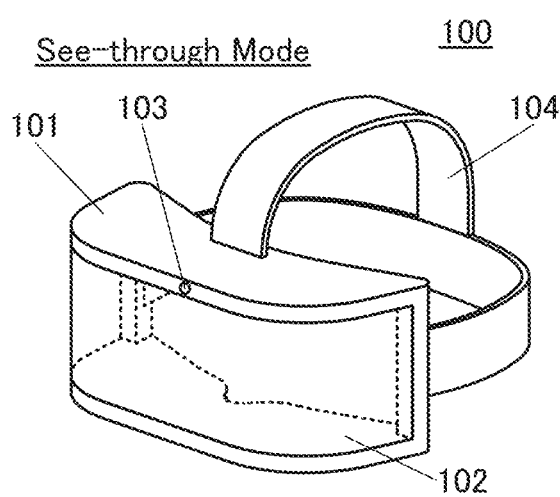
FIG. 13C
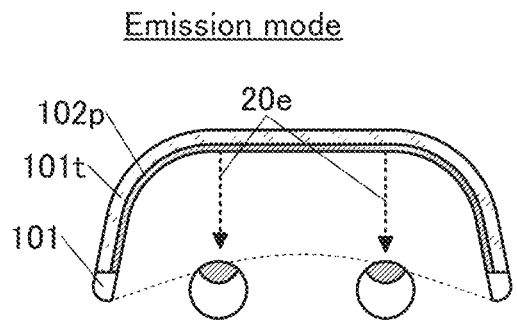
FIG. 13D
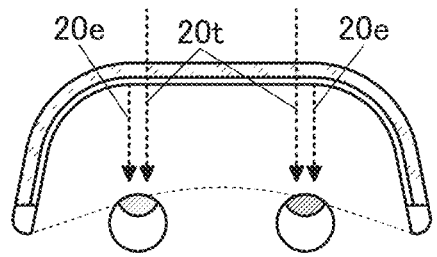

FIG. 14A
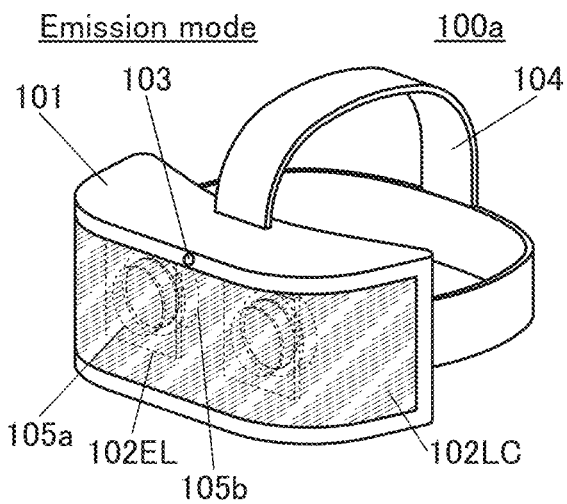
FIG. 14B
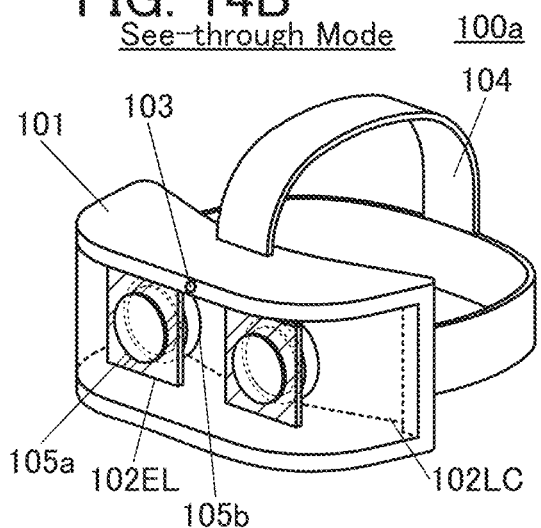
FIG. 14C
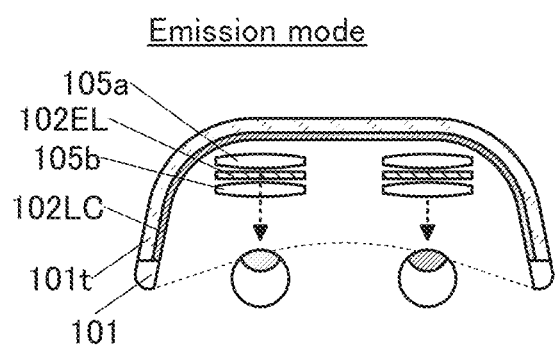
FIG. 14D
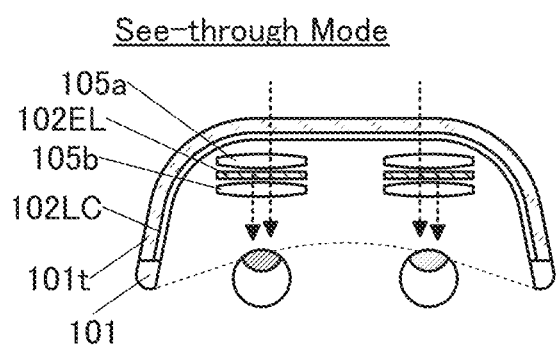
FIG. 14E1
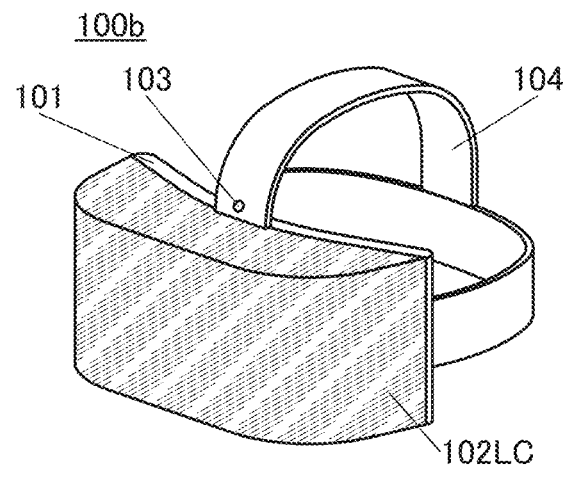
FIG. 14E2
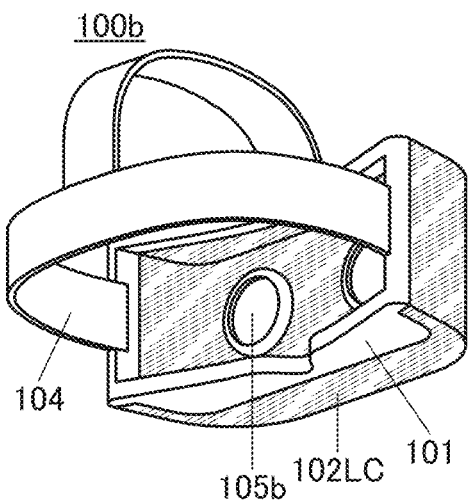

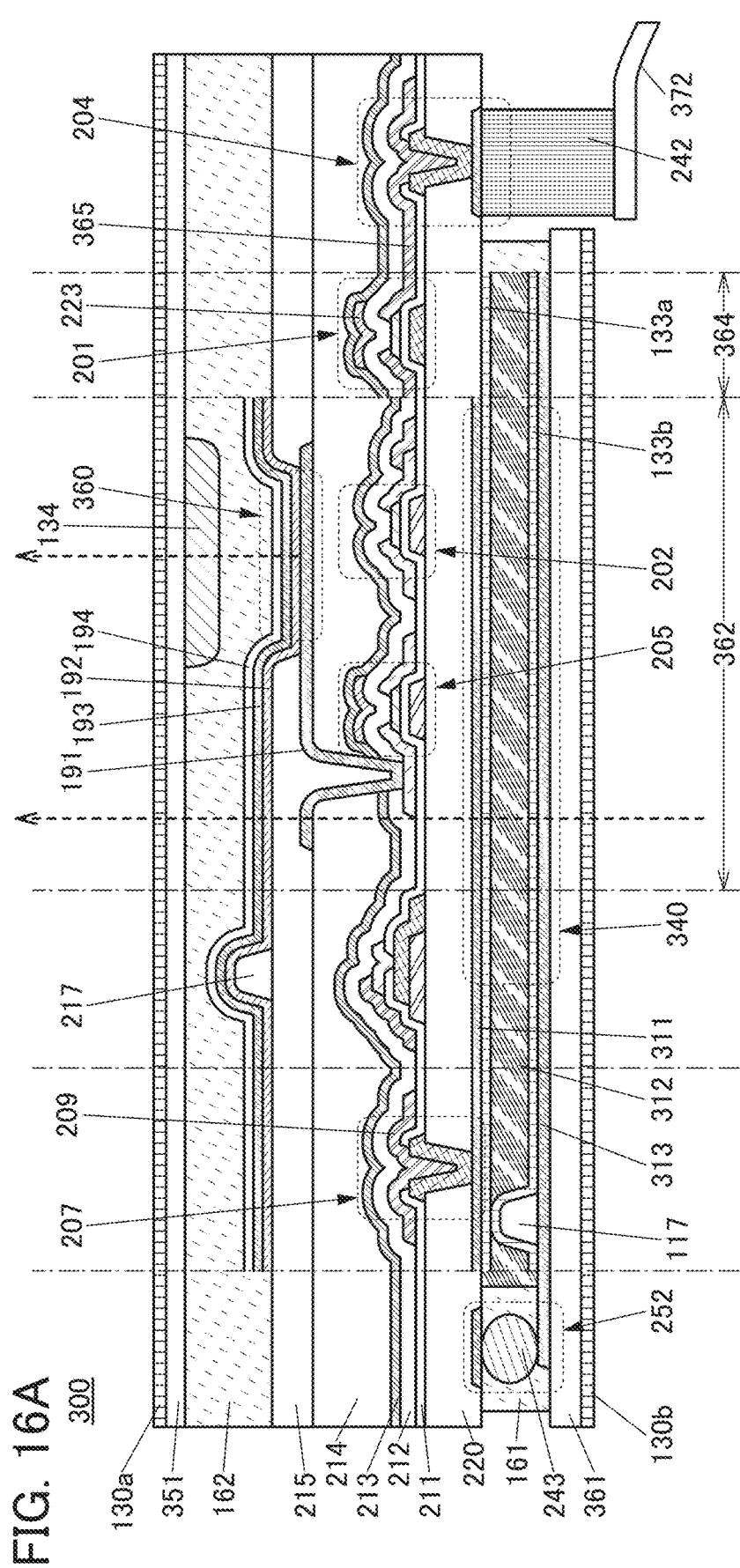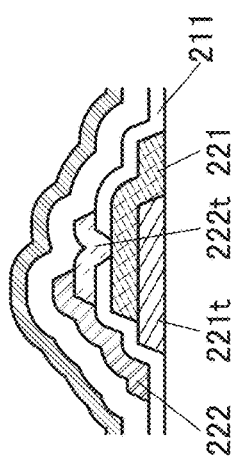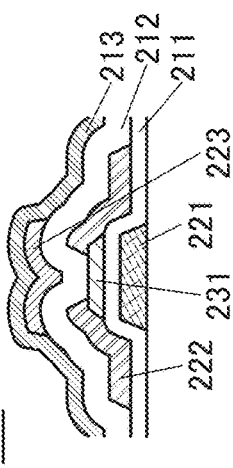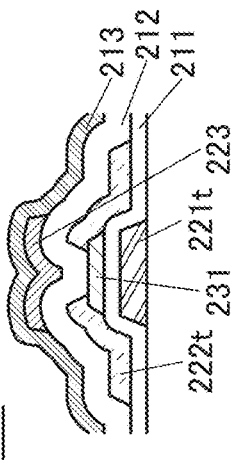

VR mode

AR mode

Background image  display image  Superimposed image

Prism

VR mode

AR Mode

DISPLAY DEVICE AND DRIVING METHOD OF DISPLAY DEVICE

TECHNICAL FIELD

One embodiment of the present invention relates to a display device, a manufacturing method of the display device, and a driving method of the display device.

Note that one embodiment of the present invention is not limited to the above technical field. Examples of the technical field of one embodiment of the present invention disclosed in this specification and the like include a semiconductor device, a display device, a light-emitting device, a power storage device, a memory device, an electronic device, a lighting device, an input device, an input/output device, a driving method thereof, and a manufacturing method thereof.

In this specification and the like, a semiconductor device generally means a device that can function by utilizing semiconductor characteristics. A transistor, a semiconductor circuit, an arithmetic device, a memory device, and the like are each an embodiment of the semiconductor device. In addition, an imaging device, an electro-optical device, a power generation device (e.g., a thin film solar cell and an organic thin film solar cell), and an electronic device each may include a semiconductor device.

BACKGROUND ART

In recent years, the diversification of display devices has been required. A variety of possible display devices includes a display device having a see-through capability. The display device has a light-transmitting display portion through which the background behind the display portion can be seen. Expectative applications of such a see-through display device are, for example, windshields of vehicles; windows of architectural structures such as houses and buildings; glass for show windows or showcases of stores; information terminal devices such as cellular phones and tablet terminals; wearable displays such as head mounted displays; and head-up displays used for cars and planes.

Display devices using organic electroluminescent (EL) elements or liquid crystal elements have been known. Examples of the display device also include a light-emitting device provided with a light-emitting element such as a light-emitting diode (LED), and electronic paper performing display with an electrophoretic method or the like.

The organic EL element generally has a structure in which a layer containing a light-emitting organic compound is provided between a pair of electrodes. By voltage application to this element, the light-emitting organic compound can emit light. A display device including such an organic EL element can be thin and lightweight and have high contrast and low power consumption.

An active matrix liquid crystal display device, in which a transistor whose channel formation region includes a metal oxide is used as a switching element connected to a pixel electrode, has been known (see Patent Document 1 and Patent Document 2).

REFERENCE

Patent Document

[Patent Document 1] Japanese Published Patent Application No. 2007-123861

[Patent Document 2] Japanese Published Patent Application No. 2007-096055

DISCLOSURE OF INVENTION

Various image display techniques such as virtual reality (VR) or augmented reality (AR) have been actively developed in recent years. Thus, a display device is required to have various functions in addition to a simple function of displaying an image.

An object of one embodiment of the present invention is to provide a display device that can switch display methods. Another object is to improve visibility in see-through display. Another object is to provide a display device that can switch between normal display and see-through display. Another object is to provide a display device that offers high user safety.

Another object is to provide a novel display device or a driving method of the novel display device. Another object is to provide a highly reliable display device. Another object is to provide a lightweight display device. Another object is to provide a thin display device.

Note that the descriptions of these objects do not disturb the existence of other objects. In one embodiment of the present invention, there is no need to achieve all the objects. Note that other objects can be derived from the description of the specification, the drawings, the claims, and the like.

One embodiment of the present invention is a display device including a light-emitting element, a liquid crystal element, and a first transistor. The first transistor is electrically connected to the light-emitting element, and includes a first gate electrode, a first semiconductor layer, a first source electrode, and a first drain electrode. At least one of the first gate electrode, the first semiconductor layer, the first source electrode, and the first drain electrode has a function of transmitting visible light. The liquid crystal element overlaps with the first transistor. The liquid crystal element transmits light when applied with an electric field, and blocks light when applied with no electric field.

In the above embodiment, the light-emitting element preferably includes a first electrode, a second electrode, and a light-emitting layer between the first electrode and the second electrode. The first electrode and the second electrode each preferably have a function of transmitting visible light.

In the above embodiment, at least one of the first semiconductor layer, the first gate electrode, the first source electrode, and the first drain electrode preferably includes a metal oxide.

In the above embodiment, the display device preferably includes a second transistor electrically connected to and overlapping with the liquid crystal element. The second transistor preferably includes a second gate electrode, a second semiconductor layer, a second source electrode, and a second drain electrode. At least one of the second gate electrode, the second semiconductor layer, the second source electrode, and the second drain electrode preferably has a function of transmitting visible light.

In the above embodiment, the first transistor and the second transistor are preferably on the same plane.

In the above embodiment, the liquid crystal element may be a passive matrix liquid crystal element or a segment liquid crystal element.

In the above embodiment, the display device preferably includes a first substrate, a second substrate, and an insulating layer. It is preferable that the insulating layer be between the first substrate and the second substrate, the light-emitting element be between the first substrate and the insulating layer, and the liquid crystal element be between the second substrate and the insulating layer. In addition, at least one of the first gate electrode, the first semiconductor layer, the first source electrode, and the first drain electrode is preferably in contact with the insulating layer.

In the above embodiment, the display device preferably includes a wiring electrically connected to the liquid crystal element. The first transistor and the wiring are preferably between the insulating layer and the first substrate, and the wiring is preferably electrically connected to the liquid crystal element in an opening in the insulating layer. The display device preferably further includes a second transistor electrically connected to the wiring. The wiring preferably has a function of transmitting visible light.

In the above embodiment, the display device preferably includes a first wiring and a second wiring intersecting with each other. The first wiring is preferably electrically connected to the first gate electrode of the first transistor, and the second wiring is preferably electrically connected to one of the first source electrode and the first drain electrode of the first transistor. The first wiring and the second wiring can each have a function of blocking visible light. Alternatively, the first wiring and the second wiring may each have a function of transmitting visible light.

According to one embodiment of the present invention, a display device that can switch display methods can be provided. Visibility in see-through display can be improved. A display device that can switch between normal display and see-through display can be provided. A display device that offers high user safety can be provided.

A novel display device or a driving method of the novel display device can be provided. A highly reliable display device can be provided. A lightweight display device can be provided. A thin display device can be provided.

Note that the description of these effects does not preclude the existence of other effects. One embodiment of the present invention does not necessarily achieve all the effects listed above. Other effects can be derived from the description of the specification, the drawings, the claims, and the like.

BRIEF DESCRIPTION OF DRAWINGS

FIGS. 1A to 1C illustrate a structure example of a display device.

FIGS. 2A and 2B each illustrate a structure example of a display device.

FIGS. 3A1, 3A2, 3B1, and 3B2 illustrate structure examples of a display device.

FIGS. 4A1, 4A2, 4B1, and 4B2 illustrate structure examples of a display device.

FIGS. 8A and 8B illustrate a structure example of a display device.

FIGS. 9A and 9B illustrate a structure example of a display device.

FIG. 10 is a block diagram of an electronic device.

FIGS. 11A1, 11A2, 11B1, and 11B2 illustrate usage examples of electronic devices.

FIGS. 13A1, 13A2, 13B, 13C, and 13D illustrate a structure example of an electronic device, FIGS. 14A, 14B, 14C, 14D, 14E1, and 14E2 illustrate structure examples of electronic devices.

FIGS. 16A to 16D illustrate a structure example of a display panel.

BEST MODE FOR CARRYING OUT THE INVENTION

Figure 5A:
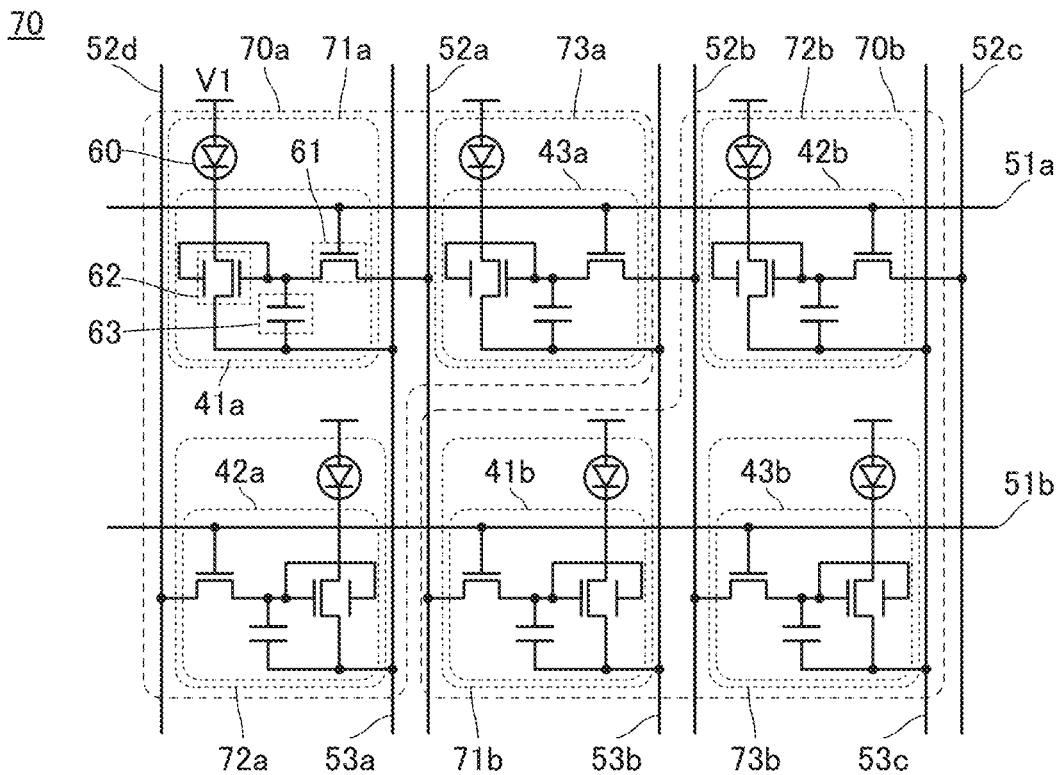
FIGS. 5A and 5B illustrate a structure example of a display device.

Embodiments will be described in detail with reference to the drawings. Note that the present invention is not limited to the following description. It will be readily appreciated by those skilled in the art that modes and details of the present invention can be modified in various ways without departing from the spirit and scope of the present invention. Thus, the present invention should not be construed as being limited to the description in the following embodiments and example.

Note that in structures of the present invention described below, the same portions or portions having similar functions are denoted by the same reference numerals in different drawings, and a description thereof is not repeated. Further, the same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, the size, the layer thickness, or the region is not limited to the illustrated scale.

Note that in this specification and the like, ordinal numbers such as "first," "second," and the like are used in order to avoid confusion among components and do not limit the number.

A transistor is a kind of semiconductor elements and can achieve amplification of current or voltage, switching operation for controlling conduction or non-conduction, or the like. An insulated-gate field effect transistor (IGFET) and a thin film transistor (TFT) are in the category of a transistor in this specification.

Note that the expressions indicating directions such as "over" and "under" are basically used to correspond to the directions of drawings. However, in some cases, the term "over" or "under" in the specification indicates a direction that does not correspond to the apparent direction in the drawings, for the purpose of easy description or the like. As an example, imagined is a situation where a stacked body is formed on a certain surface and a corresponding drawing apparently shows that the surface on which the stacked body is provided (e.g., a formation surface, a support surface, an attachment surface, or a planarization surface) is above the stacked body. In description of the stacked order (formation order) of the stacked body in the specification, a direction from the stacked body toward the surface may be expressed as "under" and the opposite direction may be expressed as "over".

Note that in this specification and the like, an EL layer means a layer containing at least a light-emitting substance (also referred to as a light-emitting layer) or a stack including the light-emitting layer, provided between a pair of electrodes of a light-emitting element.

Note that in this specification and the like, a display panel as one embodiment of the display device has a function of displaying (outputting) an image or the like on (to) a display surface; hence, the display panel is one embodiment of an output device.

In this specification and the like, a structure in which a connector such as a flexible printed circuit (FPC) or a tape carrier package (TCP) is attached to a substrate of a display panel, or a structure in which an integrated circuit (IC) is mounted on a substrate by a chip on glass (COG) method or the like is referred to as a display panel module or a display module, or simply referred to as a display panel or the like in some cases.

Embodiment 1

In this embodiment, a display device of one embodiment of the present invention will be described.

One embodiment of the present invention is a display device in which light-emitting elements emitting visible light are arranged in matrix. An image can be displayed on the display surface side of the display device by the light-emitting elements. The display device includes a liquid crystal element that overlaps with two adjacent light-emitting elements and a region between the two adjacent light-emitting elements. The liquid crystal element can make the transition between a state of transmitting visible light (transmission state) and a state of blocking visible light (non-transmission state).

When the liquid crystal element is in the transmission state, part of external light entering from the side opposite to the display surface side is transmitted through the region between the two adjacent light-emitting elements and extracted from the display surface side. Thus, an image displayed by the light-emitting elements can be superimposed on a transmission image made by the transmitted external light. This enables see-through display.

The light-emitting element preferably transmits visible light. Specifically, the light-emitting element preferably includes a pair of electrodes each of which has a light-transmitting property. This heightens the transmittance of the display device in see-through display.

When the liquid crystal element is in the non-transmission state, no external light is transmitted through the display device and thus only an image displayed by the light-emitting elements can be seen. Blocking external light transmission and using the light-emitting elements enable display of an image that has an extremely high contrast and increased sharpness. For example, the display device displaying an image for VR can provide a stronger sense of immersion and reality.

In this manner, one embodiment of the present invention enables switching between two display modes. Specifically, one embodiment of the present invention enables switching between a transmission mode (see-through mode) by which the background behind the display device can be seen through the display device and a light-emitting mode (emission mode) by which high contrast display is performed with the light-emitting elements.

For example, the display device of one embodiment of the present invention incorporated in a wearable (e.g., goggle-type or glasses-type) electronic device can be used as a display device that can freely switch between AR display and VR display. In AR display, a displayed image can be superimposed on a transmission image without the use of an image captured by a camera, which strengthens a sense of reality.

When used in a showcase or a window of a store, the above display device can heighten the advertising effect by utilizing switching between the transmission mode and the light-emitting mode.

The display device of one embodiment of the present invention can be adopted not only for VR or AR application or for commercial use such as digital signage but also for a variety of other applications.

As the light-emitting element included in the display device, an element that has a light source and performs display with light from the light source can be used. Specifically, it is preferable to use an electroluminescence element where light can be extracted from a light-emitting substance by application of an electric field. Since the luminance and the chromaticity of light emitted from such a pixel are not affected by external light, an image with high color reproducibility (a wide color gamut) and a high contrast, i.e., a clear image can be displayed.

As the light-emitting element, for example, a self-luminous light-emitting element such as an organic light-emitting diode (OLED), a light-emitting diode (LED), a quantum-dot light-emitting diode (QLED), or a semiconductor laser can be suitably used.

The liquid crystal element included in the display device is preferably a normally black liquid crystal element that blocks light when applied with no electric field. This heightens a contrast in the light-emitting mode; in addition, this reduces power consumption because application of an electric field is unnecessary in the light-emitting mode.

It is preferable that the light-emitting element be provided on the display surface side and the liquid crystal element be provided on the side (back surface side) opposite to the display surface side with the insulating layer between the light-emitting element and the liquid crystal element. This structure can decrease the number of layers present on the path of light from the light-emitting element, improving light extraction efficiency and heightening color reproducibility.

Instead of the liquid crystal element, any of various elements that can switch between the state of transmitting visible light and the state of not transmitting visible light may be used.

It is preferable to adopt an active matrix method by which the plurality of light-emitting elements are each connected to one or more transistors. It is preferable that both a transistor electrically connected to the light-emitting element and a wiring connected to the liquid crystal element be provided on the same surface side of the insulating layer. It is preferable that either electrical connection between the light-emitting element and the transistor or that between the liquid crystal element and the wiring be made in an opening provided in the insulating layer.

A display region preferably includes a plurality of pixels provided with the light-emitting elements. The pixel may include a plurality of subpixels. Part or all of wirings and electrodes in the pixel preferably include light-transmitting conductive films (e.g., an oxide conductive film). In that case, a portion where light-transmitting wirings or electrodes are provided can be used as a region that transmits visible light (transmission region), which improves transmittance in see-through display.

In particular, when a semiconductor layer, a source electrode, a drain electrode, a gate electrode, and the like of a transistor in the display region have a light-transmitting property, a region where a transistor is provided can also be used as the transmission region.

A contact portion connecting two wirings between which an insulating layer or the like is provided can also be used as the transmission region when these wirings include conductive films that transmit visible light.

The use of a conductive film having no light-transmitting property (e.g., a metal film) for other part of wirings in the display region can reduce wiring resistance. A bus line such as a scan line, a signal line, or a power supply line preferably includes a non-light-transmitting material with low electric resistance such as a metal. Note that wirings in a small display region (e.g., a display region with a size smaller than one inch diagonal) can be small in length, and thus all the wirings may include light-transmitting conductive films to heighten the light transmittance.

In contrast, a wiring, a driver circuit, or the like outside the display region preferably includes a conductive film that transmits no visible light. This reduces a resistance component of the wiring, the driver circuit, or the like, leading to high-speed operation.

One liquid crystal element may be provided in the transmission region of each pixel. Alternatively, the display region may be divided into several areas and one liquid crystal element may be provided per area including some light-emitting elements. Alternatively, one liquid crystal element may be provided across the entire display region. A plurality of liquid crystal elements enables display including both a region displayed in the transmission mode and a region displayed in the light-emitting mode. For example, see-through display can be performed partly.

When a plurality of liquid crystal elements are used, segment liquid crystal elements, passive matrix liquid crystal elements, or active matrix liquid crystal elements can be employed. A segment liquid crystal element or a passive matrix liquid crystal element is connected to a wiring in the display region. An active matrix liquid crystal element is connected to one or more transistors in the display region.

A wiring, a transistor, or the like that is electrically connected to a liquid crystal element also preferably includes a conductive film that transmits visible light.

The light-emitting elements are preferably arranged in the display region in such a way as to give extremely high definition. Higher definition is more preferable; specifically, the light-emitting elements are preferably arranged in the display region to give a definition higher than or equal to 300 ppi and lower than or equal to 10,000 ppi, preferably higher than or equal to 500 ppi and lower than or equal to 5,000 ppi, further preferably higher than or equal to 700 ppi and lower than or equal to 4,000 ppi, or still further preferably higher than or equal to 1,000 ppi and lower than or equal to 3,000 ppi. Such a high-definition display device can be suitably used in a device with a relatively short viewing distance, such as a wearable (e.g., goggle-type or glasses-type) electronic device or a mobile information terminal.

Digital signage or a large display device, which presumably has a relatively long viewing distance (e.g., 1 m or longer), does not require a high definition; thus, a definition higher than or equal to 1 ppi and lower than 300 ppi may be acceptable.

A more specific example is described below with reference to drawings.

STRUCTURE EXAMPLE

FIG. 1A illustrates an example of a cross-sectional structure of a display device 10.

The display device 10 includes a functional layer 45, an insulating layer 81, an insulating layer 83, a light-emitting element 90, a liquid crystal element 40, and the like between a substrate 21 and a substrate 31. A polarizing plate 39a is provided on the outer side of the substrate 21, and a polarizing plate 39b is provided on the outer side of the substrate 31. The substrate 21 side corresponds to the display surface side of the display device 10.

The light-emitting element 90 includes a conductive layer 91, a conductive layer 93, and an EL layer 92 between the conductive layers 91 and 93. The EL layer 92 includes at least a light-emitting substance. The conductive layer 91 is provided for each pixel (each subpixel) and functions as a corresponding pixel electrode. The conductive layer 93 is shared by a plurality of pixels. The conductive layer 93 is connected to a wiring supplied with a constant potential in a region that is not illustrated and functions as a common electrode.

The conductive layers 91 and 93 in the light-emitting element 90 transmit visible light. Thus, the light-emitting element 90 is a dual-emission light-emitting element that emits light to both the substrate 21 side and the substrate 31 side by application of a voltage between the conductive layers 91 and 93. The light-emitting element 90 transmits visible light, and thus can serve as part of the transmission region.

The liquid crystal element 40 includes a conductive layer 23, a conductive layer 25, and a liquid crystal 24 between the conductive layers 23 and 25. The conductive layers 23 and 25 each transmit visible light. Thus, the liquid crystal element 40 is a transmissive liquid crystal element that can control the amount of visible light to be transmitted.

The conductive layers 23 and 25 are connected to different wirings in a region not illustrated. One of the two wirings is supplied with a fixed potential, and the other is supplied with a signal (potential) for controlling the orientation state of the liquid crystal element.

Here, the conductive layers 23 and 25 overlap with a plurality of light-emitting elements 90. That is, the liquid crystal element 40 is provided across a plurality of pixels.

The functional layer 45 includes a circuit for driving the light-emitting element 90. For example, the functional layer 45 includes a pixel circuit including a transistor, a capacitor, a wiring, an electrode, and the like.

At least one of a gate electrode, a semiconductor layer, a source electrode, and a drain electrode of the transistor in the functional layer 45 has a light-transmitting property. It is particularly preferable that all of them have a light-transmitting property. In that case, the transistor transmits visible light, and thus can serve as part of the transmission region.

The capacitor, the wiring, the electrode, and the like in the functional layer 45 preferably have a light-transmitting property. This increases the area of the transmission region, improving visibility in see-through display.

Wirings connected to a plurality of functional layers 45 may include a non-light-transmitting conductive material with low electric resistance such as a metal. This reduces wiring resistance. Alternatively, the wiring may include a light-transmitting conductive material. This allows a portion where the wiring is provided to be the transmission region.

The insulating layer 83 is provided between the functional layer 45 and the conductive layer 23. The conductive layer 23 may be electrically connected to a wiring provided on the substrate 31 side of the insulating layer 83 in a region not illustrated. Alternatively, the conductive layer 23 may be electrically connected to a wiring that is closer to the substrate 21 than the insulating layer 83 is, in an opening provided in the insulating layer 83 in a region not illustrated.

The insulating layer 81 is provided between the functional layer 45 and the conductive layer 91. The conductive layer 91 and the functional layer 45 are electrically connected to each other in an opening provided in the insulating layer 81. In this way, the functional layer 45 and the light-emitting element 90 are electrically connected to each other.

The insulating layer 84 is provided to cover an end portion of the conductive layer 91, and the EL layer 92 is provided to cover part of the insulating layer 84 and part of the conductive layer 91. Furthermore, the conductive layer 93 is provided to cover the EL layer 92.

An adhesive layer 89 is provided between the substrate 21 and the conductive layer 93. It can also be said that the substrate 21 and the substrate 31 are attached to each other with the adhesive layer 89. The adhesive layer 89 also functions as a sealing layer that seals the light-emitting element 90.

In this way, the two kinds of display elements (the liquid crystal element 40 and the light-emitting element 90) and the functional layer 45 for driving the light-emitting element are provided between the pair of substrates, which leads to a reduction in thickness.

The liquid crystal element 40 and the light-emitting element 90 overlap with each other with the insulating layer 83, the functional layer 45, and the like therebetween. This structure enables, for example, a reduction in a distance between the liquid crystal element 40 and the light-emitting element 90 and a decrease in the number of layers sandwiched between these elements as compared with a structure in which a display panel including a light-emitting element and a display panel including a liquid crystal element are attached to each other. Thus, this structure can provide a clearer transmission image.

For example, a distance between the upper surface of the conductive layer 23 in the liquid crystal element 40 and the lower surface of the conductive layer 91 in the light-emitting element 90 can be longer than or equal to 20 nm and shorter than 30 µm, preferably longer than or equal to 50 nm and shorter than 10 µm, or more preferably longer than or equal to 100 nm and shorter than 5 µm.

A coloring layer CFR, a coloring layer CFO, and a coloring layer CFB are each provided on the substrate 31 side of the substrate 21 to overlap with the corresponding light-emitting element 90. The coloring layer CFR, the coloring layer CFG, and the coloring layer CFB serve as color filters transmitting red light, green light, and blue light, respectively. Thus, color display can be performed with the light-emitting elements 90 that emit white light.

In FIG. 1A, the EL layer 92 is uniformly provided to be included in the plurality of light-emitting elements 90. Here, each of the light-emitting elements 90 is a light-emitting element that emits white light. Accordingly, light emitted from the light-emitting element 90 provided with the coloring layer CFR passes through the coloring layer CFR and is emitted to the display surface side as red light 20R. Similarly, green light 20G is emitted from the light-emitting element 90 provided with the coloring layer CFG, and blue light 20B is emitted from the light-emitting element 90 provided with the coloring layer CFB.

A region between two adjacent light-emitting elements 90 includes a region provided with no light-blocking member and serving as the transmission region. When the liquid crystal element 40 is in the transmission state, transmission light 20t transmitted through the liquid crystal element 40 passes through that region from the substrate 31 side to the substrate 21 side. From the display surface side, a user can see a transmission image of the background behind the display device 10.

The region between the two adjacent light-emitting elements 90 is preferably provided with no coloring layer. This prevents absorption of part of the transmission light 20t by a coloring layer, providing a clearer transmission image.

Since the light-emitting element 90 has a light-transmitting property, a portion including the light-emitting element 90 serves as the transmission region. Three rays of the transmission light 20t transmitted through the coloring layers CFR, CFG, and CFB are mixed in color and the mixed color is recognized by a user; accordingly, change in color tone can be suppressed.

The liquid crystal element 40 is preferably a normally black liquid crystal element that blocks visible light when applied with no electric field. Arrangement of the polarizing plates 39a and 39b are preferably adjusted so that the liquid crystal element 40 serves as a normally black liquid crystal element. As the polarizing plate, a linear polarizing plate can be used. Alternatively, a circularly polarizing plate in which a linear polarizing plate and a quarter-wave retardation plate are stacked may be used. When the polarizing plate 39a on the display surface side is a circularly polarizing plate, reflection of external light can be reduced. Note that the positions of the polarizing plates 39a and 39b are not limited to those illustrated in FIG. 1A, as long as the liquid crystal element 40 is between the polarizing plates 39a and 39b. For example, the polarizing plate 39a may be positioned between the conductive layer 23 and the substrate 21.

Depending on the structure of the liquid crystal element 40, one or both of the polarizing plates 39a and 39b may be omitted. For example, the use of a guest-host liquid crystal element as the liquid crystal element 40 can eliminate the polarizing plate 39a. This can further increase the light extraction efficiency of the light-emitting element 90. The use of a dispersed liquid crystal element as the liquid crystal element 40 can eliminate both polarizing plates. A decrease in the number of polarizing plates can increase the brightness of the transmission light in the transmission mode. In addition, the use of a guest-host liquid crystal element can prevent emitted light from the rear surface side of the light-emitting element 90 from leaking to the outside.

Note that any of a variety of optical members can be arranged on the outer side of the substrate 21. Examples of the optical members include a light diffusion layer (e.g., a diffusion film), an anti-reflective layer, and a light-condensing film in addition to the polarizing plate and the retardation plate. Furthermore, an antistatic film preventing the attachment of dust, a water repellent film suppressing the attachment of stain, a hard coat film suppressing generation of a scratch caused by the use, or the like may be arranged on the outer side of the substrate 21.

A touch sensor may be provided on the outer side of the substrate 21. Thus, a structure including the display device 10 and the touch sensor can function as a touch panel.

The display device 10 can switch between the light-emitting mode (emission mode) in which an image is displayed by the light-emitting elements with the liquid crystal element 40 in the non-transmission state and the transmission mode (see-through mode) in which an image displayed by the light-emitting elements is superimposed on a transmission image with the liquid crystal element 40 in the transmission state.

FIG. 1B is a schematic diagram of the display device in the light-emitting mode.

The light-emitting elements 90 can emit light 20e to the display surface side to display an image.

The liquid crystal element 40 has an orientation for blocking visible light. When the liquid crystal element 40 is a normally black liquid crystal element, an electric field is not applied to the liquid crystal element 40. Light 20in entering from the back surface of the display device 10 cannot go through the display device 10, and thus does not reach user's eyes. Specifically, the light 20in entering from the back surface of the display device 10 is polarized by the polarizing plate 39b, transmitted through the liquid crystal element 40, and blocked by the polarizing plate 39a.

As described above, the light-emitting mode does not allow the light 20in entering from the back surface of the display device 10 to reach a user, and thus enables high contrast display. Such a mode can also be referred to as a VR mode.

FIG. 1C is a schematic diagram of the display device in the transmission mode.

The light-emitting elements 90 can emit the light 20e to the display surface side to display an image, as in the light-emitting mode.

The liquid crystal element 40 has an orientation for transmitting visible light. When the liquid crystal element 40 is a normally black liquid crystal element, a sufficient electric field is applied to the liquid crystal element 40. The light 20in entering from the back surface of the display device 10 goes through the display device 10, and reaches user's eyes. Specifically, the light 20in entering from the back surface of the display device 10 is transmitted through the polarizing plate 39b, the liquid crystal element 40, and the polarizing plate 39a and casted to the display surface side as the transmission light 20t.

Therefore, the transmission mode allows a user to see both the light 20e from the light-emitting elements 90 and the transmission light 20t. That is, the image displayed with the light-emitting elements 90 can be superimposed on the background (transmission image) behind the display device 10. Such a mode can also be referred to as an AR mode.

Controlling the magnitude of the electric field applied to the liquid crystal element 40 enables controlling the amount of the transmission light 20t. For example, in the case where incident light from the sun, a light source, or the like is too bright to make a user dazzled, the degree of dazzle can be reduced by controlling the orientation in the liquid crystal element 40 and decreasing the amount of the transmission light 20t.

A gradual increase in voltage applied to the liquid crystal element 40 enables continuous change from the state of blocking external light to the state of transmitting external light at maximum, for example. The inverse continuous change from the state of transmitting external light at maximum to the state of blocking external light is also possible. This can prevent rapid change in luminance of the transmission light 20t entering user's eyes, and avoid making a user uncomfortable.

The above is the description of the structure example.

MODIFICATION EXAMPLE

A structure example partly different from that shown in FIG. 1A is described below.

Modification Example 1

As contrasted with the above example where color display is achieved by the light-emitting element 90 that can emit white light in combination with the coloring layer CFR, CFG, or CFB, the following example employs light-emitting elements each of which can emit colored light of red, green, blue, or the like.

FIG. 2A shows an example where a light-emitting element 90R that emits the red light 20R, a light-emitting element 90G that emits the green light 20G, and a light-emitting element 90B that emits the blue light 20B are provided instead of the light-emitting element 90 illustrated in FIG. 1A. The coloring layers CFR, CFG, and CFB illustrated in FIG. 1A are not provided.

The light-emitting element 90R, the light-emitting element 90G, and the light-emitting element 90B include an EL layer 92R, an EL layer 92G, and an EL layer 92B, respectively. The conductive layer 93 covers the EL layer 92R, the EL layer 92G, and the EL layer 92B.

With such a structure, the light extraction efficiencies of the light-emitting elements 90R, 90G, and 90B can be increased, so that power consumption can be reduced.

Part of layers constituting the EL layers may be formed separately for the light-emitting elements 90R, 90G, and 90B while the other layers are shared by the light-emitting elements 90R, 90G, and 90B. For example, only the light-emitting layers may be separately formed. Alternatively, among the light-emitting layers of three colors, a light-emitting layer exhibiting a color with the shortest wavelength (e.g., a light-emitting layer that emits blue light) may be shared by another display element. This simplifies a formation process of the light-emitting elements 90R, 90G, and 90B.

MODIFICATION EXAMPLE

Although the liquid crystal element 40 is provided across the plurality of pixels in the above structure, the liquid crystal element 40 can be provided per pixel.

FIG. 2B shows an example where a plurality of liquid crystal elements 40 each provided with the island-shaped conductive layer 23 are provided. Such a structure enables switching between the transmission mode and the light-emitting mode in each transmission region.

The structure in FIG. 2B includes a functional layer 45a and a functional layer 45b The functional layer 45a includes a circuit for driving the light-emitting element. The functional layer 45b serves as a pixel circuit for controlling the driving of the liquid crystal element 40, and includes at least one transistor. The conductive layer 23 and the functional layer 45b are electrically connected to each other in an opening provided in the insulating layer 83. Such a structure allows the liquid crystal element 40 to be an active matrix liquid crystal element. When the functional layer 45b just includes a wiring without a transistor, the liquid crystal element 40 can be a segment liquid crystal element or a passive matrix liquid crystal element.

At least one of a gate electrode, a semiconductor layer, a source electrode, and a drain electrode of the transistor in the functional layer 45b preferably has a light-transmitting property. It is particularly preferable that all of them have a light-transmitting property. In that case, the transistor transmits visible light, and thus can serve as part of the transmission region.

A capacitor, a wiring, an electrode, and the like in the functional layer 45b preferably have a light-transmitting property. This increases the area of the transmission region, improving visibility in see-through display.

Wirings connected to a plurality of functional layers 45b may include a non-light-transmitting conductive material with low electric resistance such as a metal. This reduces wiring resistance. Alternatively, the wiring may include a light-transmitting conductive material. This allows a portion where the wiring is provided to be the transmission region.

Here, one liquid crystal element 40 is provided per light-emitting element 90; however, one liquid crystal element 40 may be provided every some light-emitting elements 90.

[Example 1 of Pixel Layout]

An example of a pixel layout is described below.

FIG. 3A1 is a schematic top view of a pixel 30 seen from the display surface side. The pixel 30 includes three subpixels including the light-emitting elements 90R, 90G, and 90B. Each subpixel includes a transistor 61 and a transistor 62. The pixel 30 further includes the liquid crystal element 40, a wiring 51, a wiring 52, a wiring 53, and the like.

The wiring 51 serves as a scan line, for example. The wiring 52 serves as a signal line, for example. The wiring 53 serves as a line for supplying a potential to the light-emitting element, for example. The wiring 51 intersects with the wiring 52. In this example, the wiring 53 is parallel to the wiring 52. The wiring 53 may be parallel to the wiring 51.

The transistor 61 serves as a selection transistor. A gate of the transistor 61 is electrically connected to the wiring 51, and one of a source and a drain of the transistor 61 is electrically connected to the wiring 52. The transistor 62 controls a current flowing in the light-emitting element. One of a source and a drain of the transistor 62 is electrically connected to the wiring 53, and the other is electrically connected to the light-emitting element.

In FIG. 3A1, the light-emitting elements 90R, 90G, and 90B each have a strip shape long in the vertical direction, and they are arranged in the horizontal direction to form a striped pattern.

As described in the above structure example and the like, the liquid crystal element 40 is positioned closer to the back surface (opposite to the display surface) than the light-emitting elements or wirings are. FIG. 3A1 shows a region that overlaps with no light-emitting element or wiring and allows the liquid crystal element 40 to be seen from the display surface side. That region is part of the transmission region. In the transmission mode, light entering from the back surface of the display device is transmitted through that transmission region.

The wirings 51, 52, and 53 have a light-blocking property. Other layers, i.e., layers constituting the transistor 61, the transistor 62, or the like are light-transmitting films. FIG. 3A2 shows separately a transmission region 30t that transmits visible light and a light-blocking region 30s that blocks visible light that are in the pixel 30 of FIG. 3A1. The entire portion except a portion including wirings is the transmission region 30t, whereby visibility in see-through display can be improved.

FIGS. 3B1 and 3B2 illustrate an example where the pixel 30 includes four subpixels including the light-emitting elements 90R, 90G, and 90B and a light-emitting element 90W. In the example of FIGS. 3B1 and 3B2, the light-emitting elements are arranged in two columns and two rows in one pixel 30. In FIG. 3B1, the pixel 30 includes the two wirings 51, the two wirings 52, and the two wirings 53.

The light-emitting element 90W can be a light-emitting element that emits white light, for example. When the cross-sectional structure shown in FIG. 1A is employed, the light-emitting element 90W may overlap with no coloring layer.

A region that overlaps with no wiring is the transmission region 30t, as shown in FIG. 3B2.

The higher the proportion of the area of the transmission region in the area of the display region is, the larger the amount of the transmission light is. The proportion of the area of the transmission region in the area of the entire display region is, for example, greater than or equal to 1% and less than or equal to 95%, preferably greater than or equal to 10% and less than or equal to 90%, or more preferably greater than or equal to 20% and less than or equal to 80%. A particularly preferable proportion is greater than or equal to 40% or greater than or equal to 50%. The large transmission region enables switching between the light-emitting mode and the transmission mode without giving a user a feeling of strangeness.

FIGS. 4A1 and 4A2 show an example where the wirings 51, 52, and 53 of FIGS. 3A1 and 3A2 have a light-transmitting property. Similarly, FIGS. 4B1 and 4B2 show an example where the wirings 51, 52, and 53 of FIGS. 3B1 and 3B2 have a light-transmitting property. The structures shown in FIGS. 4A2 and 4B2 each allow the entire region of the pixel 30 to be the transmission region 30t.

[Example 2 of Pixel Layout]

An example of a pixel layout suitable for a high-definition display device is described below.

For example, a display device with a structure shown below can have pixels with light-emitting elements that are arranged to give a definition higher than or equal to 300 ppi and lower than or equal to 10,000 ppi, preferably higher than or equal to 500 ppi and lower than or equal to 5,000 ppi, further preferably higher than or equal to 700 ppi and lower than or equal to 4,000 ppi, or still further preferably higher than or equal to 1,000 ppi and lower than or equal to 3,000 ppi.

[Structure Example of Pixel Circuit]

FIG. 5A is an example of a circuit diagram of a pixel unit 70. The pixel unit 70 includes two pixels (a pixel 70a and a pixel 70b). In addition, the pixel unit 70 is connected to wirings 51a, 51b, 52a, 52b, 52c, 52d, 53a, 53b, and 53c and the like.

The pixel 70a includes subpixels 71a, 72a, and 73a. The pixel 70b includes subpixels 71b, 72b, and 73b. The subpixels 71a, 72a, and 73a include pixel circuits 41a, 42a, and 43a, respectively. The subpixels 71b, 72b, and 73b include pixel circuits 41b, 42b, and 43b, respectively.

Each subpixel includes a pixel circuit and a display element 60. For example, the subpixel 71a includes a pixel circuit 41a and the display element 60. A light-emitting element such as an organic EL element is used here as the display element 60.

The wirings 51*a* and 51*b* each serve as a scan line (also referred to as a gate line). The wirings 52*a*, 52*b*, 52*c*, and 52*d* each serve as a signal line (also referred to as a source line or a data line). The wirings 53*a*, 53*b*, and 53*c* each have a function of supplying a potential to the display element 60.

The pixel circuit 41*a* is electrically connected to the wirings 51*a*, 52*a*, and 53*a*. The pixel circuit 42*a* is electrically connected to the wirings 51*b*, 52*d*, and 53*a*. The pixel circuit 43*a* is electrically connected to the wirings 51*a*, 52*b*, and 53*b*. The pixel circuit 41*b* is electrically connected to the wirings 51*b*, 52*a*, and 53*b*. The pixel circuit 42*b* is electrically connected to the wirings 51*a*, 52*c*, and 53*c*. The pixel circuit 43*b* is electrically connected to the wirings 51*b*, 52*b*, and 53*c*.

With the structure shown in FIG. 5A in which two gate lines are connected to each pixel, the number of source lines can be reduced by half of the stripe arrangement. As a result, the number of ICs used as source driver circuits can be reduced by half and accordingly the number of components can be reduced.

A wiring functioning as a signal line is preferably connected to pixel circuits of the same color. For example, when a signal with an adjusted potential supplied to the wiring corrects for variation in luminance between pixels, the correction value may greatly vary between colors.

Thus, when pixel circuits connected to one signal line correspond to the same color, the correction can be performed easily.

In addition, each pixel circuit includes a transistor 61, a transistor 62, and a capacitor 63. In the pixel circuit 41*a*, for example, a gate of the transistor 61 is electrically connected to the wiring 51*a*, one of a source and a drain of the transistor 61 is electrically connected to the wiring 52*a*, and the other of the source and the drain is electrically connected to a gate of the transistor 62 and one electrode of the capacitor 63. One of a source and a drain of the transistor 62 is electrically connected to one electrode of the display element 60, and the other of the source and the drain is electrically connected to the other electrode of the capacitor 63 and the wiring 53*a*. The other electrode of the display element 60 is electrically connected to a wiring to which a potential VI is applied.

Note that the other pixel circuits are similar to the pixel circuit 41*a* except a wiring connected to the gate of the transistor 61, a wiring connected to the one of the source and the drain of the transistor 61, or a wiring connected to the other electrode of the capacitor 63 (see FIG. 5A).

In FIG. 5A, the transistor 61 serves as a selection transistor. The transistor 62 is in a series connection with the display element 60 to control a current flowing in the display element 60. The capacitor 63 has a function of holding the potential of a node connected to the gate of the transistor 62. Note that the capacitor 63 does not have to be intentionally provided in the case where an off-state leakage current of the transistor 61, a leakage current through the gate of the transistor 62, and the like are extremely small.

The transistor 62 preferably includes a first gate and a second gate electrically connected to each other as shown in FIG. 5A. The amount of current that the transistor 62 can supply can be increased owing to the two gates. Such a structure is particularly preferable for a high-resolution display device because the amount of current can be increased without increasing the size, the channel width in particular, of the transistor 62.

Note that the number of gates of the transistor 62 may be one. This structure can be manufactured in a simpler process than the above structure because a step of forming the second gate is unnecessary. The transistor 61 may have two gates. This structure enables a reduction in size of the transistors. A first gate and a second gate of each transistor can be electrically connected to each other. Alternatively, the gates may be electrically connected to different wirings. In this case, threshold voltages of the transistors can be controlled by applying different potentials to the wirings.

The electrode of the display element 60 that is electrically connected to the transistor 62 corresponds to a pixel electrode (e.g., the conductive layer 91). In FIG. 5A, the one of the electrodes of the display element 60 that is electrically connected to the transistor 62 serves as a cathode, whereas the other electrode serves as an anode. This structure is particularly effective when the transistor 62 is an n-channel transistor. When the n-channel transistor 62 is on, the potential applied from the wiring 53*a* is a source potential; accordingly, the amount of current flowing in the transistor 62 can be constant regardless of variation or change in resistance of the display element 60. Alternatively, a p-channel transistor may be used as a transistor of a pixel circuit.

[Example of Pixel Electrode Arrangement]

Figure 5B:
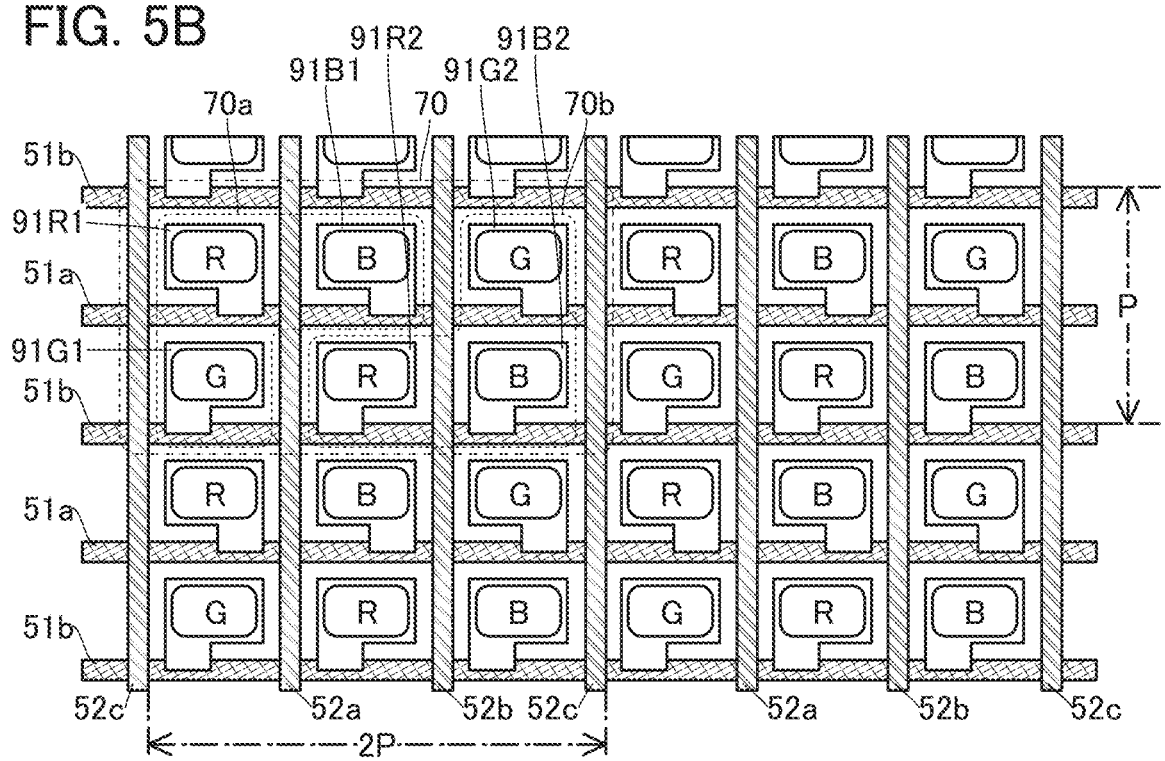

FIG. 5B is a schematic top view showing an arrangement example of pixel electrodes and wirings in the display region. The wirings 51*a* and 52*b* are alternately arranged. The wirings 52*a*, 52*b*, and 52*c* are arranged in this order to intersect with the wirings 51*a* and 51*b*, The pixel electrodes are arranged in matrix in the extending direction of the wirings 51*a* and 51*b*.

The pixel unit 70 includes the pixels 70*a* and 70*b*. The pixel 70*a* includes a pixel electrode 91R1, a pixel electrode 91G1, and a pixel electrode 91B1. The pixel 70*b* includes a pixel electrode 91R2, a pixel electrode 91G2, and a pixel electrode 91B2. A display region of each subpixel is inside the pixel electrode of the subpixel.

As shown in FIG. 5B, a pitch of the pixel units 70 arranged in the extending direction of the wiring 52*a* or the like (also referred to as the first direction) is denoted as P. A pitch of the pixel units 70 arranged in the extending direction of the wiring 51*a* the like (also referred to as the second direction) is preferably twice the pitch P (i.e., preferably the pitch 2P). In that case, distortion-free images can be displayed. The pitch P can be longer than or equal to 1 μm and shorter than or equal to 150 μm, preferably longer than or equal to 2 μm and shorter than or equal to 120 μm, further preferably longer than or equal to 3 μm and shorter than or equal to 100 μm, and still further preferably longer than or equal to 4 μm and shorter than or equal to 60 μm. Such a structure allows the display device to have extremely high definition.

It is preferable that the pixel electrode 91R1 should not overlap with the wiring 52*a* serving as a signal line and the like, for example. This can suppress change in luminance of the display element, which is caused by change in potential of the pixel electrode 91R1 and the like due to transmission of electrical noise through capacitance between, for example, the wiring 52*a* and the pixel electrode 91R1.

The pixel electrode 91R1 and the like may overlap with the wiring 51*a* or the like serving as a scan line. This can increase the area of the pixel electrode 91R1 and the aperture ratio. In the example of FIG. 5B, part of the pixel electrode 91R1 overlaps with the wiring 51*a*.

When the pixel electrode 91R1 or the like of a subpixel overlaps with the wiring 51*a* or the like serving as a scan line, the wiring serving as a scan line and overlapping with the pixel electrode is preferably connected to a pixel circuit of the subpixel. For example, a period in which a signal for changing the potential of the wiring 51*a* or the like is input corresponds to a period in which data of the subpixel is rewritten. Thus, if electrical noise would transmit from the wiring 51a or the like to the overlapping pixel electrode via capacitance, the luminance of the subpixel does not change.

[Example 1 of Pixel Layout]

A layout example of the pixel unit 70 is described below.

Figure 6A:
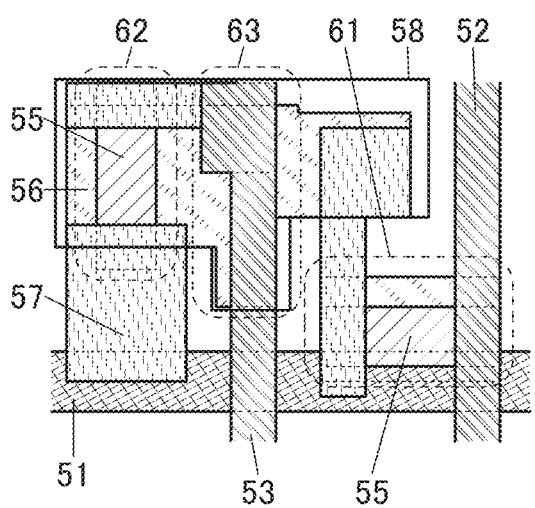
FIGS. 6A to 6D illustrate a structure example of a display device.

FIG. 6A is a layout example of a subpixel. The example shows, for easy viewing, a state before a pixel electrode is formed. The subpixel shown in FIG. 6A includes the transistor 61, the transistor 62, and the capacitor 63. The transistor 61 is a bottom-gate channel-etched transistor. The transistor 62 includes two gates with a semiconductor layer therebetween.

A conductive layer 56 at a lower position forms lower gate electrodes of the transistors 61 and 62, one electrode of the capacitor 63, and the like. A conductive layer that is formed after the formation of the conductive layer 56 forms the wiring 51. A conductive layer 57 that is formed thereafter forms one of a source electrode and a drain electrode of the transistor 61, a source electrode and a drain electrode of the transistor 62, and the like. A conductive layer that is formed after the formation of the conductive layer 57 forms the wiring 52, the wiring 53, and the like. A conductive layer 58 that is formed thereafter forms an upper gate electrode of the transistor 62. Part of the wiring 52 serves as the other of the source electrode and the drain electrode of the transistor 61. Part of the wiring 53 serves as the other electrode of the capacitor 63. For easy viewing, the conductive layer 58 is shown just with its outline without a hatching pattern.

The semiconductor layer 55, the conductive layer 56, the conductive layer 57, and the conductive layer 58 that are included in the transistors each have a light-transmitting property. The wirings 51, 52, and 53 each have a light-blocking property.

Figure 6B:
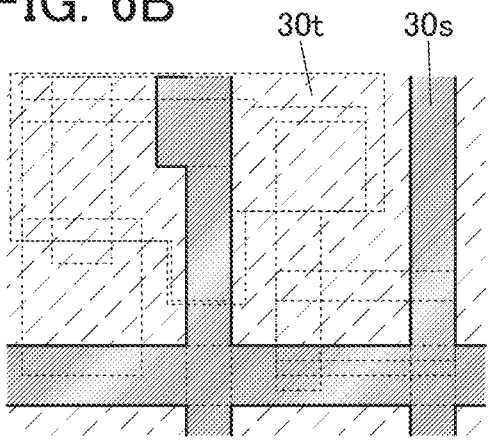

In FIG. 6B, the transmission region 30t and the light-blocking region 30s in the subpixel shown in FIG. 6A are separately shown. As shown in the drawing, the transistors 61 and 62 and the like have a light-transmitting property; accordingly, visibility in see-through display can be heightened.

For example, such a structure allows the proportion of the area of the transmission region 30t (also referred to as an aperture ratio) to be higher than or equal to 50%. The structure shown in FIGS. 6A and 6B achieves an aperture ratio of approximately 66.1% or higher.

Figure 6C:
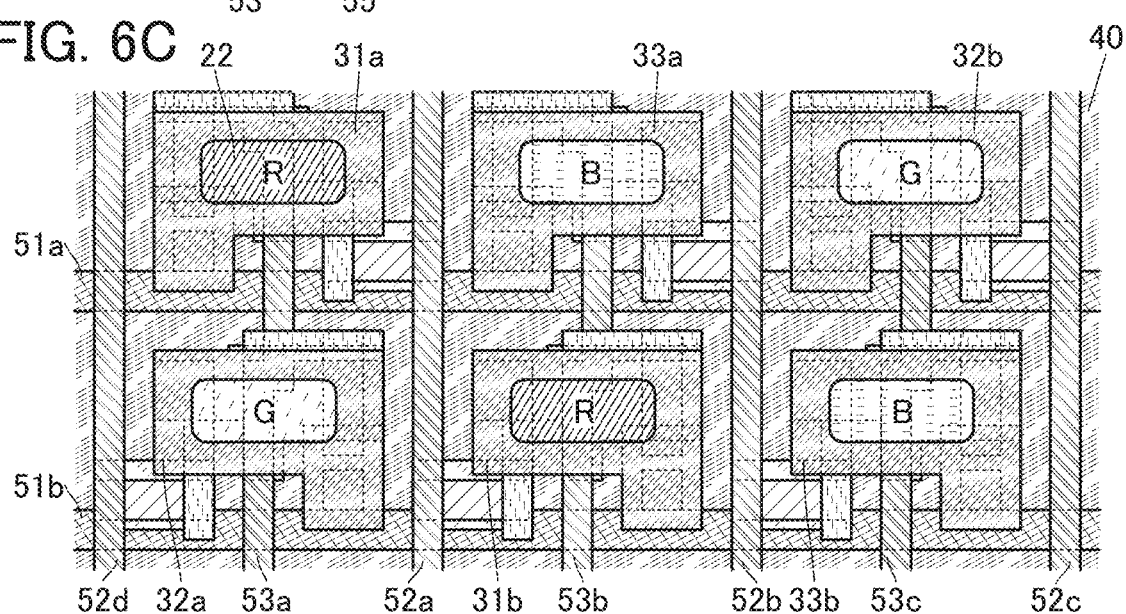
Figure 6D:
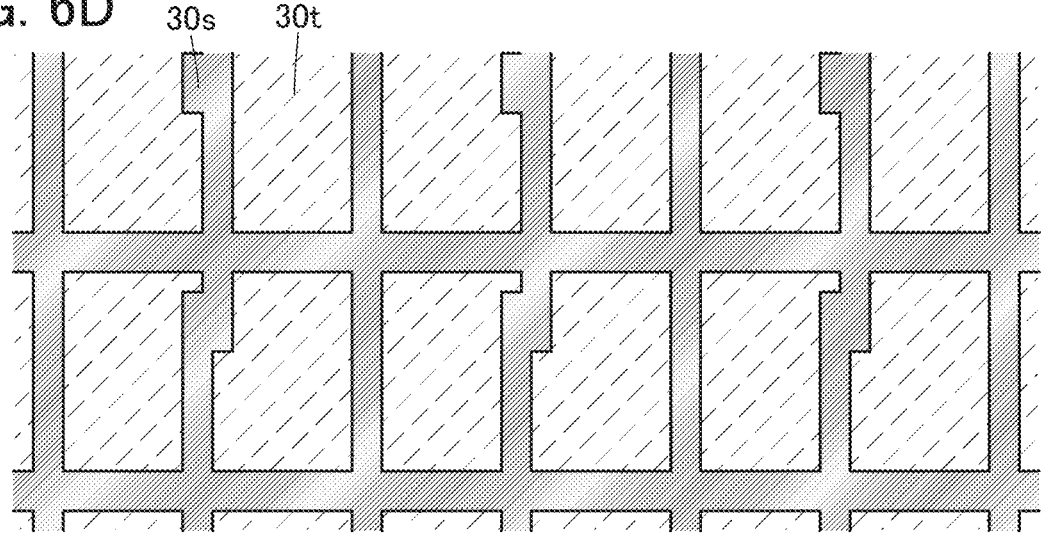

FIG. 6C is a layout example of the pixel unit 70 including the subpixel shown in FIG. 6A. FIG. 6C also shows pixel electrodes and display regions 22. This example shows a dual-emission light-emitting element as the light-emitting element. FIG. 6C is a schematic top view seen from the display surface side. In FIG. 6D, the transmission region 30t and the light-blocking region 30s in FIG. 6C are separately shown.

In this example, three subpixels electrically connected to the wiring 51a have shapes laterally inverted from the shapes of the three subpixels electrically connected to the wiring 51b Therefore, in the structure in which same-color subpixels are arranged in a zigzag pattern in the extending direction of the wiring 52a, or the like and are connected to one wiring serving as a signal line, wirings connected to the subpixels can have uniform length, so that variation in luminance between the subpixels can be suppressed.

With use of such a pixel layout, a display device with extremely high definition can be fabricated even in a production line in which the minimum feature size is greater than or equal to 0.5 µm and smaller than or equal to 6 µm, typically greater than or equal to 1.5 µm and smaller than or equal to 4 µm.

FIG. 6C shows the liquid crystal element 40 that is positioned closer to the back surface (opposite to the display surface) than the light-emitting elements and wirings are.

[Example 2 of Pixel Layout]

Figure 7A:
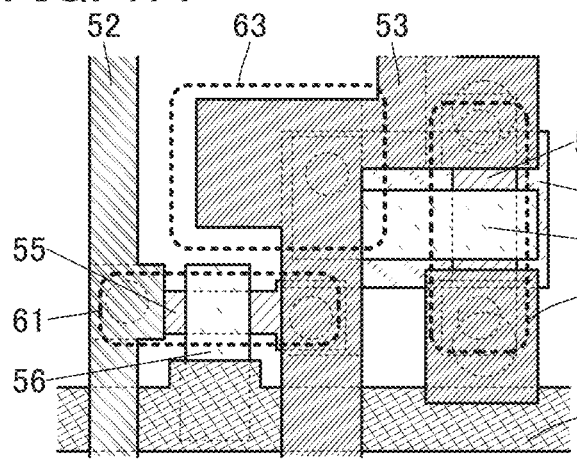
FIGS. 7A to 7D illustrate a structure example of a display device.
Figure 7B:
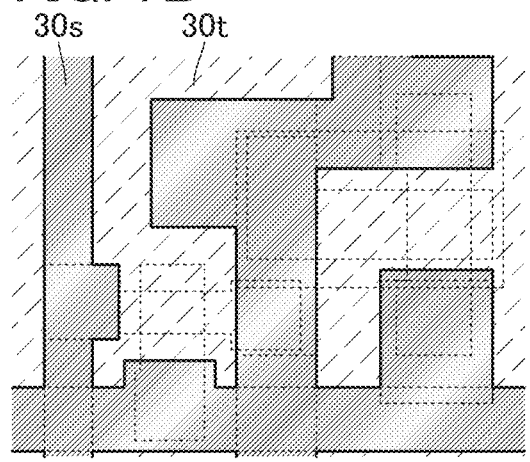

FIGS. 7A and 7B show a layout example different from that shown in FIGS. 6A and 6B.

The transistor 61 is a top-gate transistor. The transistor 62 includes the two gates with the semiconductor layer therebetween.

In FIG. 7A, the conductive layer 57 at a lower position forms one gate electrode of the transistor 62, and the semiconductor layer 55 is formed after the formation of the conductive layer 57. The conductive layer 56 that is formed after the formation of the conductive layer 57 and the semiconductor layer 55 forms a gate electrode of the transistor 61 and the other gate electrode of the transistor 62. A conductive layer that is formed after the formation of the conductive layer 56 forms the wiring 51 and the like. A conductive layer that is formed thereafter forms the wiring 52, one electrode of the capacitor 63, and the like. A conductive layer that is formed thereafter forms the wiring 53 and the like.

The semiconductor layer 55, the conductive layer 56, and the conductive layer 57 have a light-transmitting property. The structure shown in FIGS. 7A and 7B achieves an aperture ratio of approximately 37.1% or higher.

The transistor 61 includes the semiconductor layer 55 over the wiring 51, part of the wiring 52, and the like. The transistor 62 includes the conductive layer 57, the semiconductor layer 55 over the conductive layer 57, the wiring 53, and the like. The capacitor 63 includes part of the wiring 53 and a conductive layer that is on the same plane as the wiring 52.

Figure 7C:
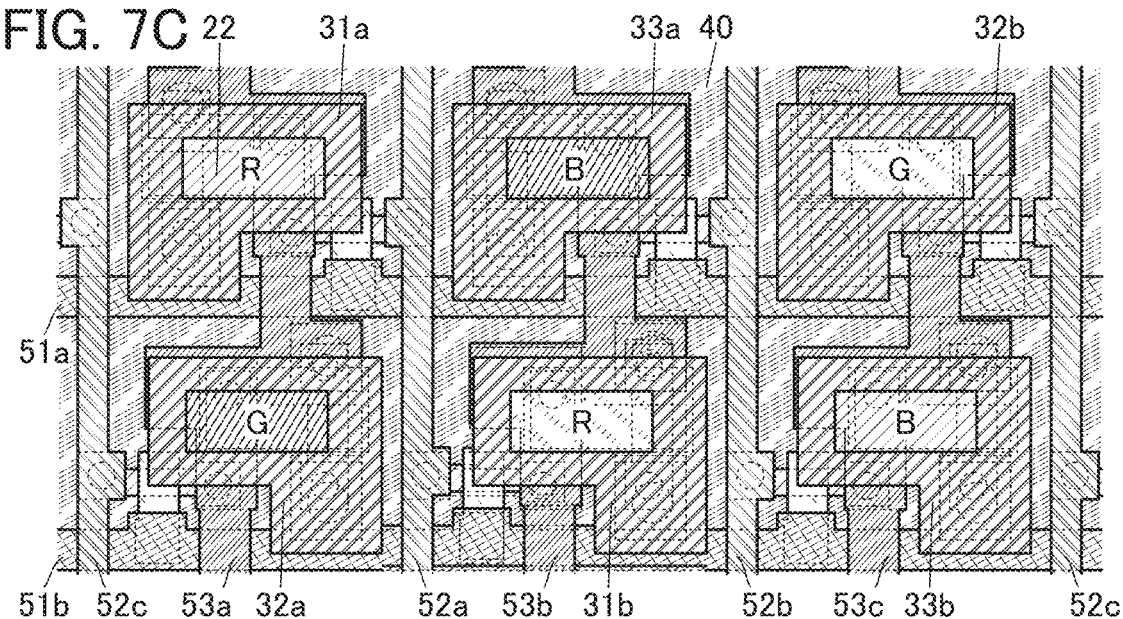
Figure 7D:
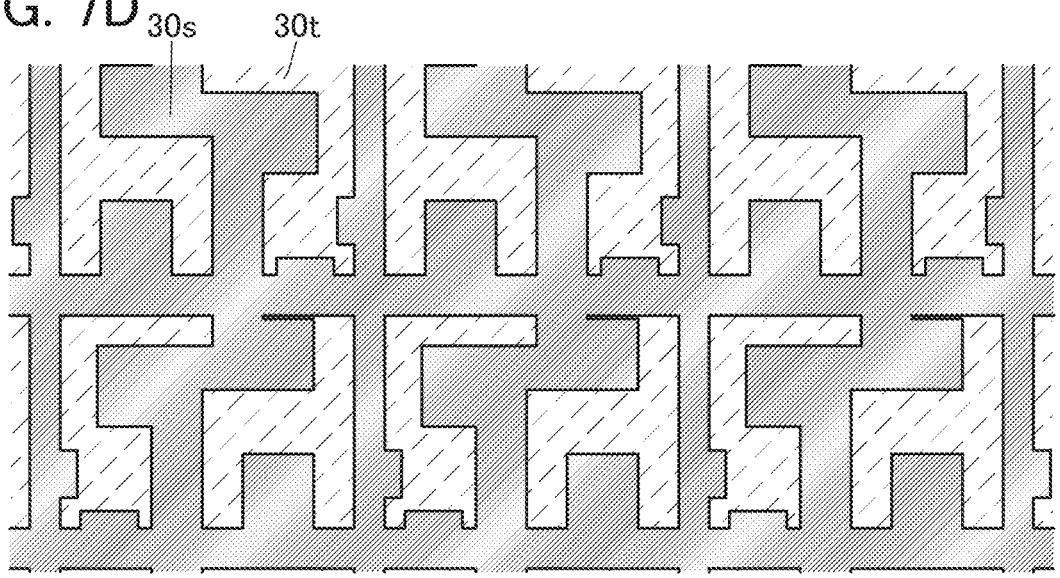

FIGS. 7C and 7D illustrate a structure example of a pixel unit including the subpixel shown in FIG. 7A.

FIG. 7C shows the liquid crystal element 40 that is positioned closer to the back surface (opposite to the display surface) than the light-emitting elements and wirings are.

[Example 3 of Pixel Layout]

FIGS. 8A and 8B show a layout example of a subpixel 50 different from the layout examples shown in FIGS. 6A and 6B and FIGS. 7A and 7B.

The subpixel 50 includes transistors 61a, 61b, and 62. The transistors 61a, 61b, and 62 each include two gates with a semiconductor layer therebetween. FIG. 8A also shows a pixel electrode 64 and the display region 22. The pixel electrode 64 is shared by an adjacent pixel (not illustrated).

The transistor 62 in FIG. 8A has a stacked-layer structure similar to that of the transistor 62 in FIG. 7A.

The transistor 61a includes the semiconductor layer 55 over the wiring 51, the conductive layer 58 over the semiconductor layer 55, a conductive layer connected to a wiring 59 supplied with a constant potential, and the like. The transistor 61b includes the semiconductor layer 55 over the wiring 51, the conductive layer 58 over the semiconductor layer 55, a conductive layer connected to the wiring 52, and the like. The conductive layer 58 is connected to the wiring 59. The wiring 51 and the conductive layer 58 serve as gate electrodes.

The wirings 51, 52, 53, and 59 have a light-blocking property. Other layers, i.e., layers constituting the transistor 61a, 61b, or 62 or the like, are light-transmitting films. FIG. 8B shows separately the transmission region 30t that transmits visible light and the light-blocking region 30s that blocks visible light that are in the subpixel 50 of FIG. 8A. A region that does not overlap with any wiring is the transmission region 30t, as shown in FIG. 8B.

As a comparative example, a subpixel 50*a* having a transistor including part of the wiring 51, part of the wiring 52, and part of the wiring 59 is shown in FIGS. 9A and 9B.

The subpixel 50*a* includes transistors 61*c*, 61*d*, and 62*a*. The transistors 61*c*, 61*d*, and 62*a* each include two gates with a semiconductor layer therebetween. FIG. 9A also shows the pixel electrode 64 and the display region 22.

The transistor 62*a* in FIG. 9A has a stacked-layer structure similar to that of the transistor 62 in FIG. 7A.

The transistor 61*c* includes the semiconductor layer 55 over the wiring 51, the conductive layer 58 over the semiconductor layer 55, part of the wiring 59, and the like. The transistor 61*d* includes the semiconductor layer 55 over the wiring 51, the conductive layer 58 over the semiconductor layer 55, part of the wiring 52, and the like.

In the transistor 62*a*, conductive layers (not illustrated) serving as the gate electrode, the source electrode, and the drain electrode have a light-blocking property. FIG. 9B shows separately the transmission region 30*t* that transmits visible light and the light-blocking region 30*s* that blocks visible light that are in the subpixel 50*a* of FIG. 9A. A region that overlaps with no wiring is the transmission region 30*t*, as shown in FIG. 9B.

When the structure of the subpixel 50*a* in FIGS. 9A and 9B is employed in a display panel that includes a top-emission light-emitting element with a pixel size of 12.75 μm×38.25 μm, a display region diagonal dimension of 13.3 inches, and a definition of 8K, the proportion of the display region 22 in the pixel is 30.1% and the aperture ratio of the pixel (also referred to as the light transmittance) is 11.5%. In contrast, when the structure of the subpixel 50 in FIGS. 8A and 8B is employed in such a display panel, the proportion of the display region 22 is 30.1% and the light transmittance is 57.6%. The use of the pixel layout shown in FIGS. 8A and 8B improves the light transmittance.

The above is the description of the pixel layout.

The display device of one embodiment of the present invention can switch between display only with the light-emitting elements and see-through display. Accordingly, an electronic device that can change a display method depending on conditions can be obtained. One embodiment of the present invention also enables a user to see an extremely bright transmission image in see-through display.

At least part of this embodiment can be implemented in combination with any of the other embodiments described in this specification as appropriate.

Embodiment 2

An electronic device including a display device capable of switching between the light-emitting mode and the transmission mode is described below together with a driving method of the display device.

STRUCTURE EXAMPLE

FIG. 10 is a block diagram of an electronic device 10*a* of one embodiment of the present invention. The electronic device 10*a* includes a control portion 11, an optical sensor 12, the display device 10, a driver portion 13EL, a driver portion 13LC, and the like.

The control portion 11 includes an arithmetic portion 15. The control portion 11 may further include a memory portion or the like.

The display device 10 includes a display portion 10EL and a transmission control portion 10LC. The display portion 10EL includes the plurality of light-emitting elements 90 arranged in matrix. The transmission control portion 10LC includes the liquid crystal element 40 across the display region. Although one liquid crystal element 40 is used in this example, a plurality of liquid crystal elements 40 may be used. For convenience, the display portion 10EL is apparently displaced from the transmission control portion 10LC; however, the liquid crystal element 40 in the transmission control portion 10LC in fact overlaps with the display region of the display portion 10EL.

The driver portion 13EL includes a circuit for driving the display portion 10EL. Specifically, the driver portion 13EL supplies a signal including a gray level, a scan signal, a timing signal, a power supply potential, and the like to a pixel circuit in the display portion 10EL. The driver portion 13EL includes a signal line driver circuit and a scan line driver circuit, for example.

The driver portion 13LC includes a circuit for driving the transmission control portion 10LC. The driver portion 13LC supplies a signal including a gray level, a power supply potential, and the like to the liquid crystal element 40, for example. The driver portion 13LC may supply a scan signal, a timing signal, and the like when the liquid crystal element 40 in the transmission portion 10LC is, for example, a passive matrix liquid crystal element or an active matrix liquid crystal element.

The optical sensor 12 has a function of capturing an image of the background behind the display device 10 (the view on the back side opposite to the display surface side). The optical sensor 12 can output a signal L0 including data of a captured image in response to requirement by the arithmetic portion 15.

An image signal S0 including image data is input to the arithmetic portion 15 in the control portion 11 from the outside. The arithmetic portion 15 generates a signal S1 from the image signal S0 and outputs the signal S1 to the driver portion 13EL. The signal S1 includes a gray level to be supplied to a pixel in the display portion 10EL.

The arithmetic portion 15 also generates a signal S2 and outputs the signal S2 to the driver portion 13LC. The signal S2 includes a gray level corresponding to the transmittance of the transmission control portion 10LC.

The arithmetic portion 15 chooses between the transmission state and the non-transmission state of the transmission control portion 10LC in accordance with, for example, an input by a user or an instruction by a running application, and outputs the signal S2 to the driver portion 13LC. The arithmetic portion 15 can perform switching from the transmission state to the non-transmission state or from the non-transmission state to the transmission state.

The arithmetic portion 15 can analyze the image data in the signal L0 input from the optical sensor 12, and choose between the transmission state and the non-transmission state of the transmission control portion 10LC on the basis of the analysis result.

For example, while the transmission control portion 10LC is in the non-transmission state, the arithmetic portion 15 determines whether there is a danger around a user. If recognizing a danger, the arithmetic portion 15 switches the state of the transmission control portion 10LC to the transmission state.

Examples of a danger around a user include approach of an object (e.g., a moving object such as a vehicle or an automobile, a pedestrian, or a ball) to the user and existence of an obstacle or a step in user's way.

Specifically, the arithmetic portion 15 can calculate a distance from the user or the electronic device 10*a* to the object on the basis of the image data input from the optical sensor 12. In addition, the arithmetic portion 15 can calculate the relative speeds of the object and the user or the electronic device 10a, the moving direction of the object, or the like, by analyzing a plurality of image data captured at certain time intervals (i.e., a moving image). Accordingly, the arithmetic portion 15 can also predict the risk of contact of the user with the object.

In particular, if a user is immersed in looking and listening with a wearable (e.g., glasses-type or goggle-type) electronic device or a portable information terminal such as a smartphone or a tablet terminal, the user may fail to notice a danger around the user. Switching of the display state to the transmission mode allows the user to notice the imminent danger. The user can see the situation ahead through the electronic device 10a and thus does not need to move the electronic device 10a to the outside of user's sight; accordingly, the user can notice the danger quickly.

For example, a bicycle is approaching a user who wears and uses the goggle-type electronic device 10a in the light-emitting mode, as shown in FIG. 11A1. In FIG. 11A1, the user is sufficiently distant from the bicycle. When the bicycle approaches the user from the point in FIG. 11A1 as shown in FIG. 11A2, the display device 10 switches from the light-emitting mode to the transmission mode so that the user can see the bicycle through the electronic device 10a; as a result, the user can take an evasive action immediately.

FIGS. 11B1 and 11B2 show an example where the user uses the electronic device 10a in tablet form. The user enjoys looking and listening with the electronic device 10a in the light-emitting mode while walking. Switching of the display device 10 from the light-emitting mode to the transmission mode allows the user to see a bicycle through the electronic device 10a. Thus, the user can take an evasive action immediately.

OPERATION EXAMPLE

Figure 12:
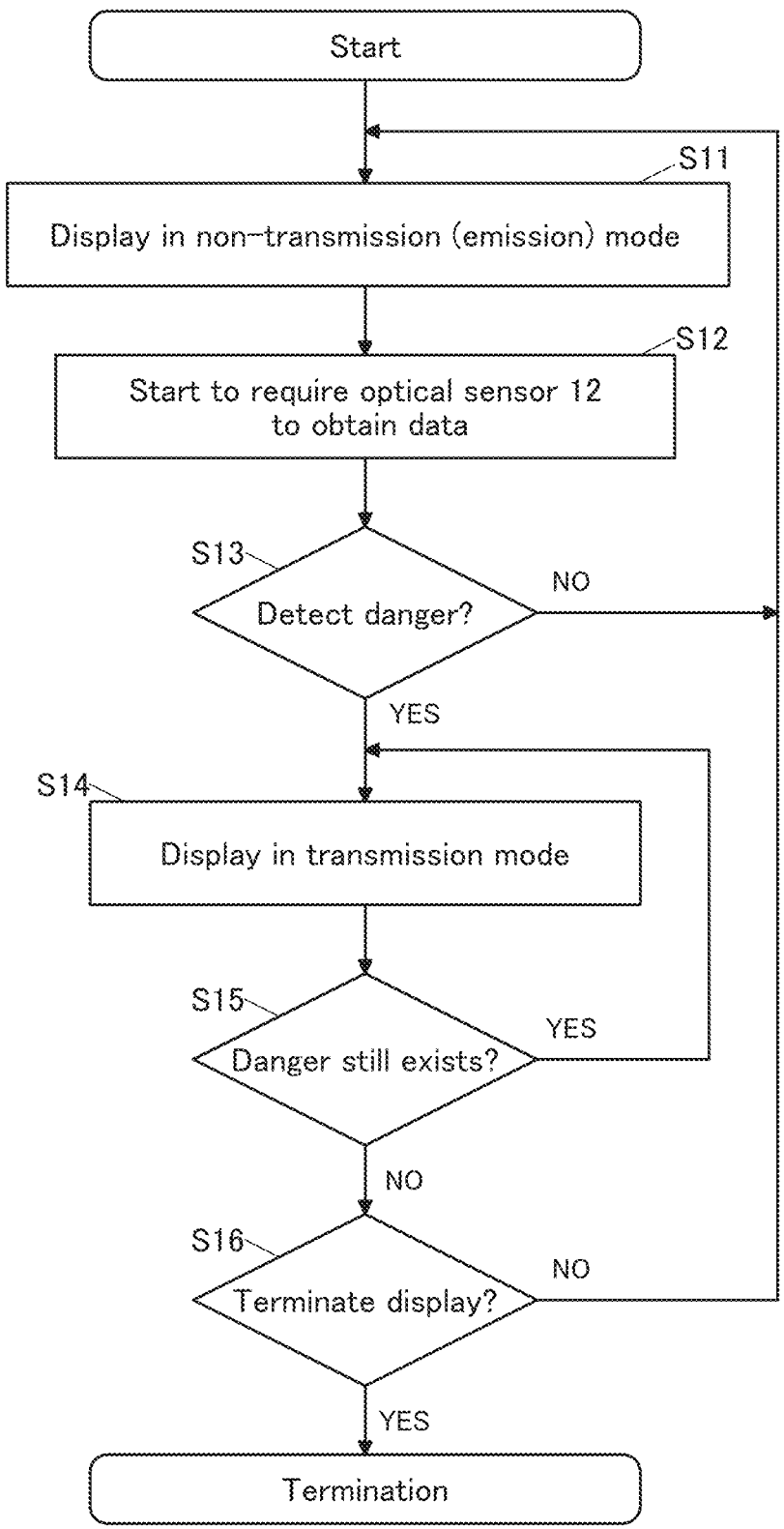
FIG. 12 is a flow chart showing a driving method of an electronic device.

An example of operation of the display device 10 that can be executed by the electronic device 10a is described blow. Here, an example of switching of the display state from the non-transmission mode to the transmission mode is described. FIG. 12 is a flow chart relating to operation of the arithmetic portion 15.

In Step S11, display in non-transmission mode (emission mode) is performed.

In Step S12, the arithmetic portion 15 starts to require the optical sensor 12 to obtain data. The optical sensor 12 outputs, to the arithmetic portion 15, a signal including data of a captured image of the environment around a user. The requirement is continually performed until the operation is terminated.

More frequent image data acquisition by the optical sensor 12 leads to more accurate condition assessment. For example, the frequency of data acquisition in Step S12 is set to once or more every five seconds, preferably once or more per second, more preferably twice or more per second, further preferably five times or more per second, and 60 times or less per second or 120 times or less per second.

In Step S13, the arithmetic portion 15 analyzes the image data and determines whether there is a danger around a user. Recognition of a danger triggers a shift to Step S14, while recognition of no danger triggers a return to Step S11 so that the display device continues display in non-transmission mode.

In Step S14, switched from the non-transmission mode, the display device performs display in the transmission mode.

Instantaneous switching (e.g., switching in a period less than 50 ms) from the non-transmission mode to the transmission mode can give a user a sufficient time for evading the danger. Alternatively, to prevent a user from being surprised at fast switching, switching from the non-transmission mode to the transmission mode can be performed in such a manner that the transmittance is continuously changed in a period long enough to allow the user to perceive the gradual change. For example, a period for switching from the non-transmission mode to the transmission mode can be 0.1 seconds or longer, 0.5 seconds or longer, or 1 second or longer, and 5 seconds or shorter, or preferably 2 seconds or shorter.

Before or in a period for switching from the non-transmission mode to the transmission mode, information that gives the user a notice of recognized danger is preferably displayed on the display device 10.

In Step S15, the arithmetic portion 15 analyzes the image data and determines whether the danger around the user still exists. Recognition of the continuous existence of the danger triggers a return to Step S14 so that the display device continues the display in the transmission mode. The elimination of the danger triggers a shift to Step S16.

In Step S16, decision whether the display is continued is made. Decision to continue the display triggers a return to Step S11 to perform display in non-transmission mode. Decision not to continue the display triggers a termination of the display.

The above is the description of the operation example of the electronic device 10a.

[Example of Wearable Electronic Device]

More specific examples of the electronic device of one embodiment of the present invention are described below. Here, a goggle-type image display device is given as an example.

FIGS. 13A1 and 13A2 are perspective views of an image display device 100. FIG. 13A1 is a perspective view illustrating the front surface, the top surface, and the left side surface of the image display device 100, and FIG. 13A2 is a perspective view illustrating the back surface, the bottom surface, and the right side surface of the image display device 100.

The image display device 100 includes a housing 101, a display portion 102, a camera 103, and a mounting fixture 104. The display portion 102 includes the above-described display device.

FIG. 13A1 shows the image display device 100 in the light-emitting mode in which the display portion 102 is in a state of blocking visible light. FIG. 13B shows the image display device 100 in the see-through mode in which the display portion 102 is in a state of transmitting visible light. In FIG. 13B, a portion behind the display portion 102 that can be seen through the display portion 102 is shown by dashed lines.

FIGS. 13C and 13D are schematic cross-sectional views taken along a plane parallel to the top surface of the image display device 100. A portion corresponding to the display portion 102 includes a display panel 102p and a protective component 101t. The protective component 101t transmits visible light and has a function of protecting the display panel 102p.

FIG. 13C shows the image display device in the emission mode in which the display panel 102p is in a state of blocking visible light. A user can see an image displayed with the light 20e emitted from the display panel 102p. FIG. 13D shows the image display device in the see-through mode in which the display panel 102p is in a state of transmitting external light. The user can see both the light 20e and the transmission light 20t.

FIGS. 14A and 14B illustrate an image display device 100a that has a structure partly different from the above. FIGS. 14C and 14D illustrate schematic cross-sectional views of the image display device 100a.

The image display device 100a includes a shutter 102LC and a pair of display panels 102EL. A pair of lenses (a lens 105a and a lens 105b) is positioned with the display panel 102EL therebetween.

The shutter 102LC corresponds to the above-mentioned transmission control portion 10LC. The display panel 102EL corresponds to the above-mentioned display portion 10EL; the display panel 102EL is a display device including a plurality of light-emitting elements arranged in matrix and a portion transmitting visible light.

The lens 105b that is closer to a user than the other lens is has a function of making user's eyes focus on the display panel 102EL. This can reduce a distance between user's eye and the display panel 102EL, decreasing the thickness of the image display device 100a.

In the see-through mode, light transmitted through the shutter 102LC goes through the display panel 102EL and the two lenses, between which the display panel 102EL is located, and then reaches user's eye. Thus, the user can see a clear transmission image. For example, when the display panel 102EL is a high-definition display panel, light transmitted through the display panel 102EL may be diffracted because of periodically arranged pixels. However, the pair of lenses between which the display panel is sandwiched can eliminate the influence of diffraction.

When the two lenses are convex lenses with the same focal length, a transmission image can be seen at the same magnification. To prevent the inversion of a transmission image, another kind of lenses may be provided.

The two convex lenses are provided with the display panel 102EL therebetween in this example; however, not limited to such lenses, a variety of optical systems is available. An optical system with a microlens array, a mirror surface, or the like may be used instead of the lenses.

The display panel 102EL for the right eye and that for the left eye are provided in this example; however, one display panel 102EL alone may be used. The display panel 102EL may be held in a state of being bent.

FIGS. 14E1 and 14E2 illustrate an example where the shutter 102LC is provided also on the top surface and the bottom surface of the housing 101. The display portion 102 shown in FIG. 13A1 or the like may be employed for a portion where the shutter 102LC is provided. Such a structure can widen the viewing angle in the upward and downward directions in the see-through mode.

The above is the description of the electronic device.

At least part of this embodiment can be implemented in combination with any of the other embodiments described in this specification as appropriate.

Embodiment 3

Figure 15:
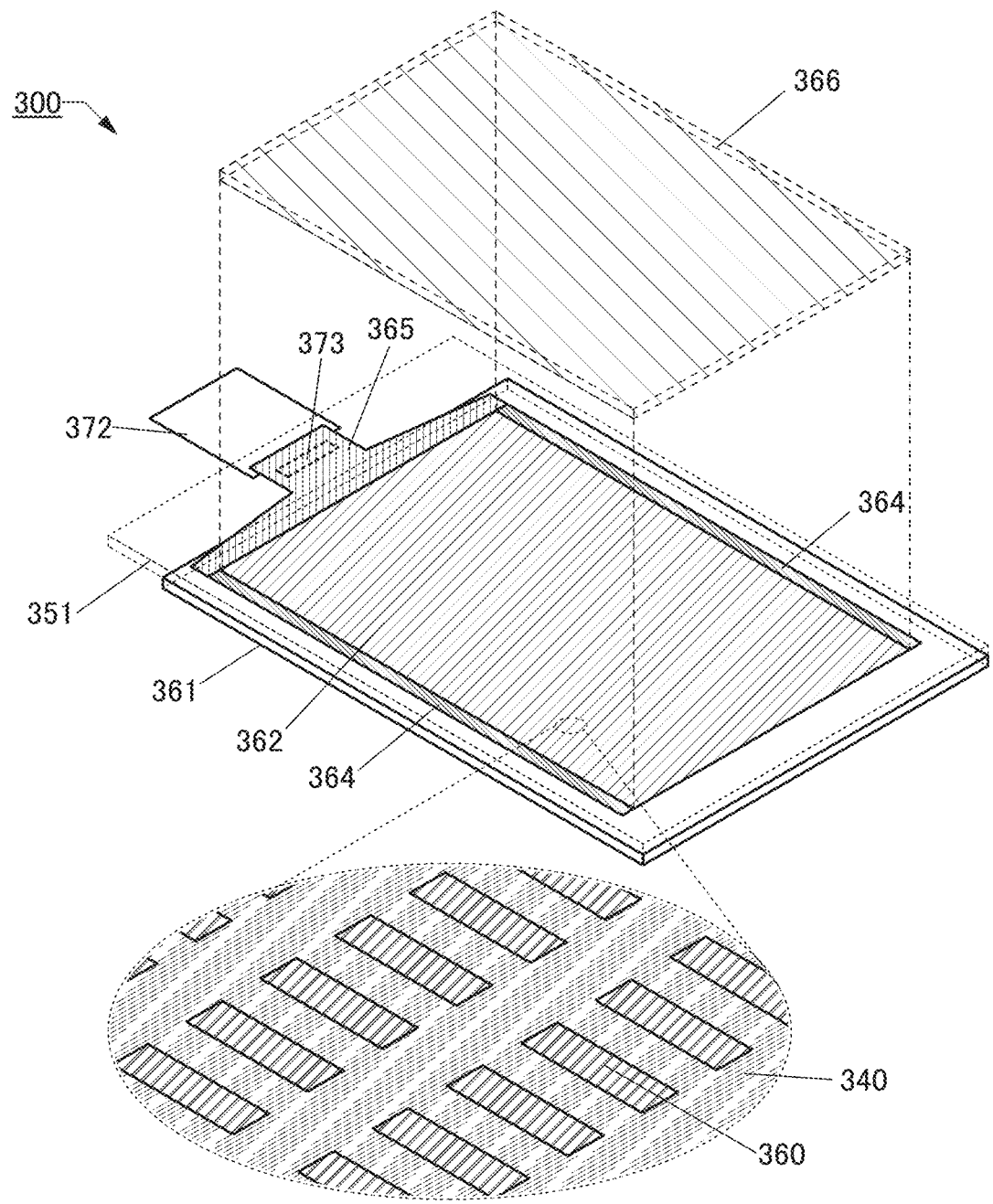
FIG. 15 illustrates a structure example of a display panel.

In this embodiment, structure examples of the display device (display panel) of one embodiment of the present invention are described with reference to drawings.
[Structure Example of Display Panel]
FIG. 15 is a schematic perspective view illustrating a display panel 300 of one embodiment of the present invention. In the display panel 300, a substrate 351 and a substrate 361 are attached to each other. In FIG. 15, the substrate 351 is denoted by a dashed line.

The display panel 300 includes a display portion 362, a circuit 364, a wiring 365, and the like. The circuit 364, the wiring 365, and the like are between the substrates 351 and 361. FIG. 15 shows an example in which an IC 373 and an FPC 372 are mounted on the substrate 351. Thus, the structure illustrated in FIG. 15 can be referred to as a display module including the display panel 300, the FPC 372, and the IC 373.

As the circuit 364, for example, a circuit functioning as a scan line driver circuit can be used.

The wiring 365 has a function of supplying a signal or electric power to the display portion or the circuit 364. The signal or electric power is input to the wiring 365 from the outside through the FPC 372 or from the IC 373.

FIG. 15 shows an example in which the IC 373 is provided on the substrate 351 by a chip on glass (COG) method or the like. As the IC 373, an IC functioning as a scan line driver circuit, a signal line driver circuit, or the like can be used. Note that the IC 373 may be omitted when, for example, the display panel 300 includes circuits functioning as a scan line driver circuit and a signal line driver circuit or when circuits functioning as a scan line driver circuit and a signal line driver circuit are externally provided and signals for driving the display panel 300 are input through the FPC 372. Alternatively, the IC 373 may be mounted on the FPC 372 by a chip on film (COF) method or the like.

FIG. 15 also illustrates an enlarged view of part of the display portion 362. A plurality of light-emitting elements 360 are arranged in matrix in the display portion 362. The liquid crystal element 340 is provided in a portion where the plurality of light-emitting elements 360 are not provided.

When serving as a touch panel, the display panel 300 can include a touch sensor 366 over the substrate 361. For example, a sheet-like capacitive touch sensor 366 may be provided to overlap with the display portion 362. Alternatively, a touch sensor may be provided between the substrate 361 and the substrate 351. For a touch sensor provided between the substrate 361 and the substrate 351, a capacitive touch sensor or an optical touch sensor using a photoelectric conversion element may be used.

CROSS-SECTIONAL STRUCTURE EXAMPLES

An example of a cross-sectional structure of the display panel is described below.

Cross-Sectional Structure Example 1

FIG. 16A shows an example of cross sections of part of a region including the FPC 372, part of a region including the circuit 364, and part of a region including the display portion 362 of the display panel illustrated as an example in FIG. 15. Note that the touch sensor 366 is not illustrated.

The display panel 300 includes an insulating layer 220 between the substrates 351 and 361. The display panel also includes the light-emitting element 360, a transistor 201, a transistor 202, a transistor 205, a wiring 209, a coloring layer 134, and the like between the substrate 351 and the insulating layer 220. Furthermore, the display panel includes the liquid crystal element 340 and the like between the insulating layer 220 and the substrate 361. The substrate 361 and the insulating layer 220 are bonded with an adhesive layer 161. The substrate 351 and the insulating layer 220 are bonded with an adhesive layer 162.

The wiring 209 is electrically connected to the liquid crystal element 340. The transistor 205 is electrically connected to the light-emitting element 360. The transistor 205 and the wiring 209 are formed on a surface of the insulating layer 220 that is on the substrate 351 side, whereby the transistor 205 and the wiring 209 can be formed through the same process.

The wiring 209, a connection portion 207, or the like is preferably provided outside the display portion 362. When a plurality of liquid crystal elements 340 are used, the connection portion 207 or the wiring 209 for the liquid crystal element 340 positioned in contact with an end portion of the display portion 362 can be outside the display portion 362. The connection portion 207 or the wiring 209 for the liquid crystal element 340 in a portion other than the end portion of the display portion 362 may be inside the display portion 362.

A conductive layer 313 serving as a common electrode of the liquid crystal element 340, an alignment film 133b, an insulating layer 117, and the like are provided over the substrate 361. The insulating layer 117 serves as a spacer for holding a cell gap of the liquid crystal element 340.

Insulating layers such as an insulating layer 211, an insulating layer 212, an insulating layer 213, an insulating layer 214, and an insulating layer 215 are provided on the substrate 351 side of the insulating layer 220. Parts of the insulating layer 211 function as gate insulating layers of the transistors. The insulating layer 212, the insulating layer 213, and the insulating layer 214 are provided to cover the transistors. The insulating layer 215 is provided to cover the insulating layer 214. The insulating layers 214 and 215 each function as a planarization layer. Note that the three insulating layers, the insulating layers 212, 213, and 214, are provided to cover the transistors and the like in this example; however, the number of insulating layers is not limited to three, and four or more insulating layers, a single insulating layer, or two insulating layers may be provided. The insulating layer 214 functioning as a planarization layer is not necessarily provided when not needed.

FIG. 16A illustrates the circuit 364 in which the transistor 201 is provided, as an example of the circuit 364.

FIGS. 16B and 16C are enlarged views of the transistor 205 and the transistor 201 respectively.

The transistor 205 includes a conductive layer 221t serving as a gate electrode, an insulating layer 211 over the conductive layer 221t, a semiconductor layer 231 over the insulating layer 211, a pair of conductive layers 222t serving as a source electrode and a drain electrode, a conductive layer 223 overlapping with the semiconductor layer 231 with the insulating layer 212 therebetween. The conductive layer 221t, the semiconductor layer 231, the conductive layers 222t, and the conductive layer 223 are each a film that transmits visible light. Accordingly, the transistor 205 can transmit visible light.

The transistor 202 is the same as the transistor 205 except that the conductive layer 223 serving as one of gate electrodes is not included. Thus, the transistor 202 can also transmit visible light.

The transistor 201 includes a conductive layer 221 serving as a gate electrode, the insulating layer 211 over the conductive layer 221, the semiconductor layer 231 over the insulating layer 211, a pair of conductive layers 222 serving as a source electrode and a drain electrode, the conductive layer 223 overlapping with the semiconductor layer 231 with the insulating layer 212 therebetween. Here, the conductive layers 221 and 222 are each preferably a film that blocks visible light.

FIG. 16D shows an example where the conductive layers 221, 221t, 222, and 222t are connected to each other. No insulating layer is provided between the conductive layers 221 and 221t; the conductive layer 221 is stacked partly on and connected to the conductive layer 221t. The conductive layers 221 and 222t are connected to each other in an opening provided in the insulating layer 211. No insulating layer is provided between the conductive layers 222t and 222; the conductive layer 222 is stacked partly on and connected to the conductive layer 222t.

The structure of the connection portion shown in FIG. 16D is an example for facilitating description, and other structures are also available. For example, the conductive layers 221t and 222, or the conductive layers 221t and 222t, are electrically connected to each other in an opening provided in the insulating layer 211.

The stacking order of the conductive layers 221 and 221t may be reversed. Similarly, the stacking order of the conductive layers 222 and 222t may be reversed.

The semiconductor layer 231 in each of the transistors can be formed with a light-transmitting semiconductor material. Examples of the light-transmitting semiconductor material include an oxide semiconductor. The oxide semiconductor preferably contains at least indium. In particular, indium and zinc are preferably contained. In addition, one or more kinds of elements selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

The conductive films included in the light-transmitting transistors each can be formed using a light-transmitting conductive material. The light-transmitting conductive material preferably contains one or more kinds of indium, zinc, and tin. Specifically, an In oxide, an In—Sn oxide (also referred to as an indium tin oxide or ITO), an In—Zn oxide, an In—W oxide, an In—W—Zn oxide, an In—Ti oxide, an In—Sn—Ti oxide, an In—Sn—Si oxide, a Zn oxide, a Ga—Zn oxide, or the like can be used.

Any of the conductive films of the light-transmitting transistor may be an oxide semiconductor that includes an impurity element, for example, and has reduced resistance. The oxide semiconductor with the reduced resistance can be regarded as an oxide conductor (OC).

For example, to form an oxide conductor, oxygen vacancies are formed in an oxide semiconductor and then hydrogen is added to the oxygen vacancies, so that a donor level is formed in the vicinity of the conduction band. The oxide semiconductor having the donor level has an increased conductivity and becomes a conductor.

An oxide semiconductor has a large energy gap (e.g., an energy gap of 2.5 eV or larger), and thus has a visible-light-transmitting property. An oxide conductor is an oxide semiconductor having a donor level in the vicinity of the conduction band, as described above. Therefore, the influence of absorption due to the donor level is small in an oxide conductor, and an oxide conductor has a visible-light-transmitting property comparable to that of an oxide semiconductor.

The oxide conductor preferably includes one or more kinds of metal elements included in the semiconductor film of the transistor. When two or more layers included in the transistor are formed using oxide semiconductors including the same metal element, the same manufacturing apparatus (e.g., deposition apparatus or processing apparatus) can be used in two or more steps and manufacturing cost can thus be reduced.

The liquid crystal element 340 is a transmissive liquid crystal element. The liquid crystal element 340 has a structure in which a conductive layer 311, a liquid crystal 312, and the conductive layer 313 are stacked. The conductive layers 311 and 313 each contain a material transmitting visible light. In addition, an alignment film 133a is provided between the liquid crystal 312 and the conductive layer 311, and the alignment film 133b is provided between the liquid crystal 312 and the conductive layer 313. A polarizing plate 130b is provided on an outer surface of the substrate 361. A polarizing plate 130a is provided on an outer surface of the substrate 351.

In the liquid crystal element 340, the conductive layer 311 and the conductive layer 313 have a function of transmitting visible light. Light entering from the substrate 361 side is polarized by the polarizing plate 130b, is transmitted through the conductive layer 311, the liquid crystal 312, the conductive layer 313, and the like, and reaches the polarizing plate 130a. Here, the alignment of the liquid crystal is controlled by a voltage applied between the conductive layer 311 and the conductive layer 313, whereby optical modulation of light can be controlled. That is, the intensity of light casted through the polarizing plate 130a can be controlled.

Light transmitted through the liquid crystal element 340 can be seen from the substrate 351 side through the transistor 205, the transistor 202, the light-emitting element 360, and the like, each of which can transmit visible light.

Depending on the structure of the liquid crystal element 340, one or both of the polarizing plates 130a and 130b may be omitted. For example, the use of a guest-host liquid crystal element as the liquid crystal element 340 can eliminate the polarizing plate 130a. This can increase the light extraction efficiency of the light-emitting element 360.

The light-emitting element 360 is a dual-emission light-emitting element. The light-emitting element 360 has a structure in which a conductive layer 191, an EL layer 192, and a conductive layer 193 are stacked in this order from the insulating layer 220 side. An insulating layer 194 is provided to cover the conductive layer 193. The conductive layers 191 and 193 each contain a material transmitting visible light. Part of light emitted from the light-emitting element 360 goes outside through the coloring layer 134, the substrate 351, and the like.

Since the light-emitting element 360 is a dual-emission light-emitting element, a region where the light-emitting element 360 is provided can also be used as the transmission region. Note that when the definition is low (e.g., lower than 100 ppi) or when the transmission region other than the light-emitting element 360 is sufficiently large, the light-emitting element 360 may be a top-emission light-emitting element. In that case, the conductive layer 193 can be formed using a material reflecting visible light and thus the light extraction efficiency of the light-emitting element 360 can be increased.

As the polarizing plate 130a provided on the outer surface of the substrate 351, a linear polarizing plate or a circularly polarizing plate can be used. An example of a circularly polarizing plate is a stack including a linear polarizing plate and a quarter-wave retardation plate. Such a structure can reduce reflection of external light. A light diffusion plate may be provided to reduce reflection of external light. The cell gap, orientation, drive voltage, and the like of the liquid crystal element used as the liquid crystal element 340 are adjusted depending on the kind of the polarizing plate so that desirable contrast is obtained.

An insulating layer 217 is provided over the insulating layer 216 that covers an end portion of the conductive layer 191. The insulating layer 217 has a function as a spacer for preventing the insulating layer 220 and the substrate 351 from getting closer than necessary. In addition, in the case where the EL layer 192 or the conductive layer 193 is formed using a shielding mask (metal mask), the insulating layer 217 mask may have a function of preventing the shielding mask from being in contact with a surface on which the EL layer 192 or the conductive layer 193 is formed. Note that the insulating layer 217 is not necessarily provided when not needed.

One of a source and a drain of the transistor 205 is electrically connected to the conductive layer 191 of the light-emitting element 360 through a conductive layer 224.

The wiring 209 is electrically connected to the conductive layer 311 through the connection portion 207. The connection portion 207 is a portion in which the conductive layers provided on both surfaces of the insulating layer 220 are connected to each other in an opening provided in the insulating layer 220.

A connection portion 204 is provided in a region near an end portion of the substrate 351. The connection portion 204 is electrically connected to the FPC 372 through a connection layer 242. The connection portion 204 has a structure similar to that of the connection portion 207. On the bottom surface of the connection portion 204, a conductive layer obtained by processing a conductive film that is also used to form the conductive layer 311 is exposed. Thus, the connection portion 204 and the FPC 372 can be electrically connected to each other through the connection layer 242.

A connection portion 252 is provided in part of a region where the adhesive layer 161 is provided. In the connection portion 252, the conductive layer obtained by processing a conductive film that is also used to form the conductive layer 311 is electrically connected to part of the conductive layer 313 with a connector 243. Accordingly, a signal or a potential input from the FPC 372 connected to the substrate 351 side can be supplied to the conductive layer 313 formed on the substrate 361 side through the connection portion 252.

As the connector 243, a conductive particle can be used, for example. As the conductive particle, a particle of an organic resin, silica, or the like coated with a metal material can be used. Nickel or gold, which can reduce contact resistance, is preferably used as the metal material. It is also preferable to use a particle coated with layers of two or more kinds of metal materials, such as a particle coated with nickel and further with gold. As the connector 243, a material capable of elastic deformation or plastic deformation is preferably used. As illustrated in FIG. 16A, the connector 243 that is the conductive particle has a vertically crushed shape in some cases. The crushed shape leads to an increase in the contact area between the connector 243 and a conductive layer electrically connected to the connector 243, thereby reducing contact resistance and suppressing the generation of problems such as disconnection.

The connector 243 is preferably provided so as to be covered with the adhesive layer 161. For example, the connector 243 is dispersed in the adhesive layer 161 that is not yet cured.

In the example of FIG. 16A, the transistors 201 and 205 each have a structure in which the semiconductor layer 231 where a channel is formed is provided between two gates. One gate is formed by the conductive layer 221 and the other gate is formed by a conductive layer 223 overlapping with the semiconductor layer 231 with the insulating layer 212 therebetween. Such a structure enables control of threshold voltages of transistors. Here, the two gate electrodes may be connected to each other and supplied with the same signal to operate the transistors. Such transistors can have a higher field-effect mobility and thus have a higher on-state current than other transistors. Consequently, a circuit capable of high-speed operation can be obtained. Furthermore, the area occupied by a circuit portion can be reduced. The use of the transistor having a high on-state current can reduce signal delay in wirings and can reduce display unevenness even in a display panel in which the number of wirings is increased because of increase in size or definition.

Note that the transistor included in the circuit 364 and the transistor included in the display portion 362 may have the same structure. A plurality of transistors included in the circuit 364 may have the same structure or different structures. A plurality of transistors included in the display portion 362 may have the same structure or different structures.

A material through which impurities such as water or hydrogen do not easily diffuse is preferably used for at least one of the insulating layers 212 and 213 that cover the transistors. That is, the insulating layer 212 or the insulating layer 213 can function as a barrier film. Such a structure can effectively suppress diffusion of the impurities into the transistors from the outside, allowing the display panel to have high reliability.

Cross-Sectional Structure Example 2

Figure 17:
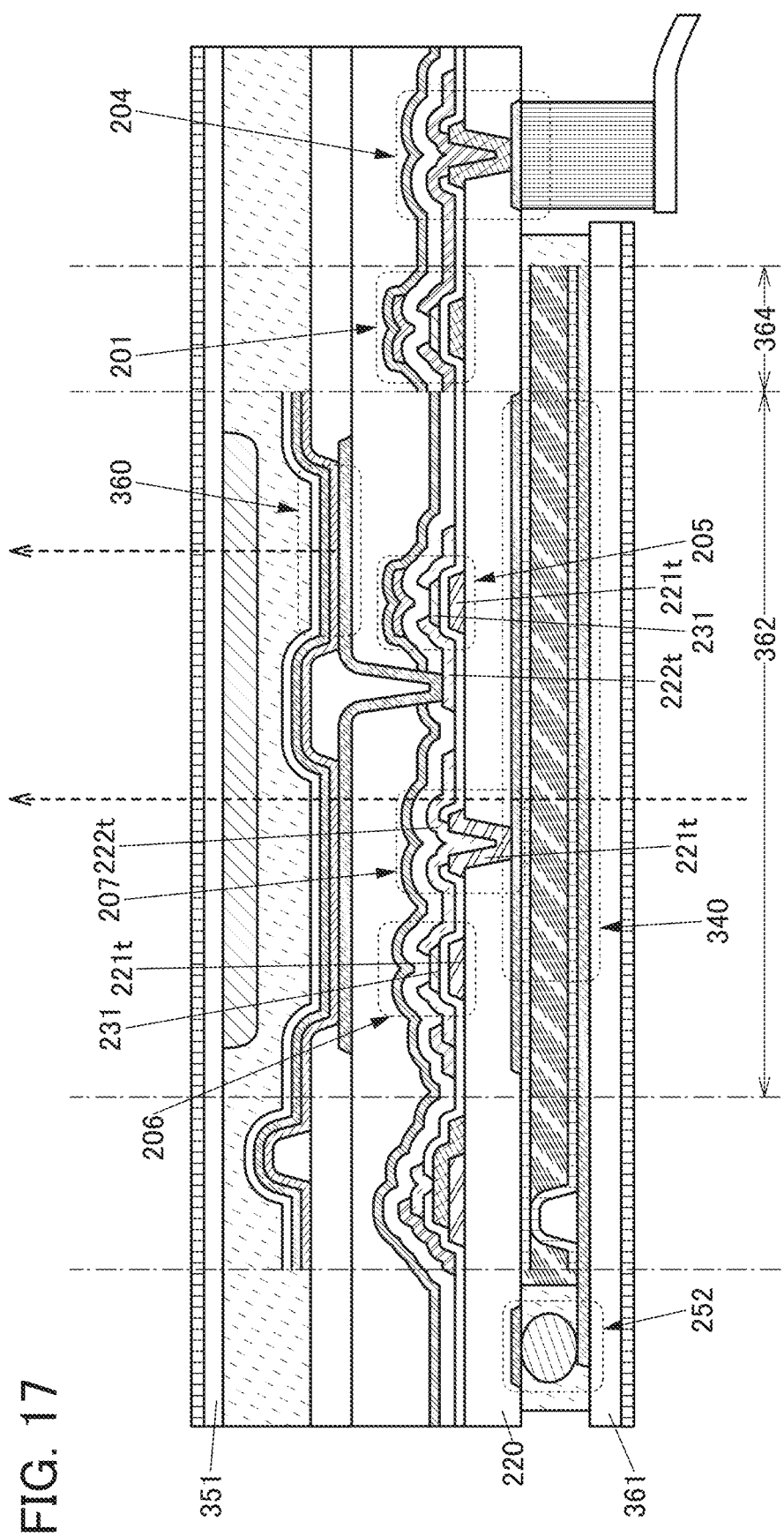
FIG. 17 illustrates a structure example of a display panel.

FIG. 17 shows an example including a transistor 206 electrically connected to the liquid crystal element 340. The transistor 206 serves as a selection transistor for the liquid crystal element 340. Accordingly, the liquid crystal element 340 can be an active matrix liquid crystal element.

The transistor 206 includes the conductive layers 221t and 222t and the like that have a light-transmitting property, like the transistor 202. Thus, a region where the transistor 206 is provided serves as the transmission region.

In the connection portion 207, the conductive layer 221t and part of the conductive layer 222t serving as one of a source and a drain of the transistor 206 are in contact with each other. Thus, the conductive layer 311 of the liquid crystal element 340 is electrically connected to the transistor 206 through the connection portion 207. A region where the connection portion 207 is provided also serves as the transmission region.

When the semiconductor layer 231 of the transistor 206 includes an oxide semiconductor, the liquid crystal element 340 can be driven at a low frame frequency (e.g., lower than 1 Hz). This enables a reduction in power consumption at the time of driving the liquid crystal element 340.

Cross-Sectional Structure Example 3

Figure 18:
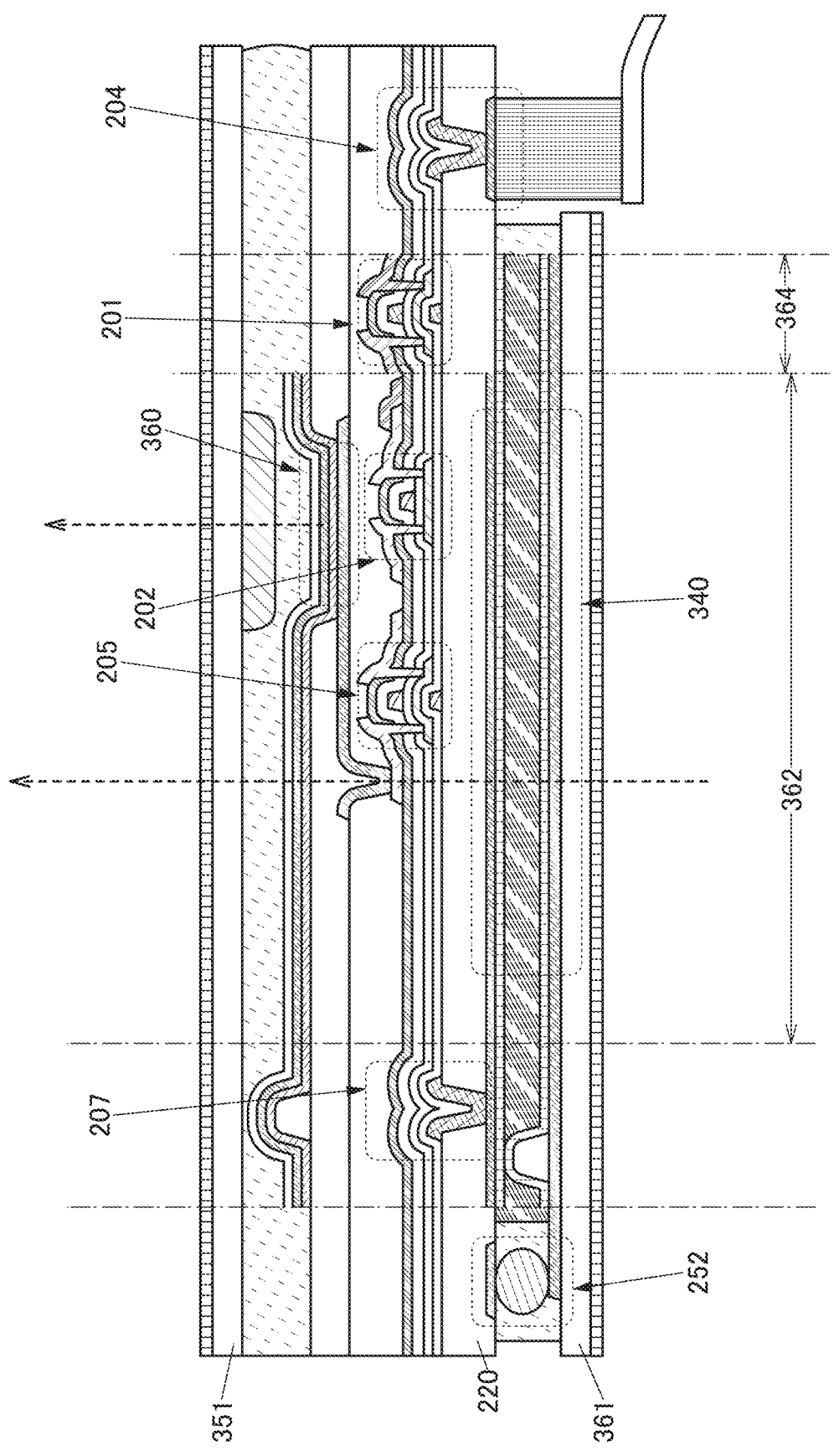
FIG. 18 illustrates a structure example of a display panel.

FIG. 18 shows an example of a structure in which the transistors 201, 202, and 205 have structures different from those shown in FIG. 16A and the like.

The transistor 202 is a top-gate transistor. Each of the transistors 201 and 205 has the same structure as the transistor 202 except to further include a conductive layer serving as a second gate.

Conductive layers serving as gate electrodes, source electrodes, and drain electrodes of the transistors 202 and 205 are each preferably a conductive film that transmits visible light. In that case, a region where the transistors 202 and 205 are provided can be the transmission region.

In contrast, conductive layers serving as a gate electrode, a source electrode, and a drain electrode of the transistor 201 can each be a conductive film that blocks visible light.

Cross-Sectional Structure Example 4

Figure 19:
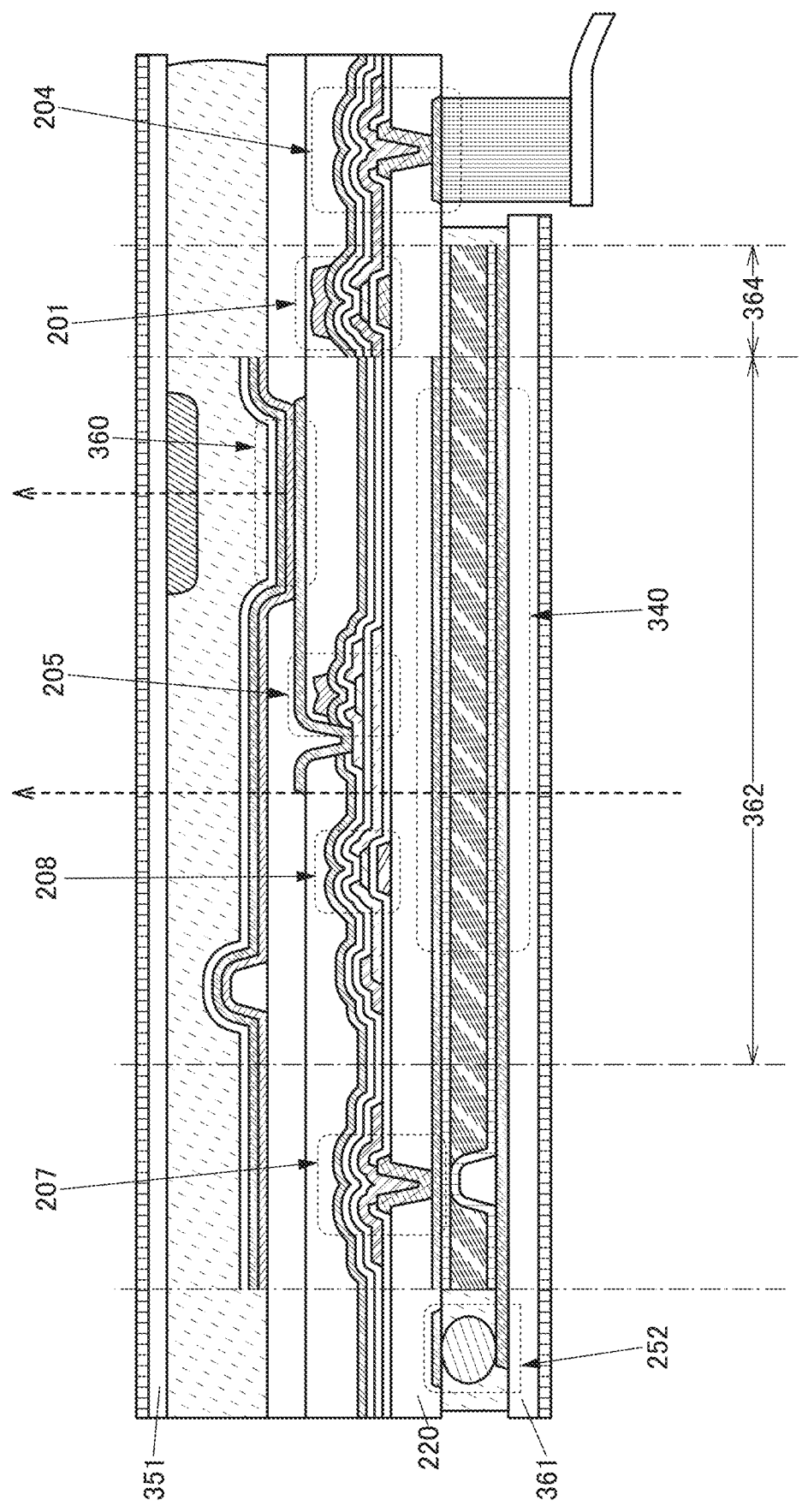
FIG. 19 illustrates a structure example of a display panel.

The display panel of one embodiment of the present invention may include a region where the transistor 205 and the transistor 208, which are provided in a pixel, overlap with each other as illustrated in FIG. 19. The display device with such a structure can have a reduced area per pixel and a high pixel density and can display a high definition image.

The display panel with such a structure can have a high definition over 1,500 ppi or 2,000 ppi, even when formed with a glass substrate or the like.

One of a source and a drain of the transistor 208 serves as one gate of the transistor 205.

For example, the display panel can include a region where the transistor 205 for driving the light-emitting element 360 and the transistor 208 overlap with each other. When the liquid crystal element 340 includes an active matrix transistor, the display panel may include a region where the transistor for driving the liquid crystal element 340 and one of the transistors 205 and 208 overlap with each other.

Conductive layers serving as gate electrodes, source electrodes, and drain electrodes of the transistors 208 and 205 are each preferably a light-transmitting conductive film.

Cross-Sectional Structure Example 5

Figure 20:
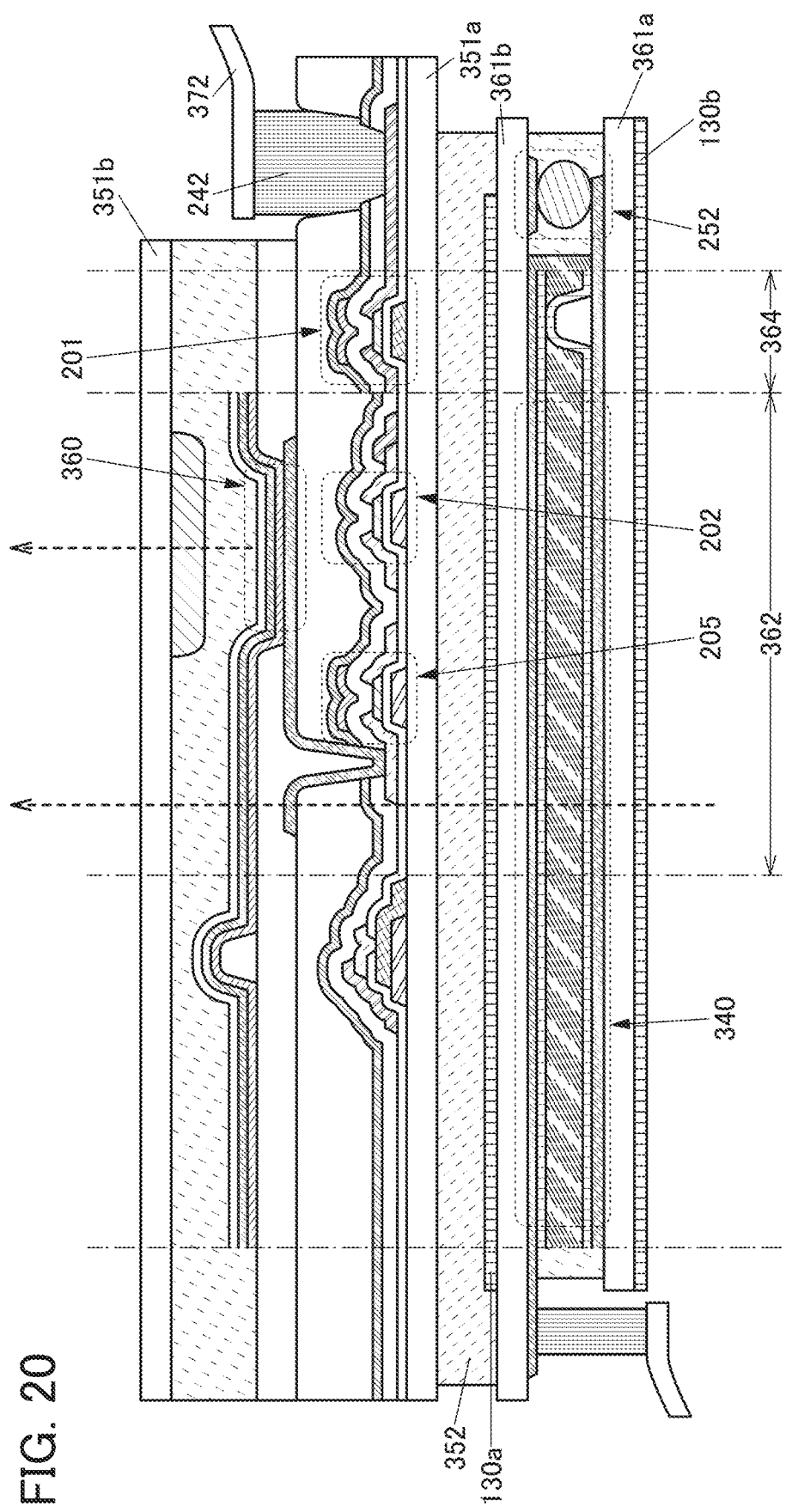
FIG. 20 illustrates a structure example of a display panel.

In the above structure, the light-emitting element 360 and the liquid crystal element 340 between which the insulating layer 220 is located are between the pair of substrates; however, other structures are also available. For example, a light-emitting panel including the light-emitting element 360 and a pair of substrates may be attached to a liquid crystal panel including the liquid crystal element 340 and a pair of substrates. FIG. 20 illustrates such an example.

In FIG. 20, the liquid crystal element 340 is between a substrate 361a and a substrate 361b. The light-emitting element 360, the transistors 201, 202, and 205, and the like are between a substrate 351a and a substrate 351b. The structure including the substrates 351a and 351b is referred to as a light-emitting panel, and the structure including the substrates 361a and 361b is referred to as a liquid crystal panel.

The substrates 361b and 351a are attached to each other with an adhesive layer 352. The adhesive layer 352 has a light-transmitting property. For example, a sheet-like or film-like adhesive can be used. For example, an optical clear adhesive (OCA) film is preferably used.

In such a structure, the polarizing plate 130a can be positioned between the substrate 351a and the substrate 361b. Accordingly, the light extraction efficiency of the light-emitting element 360 can be increased and bright display can be performed with low power consumption.

Such a structure enables separate formation of the light-emitting panel and the liquid crystal panel and later attachment thereof. This can improve the yield. It is preferable that the liquid crystal element 340 be a passive matrix liquid crystal element or a segment liquid crystal element and be large enough to cover a plurality of light-emitting elements 360. In that case, high positional accuracy is not required in attachment of the light-emitting panel and the liquid crystal panel, whereby the productivity can be improved.

[Example of Manufacturing Method]

As an example of a method for manufacturing a display device of one embodiment of the present invention, a method for manufacturing the display device shown in FIG. 16A and the like is described below.

Over a support substrate, the conductive layer 311 is formed and subsequently the insulating layer 220 is formed. After that, the transistors 201, 202, and 205, the light-emitting element 360, and the like are formed over the insulating layer 220. Here, an opening reaching the conductive layer 311 is formed in the insulating layer 220, and the conductive layer 221 and the like are formed to cover the opening; as a result, the connection portion 207 is formed.

The conductive layers 221t and 221 are formed in the following manner. A conductive film to be the conductive layer 221t is formed, the conductive film is etched with the use of a resist mask over the conductive film, and then the resist mask is removed; as a result, the conductive layer 221t is formed. Next, a conductive film covering the conductive layer 221t is formed, and the conductive film is etched with the use of a resist mask; as a result, the conductive layer 221 is formed. The conductive layer 221 is preferably etched under a condition that does not cause, or hardly causes, etching of the conductive layer 221t. The conductive layers 222 and 222t can be formed in a similar manner.

Next, the substrate 351 and the support substrate are attached to each other with the adhesive layer 162. After that, the support substrate is separated from the conductive layer 311 and the insulating layer 220.

For separation of the support substrate from the conductive layer 311 and the insulating layer 220, a separation layer is provided between the support substrate and two of the conductive layer 311 and the insulating layer 220. The separation layer has a structure that allows separation between the separation layer and the support substrate, in the separation layer, or between the separation layer and the conductive layer 311 or the insulation layer 220.

For example, as the separation layer, it is possible to use a stack of a layer containing a high-melting-point metal material such as tungsten and a layer containing an oxide of the metal material. As the insulating layer over the separation layer, it is possible to use an insulating layer containing an inorganic insulating material such as silicon nitride, silicon oxide, silicon oxynitride, or silicon nitride oxide. In that case, separation can be caused at the interface between tungsten and tungsten oxide, in tungsten oxide, or at the interface between tungsten oxide and the insulating layer.

Alternatively, an organic resin may be used for the separation layer so that separation can be caused at the interface between the support substrate and the separation layer, in the separation layer, or at the interface between the separation layer and the insulating layer over the separation layer.

Typically, a polyimide resin can be used for the organic resin. The polyimide resin is preferable because of its high heat resistance. An acrylic resin, an epoxy resin, a polyamide resin, a polyimide-amide resin, a siloxane resin, a benzocyclobutene-based resin, a phenol resin, or the like can also be used. For example, to form the organic resin, a mixed material of a resin precursor and a solvent is formed over the support substrate by a method such as spin coating, dipping, spray coating, inkjet printing, dispensing, screen printing, or offset printing, or with a doctor knife, a slit coater, a roll coater, a curtain coater, or a knife coater. After that, heat treatment is performed to remove the solvent and the like and cure the material, so that the separation layer containing the organic resin can be formed.

For example, a resin precursor that can generate an imide bond by dehydration can be used to prepare polyimide. Alternatively, a material containing a soluble polyimide resin may be used.

The organic resin may be either photosensitive or non-photosensitive. A photosensitive polyimide is a material that is suitably used for a planarization film or the like of the display panel, and therefore, the formation apparatus and the material can be shared. Thus, there is no need to prepare another apparatus and another material to obtain the structure of one embodiment of the present invention. Furthermore, the separation layer that is formed using a photosensitive resin material can be processed by light exposure and development treatment. For example, an opening portion can be formed and an unnecessary portion can be removed. Moreover, by optimizing a light exposure method or light exposure conditions, an uneven shape can be formed in a surface of the resin layer. For example, a multiple exposure technique or an exposure technique using a half-tone mask or a gray-tone mask may be used.

When the separation layer is heated locally, the separability can be improved in some cases. For example, the separation layer can be irradiated with laser light. It is preferable to perform the irradiation by scanning using linear laser light. Such irradiation can shorten the process time in the case of using a large support substrate. As the laser light, excimer laser light with a wavelength of 308 nm can be suitably used.

When light irradiation with laser light or the like is to be performed to improve the separability, a heat generation layer may be provided to overlap with the separation layer. The heat generation layer has a function of generating heat by absorbing light. The heat generation layer is preferably provided between the support substrate and the separation layer, but may be provided over the separation layer. A material that can absorb part of light used as laser light or the like can be used for the heat generation layer. For example, a metal, an oxide, or the like can be included in the heat generation layer when excimer laser light with a wavelength of 308 nm is used as the laser light. For example, a metal such as titanium or tungsten, an oxide conductive material such as titanium oxide, tungsten oxide, indium oxide, or indium tin oxide, or an indium-containing oxide semiconductor material can be used.

In some cases, part of the separation layer remains on the light path in the light-emitting element 360 or the liquid crystal element 340 after the separation. In the case where the separation layer absorbs part of visible light, light transmitted through the separation layer might be colored. For this reason, after the separation, the remaining separation layer is preferably removed by etching. For example, in the case where an organic resin is used for the separation layer, the remaining separation layer can be removed by, for example, plasma treatment (also referred to as ashing treatment) in an oxygen-containing atmosphere.

When a surface of the conductive layer 311 is exposed by treatment such as etching after the separation, an electric field can be more efficiently applied to the liquid crystal element 340 and the driving voltage can thus be reduced. When an insulating film through which impurities such as water hardly diffuse (e.g., a film containing an inorganic insulating material such as silicon oxide, silicon nitride, or aluminum oxide) remains on the surface of the conductive layer 311 after the separation, the remaining insulating film can serve as a protection film that prevents diffusion of impurities into the liquid crystal 312.

After that, the alignment film 133a is formed over the insulating layer 220 and the conductive layer 311. Then, the substrate 351 and the substrate 361 where the conductive layer 313, the alignment film 133b, and the like are already formed are attached to each other with the liquid crystal 312 therebetween.

In the above manner, the display panel 300 shown in FIG. 16A can be formed.

[Components]

The above components will be described below.

[Substrate]

A material having a flat surface can be used as the substrate included in the display panel. The substrate on the side from which light from the display element is extracted is formed using a material that transmits the light. For example, a material such as glass, quartz, ceramic, sapphire, or an organic resin can be used.

The weight and thickness of the display panel can be decreased by using a thin substrate. A flexible display panel can be obtained by using a substrate that is thin enough to have flexibility.

Examples of the material that has flexibility and transmits visible light include polyester resins such as polyethylene terephthalate (PET) and polyethylene naphthalate (PEN), a polyacrylonitrile resin, a polyimide resin, a polymethyl methacrylate resin, a polycarbonate (PC) resin, a polyethersulfone (PES) resin, a polyamide resin, a cycloolefin resin, a polystyrene resin, a polyamide imide resin, a polyvinyl chloride resin, and a polytetrafluoroethylene (PTFE). In particular, a material whose thermal expansion coefficient is low is preferred, and for example, a polyamide imide resin, a polyimide resin, or PET with a thermal expansion coefficient of $30 \times 10^{-6}$/K or less can be suitably used. A substrate in which a glass fiber is impregnated with an organic resin or a substrate whose thermal expansion coefficient is reduced by mixing an organic resin with an inorganic filler can also be used. A substrate using such a material is lightweight, and thus a display panel using this substrate can also be lightweight.

In the case where a fibrous body is included in the above material, a high-strength fiber of an organic compound or an inorganic compound is used as the fibrous body. The high-strength fiber is specifically a fiber with a high tensile elastic modulus or a fiber with a high Young's modulus. Typical examples thereof include a polyvinyl alcohol based fiber, a polyester based fiber, a polyamide based fiber, a polyethylene based fiber, an aramid based fiber, a polyparaphenylene benzobisoxazole fiber, a glass fiber, and a carbon fiber. As the glass fiber, a glass fiber using E glass, S glass, D glass, Q glass, and the like can be given. These fibers may be used in a state of a woven or nonwoven fabric, and a structure body in which this fibrous body is impregnated with a resin and the resin is cured may be used as the flexible substrate. The structure body including the fibrous body and the resin is preferably used as the flexible substrate, in which case the reliability against breaking due to bending or local pressure can be increased.

Alternatively, glass or the like that is thin enough to have flexibility can be used as the substrate. Alternatively, a composite material where glass and a resin material are attached to each other with an adhesive layer may be used.

A hard coat layer (e.g., a silicon nitride layer and an aluminum oxide layer) by which a surface of a display panel is protected from damage, a layer (e.g., an aramid resin layer) that can disperse pressure, or the like may be stacked over the flexible substrate. Furthermore, to suppress a decrease in lifetime of the display element due to moisture and the like, an insulating film with low water permeability may be stacked over the flexible substrate. For example, an inorganic insulating material such as silicon nitride, silicon oxynitride, silicon nitride oxide, aluminum oxide, or aluminum nitride can be used.

The substrate may be formed by stacking a plurality of layers. The use of a glass layer can improve a barrier property against water and oxygen and thus allow the display panel to have high reliability.

[Transistor]

The transistors each include a conductive layer functioning as the gate electrode, the semiconductor layer, a conductive layer functioning as the source electrode, a conductive layer functioning as the drain electrode, and an insulating layer functioning as the gate insulating layer.

Note that there is no particular limitation on the structure of the transistor included in the display device of one embodiment of the present invention. For example, a planar transistor, a staggered transistor, or an inverted staggered transistor may be used. A top-gate transistor or a bottom-gate transistor may be used. Gate electrodes may be provided above and below a channel.

There is no particular limitation on the crystallinity of a semiconductor material used for the transistors, and an amorphous semiconductor or a semiconductor having crystallinity (a microcrystalline semiconductor, a polycrystalline semiconductor, a single-crystal semiconductor, or a semiconductor partly including crystal regions) may be used. A semiconductor having crystallinity is preferably used, in which case deterioration of the transistor characteristics can be suppressed.

As a semiconductor material used for the transistors, a metal oxide whose energy gap is greater than or equal to 2 eV, preferably greater than or equal to 2.5 eV, further preferably greater than or equal to 3 eV can be used. A typical example thereof is a metal oxide containing indium, and for example, a CAC-OS described later or the like can be used.

A transistor with a metal oxide having a larger band gap and a lower carrier density than silicon has a low off-state current; therefore, charges stored in a capacitor that is series-connected to the transistor can be held for a long time.

The semiconductor layer can be, for example, a film represented by an In-M-Zn-based oxide that contains indium, zinc, and M (a metal such as aluminum, titanium, gallium, germanium, yttrium, zirconium, lanthanum, cerium, tin, neodymium, or hafnium).

In the case where the metal oxide contained in the semiconductor layer contains an In-M-Zn-based oxide, it is preferable that the atomic ratio of metal elements of a sputtering target used for forming a film of the In-M-Zn oxide satisfy In≥M and Zn≥M. The atomic ratio of metal elements in such a sputtering target is preferably, for example, In:M:Zn=1:1:1, In:M:Zn=1:1:1.2, In:M:Zn=3:1:2, In:M:Zn=4:2:3, In:M:Zn=4:2:4.1, In:M:Zn=5:1:6, In:M:Zn=5:1:7, or In:M:Zn=5:1:8. Note that the atomic ratio of metal elements in the formed oxide semiconductor layer varies from the above atomic ratios of metal elements of the sputtering targets in a range of ±40%.

The bottom-gate transistor described in this embodiment is preferable because the use of the bottom-gate transistor can reduce the number of manufacturing steps. Here, when a metal oxide, which can be formed at a lower temperature than polycrystalline silicon, is used, materials with low heat resistance can be used for a wiring, an electrode, or a substrate below the semiconductor layer, so that the range of choices of materials can be widened. For example, an extremely large glass substrate can be favorably used.

A metal oxide film with low carrier density is used as the semiconductor layer. For example, the semiconductor layer can include a metal oxide whose carrier density is lower than or equal to $1 \times 10^{17}$/cm$^3$, preferably lower than or equal to $1 \times 10^{15}$/cm$^3$, more preferably lower than or equal to $1 \times 10^{13}$/cm$^3$, still more preferably lower than or equal to $1\times10^{11}/cm^3$, even more preferably lower than $1\times10^{10}/cm^3$, and higher than or equal to $1\times10^{-9}/cm^3$. Such a metal oxide is referred to as a highly purified intrinsic or substantially highly purified intrinsic metal oxide. The metal oxide has a low impurity concentration and a low density of defect states and can thus be referred to as a metal oxide having stable characteristics.

However, the composition is not limited to those described above, and a material having the appropriate composition may be used depending on required semiconductor characteristics and electrical characteristics of the transistor (e.g., field-effect mobility and threshold voltage). To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to appropriate values.

When silicon or carbon that is one of elements belonging to Group 14 is contained in the metal oxide contained in the semiconductor layer, oxygen vacancies are increased in the semiconductor layer, and the semiconductor layer becomes n-type. Thus, the concentration of silicon or carbon (measured by secondary ion mass spectrometry) in the semiconductor layer is set to lower than or equal to $2\times10^{18}$ atoms/$cm^3$, preferably lower than or equal to $2\times10^{17}$ atoms/$cm^3$.

Alkali metal and alkaline earth metal might generate carriers when bonded to a metal oxide, in which case the off-state current of the transistor might be increased. Therefore, the concentration of alkali metal or alkaline earth metal of the semiconductor layer, which is measured by secondary ion mass spectrometry, is set to lower than or equal to $1\times10^{18}$ atoms/$cm^3$, preferably lower than or equal to $2\times10^{16}$ atoms/$cm^3$.

When nitrogen is contained in the metal oxide contained in the semiconductor layer, electrons serving as carriers are generated and the carrier density increases, so that the semiconductor layer easily becomes n-type. Thus, a transistor including a metal oxide that contains nitrogen is likely to be normally on. Hence, the concentration of nitrogen which is measured by secondary ion mass spectrometry is preferably set to lower than or equal to $5\times10^{18}$ atoms/$cm^3$.

An oxide semiconductor is classified into a single-crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

The semiconductor layer of any of the transistors disclosed in one embodiment of the present invention may include a cloud-aligned composite OS (CAC-OS).

For the semiconductor layer of any of the transistors disclosed in one embodiment of the present invention, the above-described non-single-crystal oxide semiconductor or a CAC-OS can be suitably used. As the non-single-crystal oxide semiconductor, an nc-OS or a CAAC-OS can be suitably used.

The semiconductor layer of any of the transistors of one embodiment of the present invention preferably includes a CAC-OS. The use of a CAC-OS can give the transistor high electrical characteristics or high reliability.

The semiconductor layer may be a mixed film including two or more of a region of a CAAC-OS, a region of a polycrystalline oxide semiconductor, a region of an nc-OS, a region of an a-like OS, and a region of an amorphous oxide semiconductor. The mixed film has, for example, a single-layer structure or a stacked-layer structure including two or more of the above regions in some cases.

<Composition of CAC-OS>

Described below is the composition of a cloud-aligned composite oxide semiconductor (CAC-OS) applicable to a transistor disclosed in one embodiment of the present invention.

The CAC-OS has, for example, a composition in which elements included in a metal oxide are unevenly distributed. Materials including unevenly distributed elements each have a size of greater than or equal to 0.5 nm and less than or equal to 10 nm, preferably greater than or equal to 1 nm and less than or equal to 2 nm, or a similar size. Note that in the following description of a metal oxide, a state in which one or more metal elements are unevenly distributed and regions including the metal element(s) are mixed is referred to as a mosaic pattern or a patch-like pattern. The regions each have a size of greater than or equal to 0.5 nm and less than or equal to 10 nm, preferably greater than or equal to 1 nm and less than or equal to 2 nm, or a similar size.

Note that a metal oxide preferably contains at least indium. In particular, indium and zinc are preferably contained. In addition, aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0) or gallium zinc oxide ($Ga_{X4}Zn_{Y4}O_{Z4}$, where X4, Y4, and Z4 are real numbers greater than 0), and a mosaic pattern is formed. Then, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite metal oxide with a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1\leq x0 \leq 1$; m0 is a given number).

The above crystalline compounds have a single-crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of a metal oxide. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected metal element(s) as a main component(s) are observed in part of the CAC-OS and nanoparticle regions including In as a main component are observed in part thereof, and these nanoparticle regions are randomly dispersed to form a mosaic pattern in the CAC-OS.

The CAC-OS can be formed by a sputtering method under conditions where intentional substrate heating is not performed, for example. In the case of forming the CAC-OS by a sputtering method, one or more selected from an inert gas (typically, argon), an oxygen gas, and a nitrogen gas may be used as a deposition gas. The ratio of the flow rate of an oxygen gas to the total flow rate of the deposition gas at the time of deposition is preferably as low as possible, and for example, the flow ratio of an oxygen gas is preferably higher than or equal to 0% and less than 30%, further preferably higher than or equal to 0% and less than or equal to 10%.

The CAC-OS is characterized in that no clear peak is observed in measurement using θ/2θ scan by an out-of-plane method, which is an X-ray diffraction (XRD) measurement method. That is, X-ray diffraction shows no alignment in the a-b plane direction and the c-axis direction in a measured region.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes a nanocrystal (nc) structure with no alignment in plan-view and cross-sectional directions.

For example, an energy dispersive X-ray spectroscopy (EDX) mapping image confirms that an In—Ga—Zn oxide with the CAC composition has a structure in which a region including $GaO_{X3}$ as a main component and a region including $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of a metal oxide is exhibited. Accordingly, when regions including $In_{X2}Zn_{Y2}O_{Z2}$ or $InO_{X1}$ as a main component are distributed in a metal oxide like a cloud, high field-effect mobility (μ) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in a metal oxide, a leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby a high on-state current ($I_{on}$) and high field-effect mobility (μ) can be achieved.

A semiconductor element including a CAC-OS has high reliability. Thus, the CAC-OS is suitably used in a variety of semiconductor devices typified by a display.

Since a transistor including a CAC-OS in a semiconductor layer has high field-effect mobility and high driving capability, the use of the transistor in a driver circuit, a typical example of which is a scan line driver circuit that generates a gate signal, allows a display device to have a narrow bezel. Furthermore, the use of the transistor in a signal line driver circuit (particularly in a demultiplexer connected to an output terminal of a shift register included in a signal line driver circuit) in a display device can reduce the number of wirings connected to the display device.

Furthermore, unlike a transistor including low-temperature polysilicon, the transistor including a CAC-OS in the semiconductor layer does not need a laser crystallization step. Thus, the manufacturing cost of a display device can be reduced, even when the display device is formed using a large substrate. In addition, the transistor including a CAC-OS in the semiconductor layer is preferably used for a driver circuit and a display portion in a large display device having high resolution such as ultra high definition ("4K resolution", "4K2K", and "4K") or super high definition ("8K resolution", "8K4K", and "8K"), in which case writing can be performed in a short time and display defects can be reduced.

Alternatively, silicon may be used as a semiconductor in which a channel of a transistor is formed. Silicon may be amorphous silicon but is preferably silicon having crystallinity, such as microcrystalline silicon, polycrystalline silicon, or single-crystal silicon. In particular, polycrystalline silicon can be formed at a lower temperature than single-crystal silicon and has higher field-effect mobility and higher reliability than amorphous silicon.

The bottom-gate transistor described in this embodiment is preferable because the use of the bottom-gate transistor can reduce the number of manufacturing steps. When amorphous silicon, which can be formed at a lower temperature than polycrystalline silicon, is used for the semiconductor layer, materials with low heat resistance can be used for a wiring, an electrode, or a substrate below the semiconductor layer, resulting in wider choice of materials. For example, an extremely large glass substrate can be favorably used. Meanwhile, the top-gate transistor is preferable because an impurity region is easily formed in a self-aligned manner in the top-gate transistor and variation in characteristics can be reduced. The top-gate transistor is preferable in case of using polycrystalline silicon, single-crystal silicon, or the like.

[Conductive Layer]

Examples of materials that can be used for a gate, a source, and a drain of a light-blocking transistor and for a conductive layer serving as a wiring or an electrode included in a display device include a metal such as aluminum, titanium, chromium, nickel, copper, yttrium, zirconium, molybdenum, silver, tantalum, or tungsten and an alloy containing any of these metals as its main component. A single-layer structure or stacked-layer structure including a film containing any of these materials can be used. For example, the following structures can be used: a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, and a three-layer structure in which a molybdenum film or a molybdenum nitride film, an aluminum film or a copper film, and a molybdenum film or a molybdenum nitride film are stacked in this order. Note that an oxide such as indium oxide, tin oxide, or zinc oxide may be used. Copper containing manganese is preferably used because controllability of shape processing by etching is increased.

Examples of materials that can be used for a gate, a source, and a drain of a light-transmitting transistor and for a conductive layer serving as a wiring or an electrode in a display device include a conductive oxide such as indium oxide, indium tin oxide, indium zinc oxide, zinc oxide, or zinc oxide to which gallium is added, and graphene. It is also possible to use a metal material such as gold, silver, platinum, magnesium, nickel, tungsten, chromium, molybdenum, iron, cobalt, copper, palladium, or titanium; an alloy material containing any of these metal materials; or a nitride of any of these metal materials (e.g., titanium nitride). In the case of using the metal material or the alloy material (or the nitride thereof), the film thickness is set small enough to transmit light. Alternatively, a stacked-layer film of any of the above materials can be used for the conductive layers. For example, a stacked-layer film of indium tin oxide and an alloy of silver and magnesium is preferably used because such a film can increase the conductivity. They can also be used for conductive layers for a variety of wirings and electrodes included in a display device, and conductive layers (e.g., conductive layers serving as a pixel electrode and a common electrode) included in a display element.

As a light-transmitting conductive material, an oxide semiconductor whose resistance is reduced by, for example, introduction of an impurity element (such an oxide semiconductor is referred to as an oxide conductor or OC) is preferably used.

[Insulating Layer]

Examples of an insulating material that can be used for the insulating layers include a resin such as acrylic or epoxy resin, a resin having a siloxane bond, and an inorganic insulating material such as silicon oxide, silicon oxynitride, silicon nitride oxide, silicon nitride, or aluminum oxide.

The light-emitting element is preferably provided between a pair of insulating films with low water permeability, in which case impurities such as water can be prevented from entering the light-emitting element. Thus, a decrease in device reliability can be prevented.

Examples of the insulating film with low water permeability include a film containing nitrogen and silicon (e.g., a silicon nitride film and a silicon nitride oxide film) and a film containing nitrogen and aluminum (e.g., an aluminum nitride film). Alternatively, a silicon oxide film, a silicon oxynitride film, an aluminum oxide film, or the like may be used.

For example, the moisture vapor transmission rate of the insulating film with low water permeability is lower than or equal to $1\times10^{-5}$ [g/(m$^2$·day)], preferably lower than or equal to $1\times10^{-6}$ [g/(m$^2$·day)], further preferably lower than or equal to $1\times10^{-7}$ [(g/(m$^2$·day)], still further preferably lower than or equal to $1\times10^{-8}$ [g/(m$^2$·day)].

[Liquid Crystal Element]

The liquid crystal element can employ, for example, a vertical alignment (VA) mode. Examples of the vertical alignment mode include a multi-domain vertical alignment (MVA) mode, a patterned vertical alignment (PVA) mode, and an advanced super view (ASV) mode.

The liquid crystal element can employ a variety of modes. For example, instead of a VA mode, a liquid crystal element can employ a twisted nematic (TN) mode, an in-plane switching (IPS) mode, a fringe field switching (FFS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, an electrically controlled birefringence (ECB) mode, or a guest-host mode.

The liquid crystal element controls transmission or non-transmission of light utilizing an optical modulation action of liquid crystal. The optical modulation action of liquid crystal is controlled by an electric field applied to the liquid crystal (including a horizontal electric field, a vertical electric field, and an oblique electric field). As the liquid crystal used for the liquid crystal element, thermotropic liquid crystal, low-molecular liquid crystal, high-molecular liquid crystal, polymer dispersed liquid crystal (PDLC), polymer network liquid crystal (PNLC), ferroelectric liquid crystal, anti-ferroelectric liquid crystal, or the like can be used. Such a liquid crystal material exhibits a cholesteric phase, a smectic phase, a cubic phase, a chiral nematic phase, an isotropic phase, or the like depending on conditions.

As the liquid crystal material, either of a positive liquid crystal and a negative liquid crystal may be used, and an appropriate liquid crystal material may be used depending on the mode or design to be used.

An alignment film can be provided to adjust the alignment of a liquid crystal. In the case where a horizontal electric field mode is employed, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which a chiral material is mixed to account for several weight percent or more is used for the liquid crystal layer in order to improve the temperature range. The liquid crystal composition which includes liquid crystal exhibiting a blue phase and a chiral material has a short response time and optical isotropy, which makes the alignment process unneeded. In addition, the liquid crystal composition which includes liquid crystal exhibiting a blue phase and a chiral material has a small viewing angle dependence. An alignment film does not need to be provided and rubbing treatment is thus not necessary; accordingly, electrostatic discharge damage caused by the rubbing treatment can be prevented and defects and damage of the liquid crystal display device in the manufacturing process can be reduced.

As the liquid crystal element, a transmissive liquid crystal element, a reflective liquid crystal element, a semi-transmissive liquid crystal element, or the like can be used.

In one embodiment of the present invention, in particular, a transmissive liquid crystal element can be suitably used.

In the case where a transmissive or semi-transmissive liquid crystal element is used, two polarizing plates are provided such that a pair of substrates is sandwiched therebetween. Furthermore, a backlight is provided on the outer side of the polarizing plate. As the backlight, a direct-below backlight or an edge-light backlight may be used. It is preferable to use a direct-below backlight including an LED to perform local dimming easily and increase the contrast. It is preferable to use an edge-light backlight to reduce the thickness of a module including the backlight.

When an edge-light type backlight is off, see-through display can be performed.

[Light-Emitting Element]

As the light-emitting element, a self-luminous element can be used, and an element whose luminance is controlled by current or voltage is included in the category of the light-emitting element. For example, an LED, an organic EL element, an inorganic EL element, or the like can be used.

The light-emitting element has a top-emission structure, a bottom-emission structure, a dual-emission structure, or the like. A conductive film that transmits visible light is used as the electrode through which light is extracted. A conductive film that reflects visible light is preferably used as the electrode through which no light is extracted.

In one embodiment of the present invention, a top-emission or dual-emission light emitting element can be particularly preferably used.

The EL layer includes at least a light-emitting layer. In addition to the light-emitting layer, the EL layer may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer, a low-molecular compound or a high-molecular compound can be used, and an inorganic compound may also be used. Each of the layers included in the EL layer can be formed by any of the following methods: an evaporation method (including a vacuum evaporation method), a transfer method, a printing method, an inkjet method, a coating method, and the like.

When a voltage higher than the threshold voltage of the light-emitting element is applied between a cathode and an anode, holes are injected to the EL layer from the anode side and electrons are injected to the EL layer from the cathode side. The injected electrons and holes are recombined in the EL layer and a light-emitting substance contained in the EL layer emits light.

In the case where a light-emitting element emitting white light is used as the light-emitting element, the EL layer preferably contains two or more kinds of light-emitting substances. For example, the two or more kinds of light-emitting substances are selected so as to emit light of complementary colors to obtain white light emission. Specifically, it is preferable to contain two or more selected from light-emitting substances emitting light of red (R), green (G), blue (B), yellow (Y), orange (O), and the like and light-emitting substances emitting light containing two or more of spectral components of R, G, and B The light-emitting element preferably emits light with a spectrum having two or more peaks in the wavelength range of a visible light region (e.g., 350 nm to 750 nm). An emission spectrum of a material that emits light having a peak in a yellow wavelength range preferably includes spectral components also in green and red wavelength ranges.

Preferably, a light-emitting layer containing a light-emitting material emitting light of one color and a light-emitting layer containing a light-emitting material emitting light of another color are stacked in the EL layer. For example, the plurality of light-emitting layers in the EL layer may be stacked in contact with each other or may be stacked with a region not including any light-emitting material therebetween. For example, between a fluorescent layer and a phosphorescent layer, a region that contains the same material as the fluorescent layer or phosphorescent layer (for example, a host material or an assist material) and no light-emitting material may be provided. This facilitates the manufacture of the light-emitting element and reduces the drive voltage.

The light-emitting element may be a single element including one EL layer or a tandem element in which a plurality of EL layers are stacked with a charge generation layer therebetween.

The conductive film that transmits visible light can be formed using, for example, indium oxide, indium tin oxide, indium zinc oxide, zinc oxide, or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; or a nitride of any of these metal materials (e.g., titanium nitride) formed thin enough to have a light-transmitting property can be used. Alternatively, a stacked-layer film of any of the above materials can be used for the conductive layers. For example, a stacked-layer film of indium tin oxide and an alloy of silver and magnesium is preferably used, in which case conductivity can be increased. Further alternatively, graphene or the like may be used.

For the conductive film that reflects visible light, for example, a metal material such as aluminum, gold, platinum, silver, nickel, tungsten, chromium, molybdenum, iron, cobalt, copper, or palladium or an alloy containing any of these metal materials can be used. Lanthanum, neodymium, germanium, or the like may be added to the metal material or the alloy. Alternatively, an alloy containing aluminum (an aluminum alloy) such as an alloy of aluminum and titanium, an alloy of aluminum and nickel, or an alloy of aluminum and neodymium may be used. Alternatively, an alloy containing silver such as an alloy of silver and copper, an alloy of silver and palladium, or an alloy of silver and magnesium may be used. An alloy containing silver and copper is preferable because of its high heat resistance. Furthermore, when a metal film or a metal oxide film is stacked in contact with an aluminum film or an aluminum alloy film, oxidation can be suppressed. Examples of a material for the metal film or the metal oxide film include titanium and titanium oxide. Alternatively, the above conductive film that transmits visible light and a film containing a metal material may be stacked. For example, a stack of silver and indium tin oxide, a stack of an alloy of silver and magnesium and indium tin oxide, or the like can be used.

Each of the electrodes can be formed by an evaporation method or a sputtering method. Alternatively, a discharging method such as an inkjet method, a printing method such as a screen printing method, or a plating method may be used.

Note that the aforementioned light-emitting layer and layers containing a substance with a high hole-injection property, a substance with a high hole-transport property, a substance with a high electron-transport property, a substance with a high electron-injection property, a substance with a bipolar property, and the like may include an inorganic compound such as a quantum dot or a high molecular compound (e.g., an oligomer, a dendrimer, and a polymer). For example, used for the light-emitting layer, the quantum dot can serve as a light-emitting material.

The quantum dot may be a colloidal quantum dot, an alloyed quantum dot, a core-shell quantum dot, a core quantum dot, or the like. The quantum dot containing elements belonging to Groups 12 and 16, elements belonging to Groups 13 and 15, or elements belonging to Groups 14 and 16, may be used. Alternatively, the quantum dot containing an element such as cadmium, selenium, zinc, sulfur, phosphorus, indium, tellurium, lead, gallium, arsenic, or aluminum may be used.

[Adhesive Layer]

As the adhesive layer, a variety of curable adhesives, e.g., a photocurable adhesive such as an ultraviolet curable adhesive, a reactive curable adhesive, a thermosetting adhesive, and an anaerobic adhesive can be used. Examples of these adhesives include an epoxy resin, an acrylic resin, a silicone resin, a phenol resin, a polyimide resin, an imide resin, a polyvinyl chloride (PVC) resin, a polyvinyl butyral (PVB) resin, an ethylene vinyl acetate (EVA) resin, and the like. In particular, a material with low moisture permeability, such as an epoxy resin, is preferred. Alternatively, a two-component resin may be used. Still alternatively, an adhesive sheet or the like may be used.

Furthermore, the resin may include a drying agent. For example, a substance that adsorbs moisture by chemical adsorption, such as oxide of an alkaline earth metal (e.g., calcium oxide or barium oxide), can be used. Alternatively, a substance that adsorbs moisture by physical adsorption, such as zeolite or silica gel, may be used. The drying agent is preferably included because it can prevent impurities such as moisture from entering the element, thereby improving the reliability of the display panel.

In addition, it is preferable to mix a filler with a high refractive index or light-scattering member into the resin, in which case light extraction efficiency can be enhanced. For example, titanium oxide, barium oxide, zeolite, zirconium, or the like can be used.

[Connection Layer]

As the connection layers, an anisotropic conductive film (ACF), an anisotropic conductive paste (ACP), or the like can be used.

[Coloring Layer]

As examples of a material that can be used for the coloring layers, a metal material, a resin material, and a resin material containing a pigment or dye can be given.

[Light-Blocking Layer]

Examples of a material that can be used for the light-blocking layer include carbon black, titanium black, a metal, a metal oxide, and a composite oxide containing a solid solution of a plurality of metal oxides. The light-blocking layer may be a film containing a resin material or a thin film of an inorganic material such as a metal. A stacked-layer film containing the material of the coloring layer can also be used for the light-blocking layer. For example, a stacked-layer structure of a film containing a material of a coloring layer which transmits light of a certain color and a film containing a material of a coloring layer which transmits light of another color can be employed. The coloring layer and the light-blocking layer are preferably formed using the same material, in which case the same manufacturing apparatus can be used and the process can be simplified.

The above is the description of each of the components.

At least part of this embodiment can be implemented in combination with any of the other embodiments described in this specification as appropriate.

Example 1

In this example, a transistor was formed with materials that transmit visible light.

[Structure of Transistor]

Figure 21A:
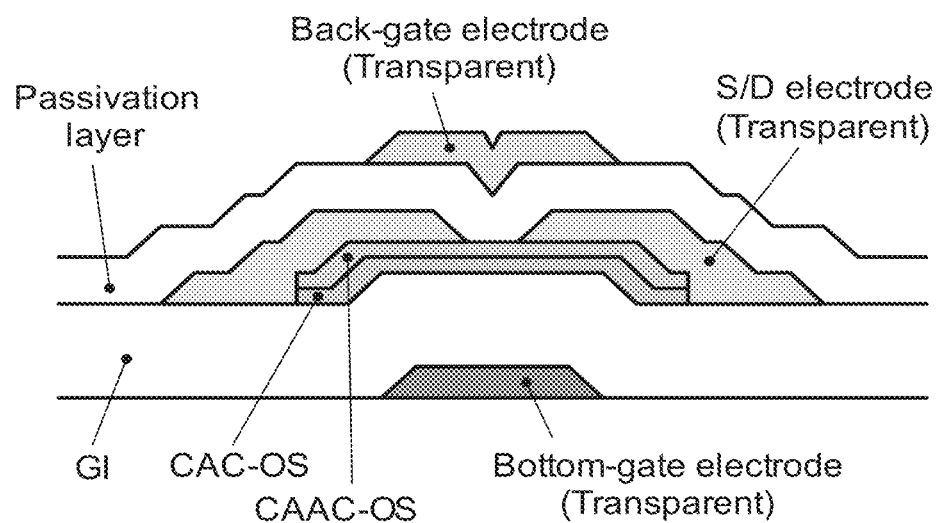
FIGS. 21A and 21B illustrate a structure of a transistor and electrical characteristics of the transistor according to Example 1.

The structure of the formed transistor is shown in FIG. 21A. The formed transistor was a bottom-gate transistor. The formed transistor was a visible-light-transmitting transistor in which a semiconductor layer (OS), a first gate electrode (Bottom-gate electrode), a second gate electrode (Back-gate electrode), and a source electrode and a drain electrode (S/D electrode) included light-transmitting materials.

[Formation of Transistor]

A method for forming the transistor is described below. For the first gate electrode, an indium tin oxide film containing silicon was formed by a sputtering method. Next, for a wiring to be a gate line (not illustrated), a copper film was formed by a sputtering method. For a gate insulating film (GI), a stack of a silicon nitride film and a silicon oxide film was formed by a plasma CVD method. For the semiconductor layer, an In—Ga—Zn oxide film was formed by a sputtering method. For the source electrode and the drain electrode, an indium zinc oxide film was formed by a sputtering method. In processing into the source electrode and the drain electrode, an etchant different from that used for processing into the semiconductor layer was used to prevent removal of the semiconductor layer. Then, for a wiring to be a source line (not illustrated), a copper film was formed by a sputtering method. Next, for an insulating layer (Passivation layer), a silicon oxide nitride film was formed by a plasma CVD method. Then, the second gate electrode was formed.

As the semiconductor layer, a stack of a CAC-OS film and a CAAC-OS film was used. The CAAC-OS film, having high chemical and plasma resistance, was formed on the upper side, thereby reducing the influence of damage in formation of the transistor. As the second gate electrode, a stack of a CAAC-OS film and a CAC-OS film was used.

[Electrical Characteristics of Transistor]

Figure 21B:
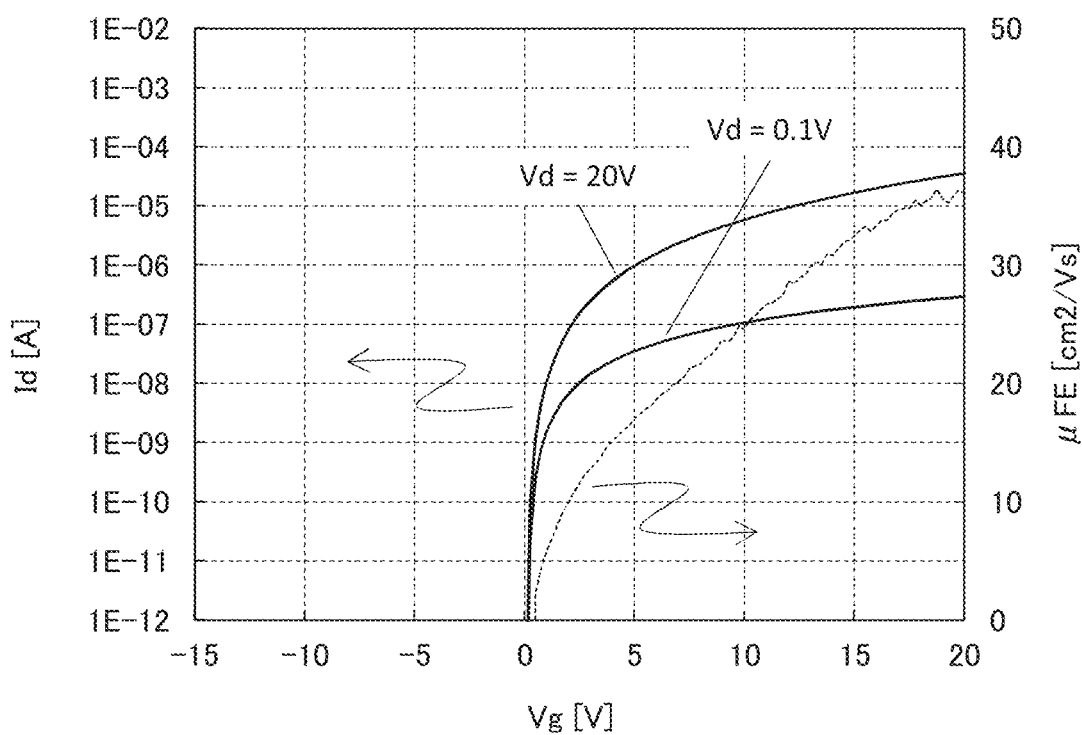

FIG. 21B shows measurement results of electrical characteristics of the formed transistor. The source-drain currents (Id) were measured at different gate-source voltages (Vg) (i.e., Id-Vg characteristics were measured). The drain voltages (Vd) were set to 0.1 V and 20 V. FIG. 21B also shows field-effect mobility estimated from the Id-Vg characteristics at Vd of 20 V. The channel length and the channel width of the measured transistor were approximately 2 μm and approximately 3.25 μm, respectively. As shown in FIG. 21B, the transistor was normally off and had favorable characteristics even with the extremely small channel length. The formed transistor had field-effect mobility over 35 $cm^2$/Vs, while a transistor in a commercial product had a field-effect mobility of approximately 10 $cm^2$/Vs.

Figure 22:
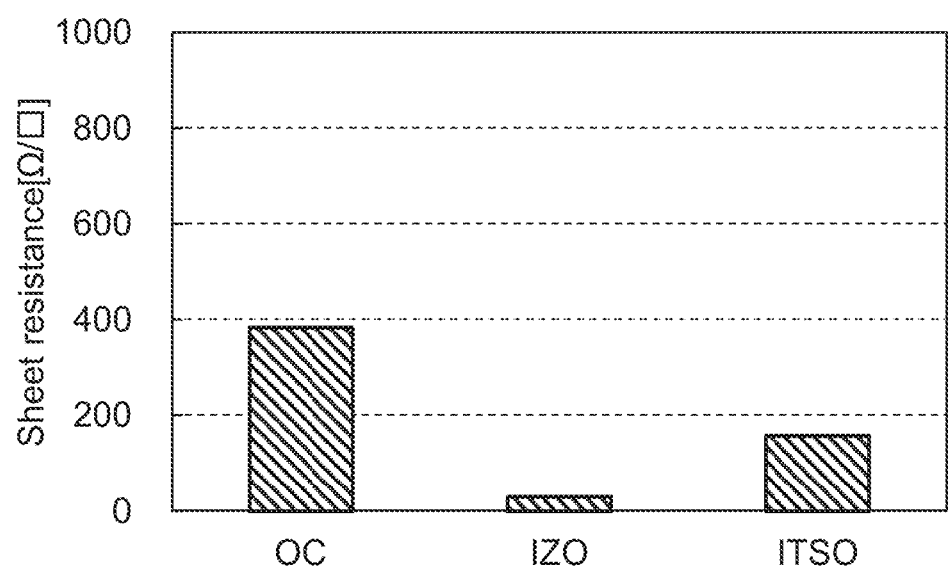
FIG. 22 shows the sheet resistance of a conductive film according to Example 1.

FIG. 22 shows measurement results of the sheet resistances of an oxide conductor film (OC), an indium zinc oxide film (IZO: registered trademark), and an indium tin oxide film containing silicon (ITSO), which were used as the light-transmitting conductive films in the formed transistor. As shown in the graph, each of them had sufficiently low resistance.

The above is the description of Example 1. At least part of this example can be implemented in combination with any of the other embodiments and the other examples described in this specification as appropriate.

Example 2

In this example, a display device of one embodiment of the present invention was formed. Here, a display device with a light-emitting element and a liquid crystal element capable of switching between the VR mode and the AR mode was formed.

[Light-Emitting Element]

Figure 23:
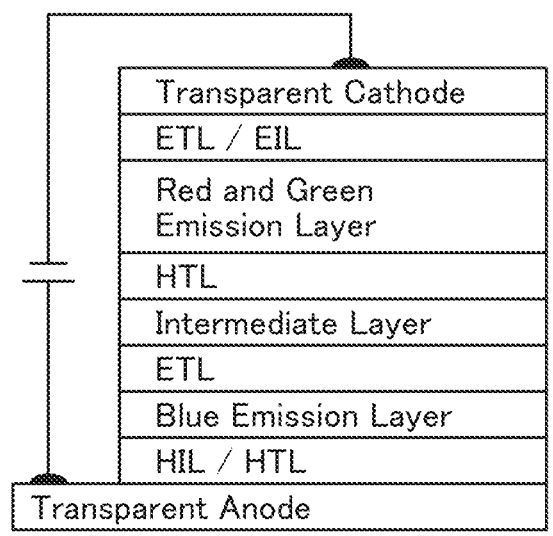
FIG. 23 illustrates a structure of a light-emitting element according to Example 2.

The light-emitting element included in the display device is described here. FIG. 23 shows the structure of the light-emitting element. The light-emitting element had a pair of electrodes each of which included a transparent conductive film so that the light-emitting element served as part of the transmission region to improve the transmittance in the transmission mode. The light-emitting element employed a two-layer tandem structure in which a blue light-emitting layer and a red and green light-emitting layer were stacked with an intermediate layer therebetween. The blue light-emitting layer contained a fluorescent material, and the red and green light-emitting layer contained a phosphorescent material.

[Liquid Crystal Element]

The liquid crystal element served as a shutter for switching between the AR mode and the YR mode. The liquid crystal element blocked external light in VR mode and transmitted external light in AR mode. Thus, passive driving, using a simple structure without a transistor or the like, was employed. Since no light-blocking material was needed for electrodes and the like of the liquid crystal element, the aperture ratio was 100%.

When the display device is used mainly in VR mode, the use of a normally black liquid crystal element can reduce power consumption. In this example, a VA mode liquid crystal element was employed. In forming a VA mode passive matrix liquid crystal element, optical alignment treatment was performed. Accordingly, liquid crystal molecules were capable of being aligned in the same direction across the whole liquid crystal element to which a voltage was applied; thus, the transmittance in AR mode was heightened.

Figure 24:
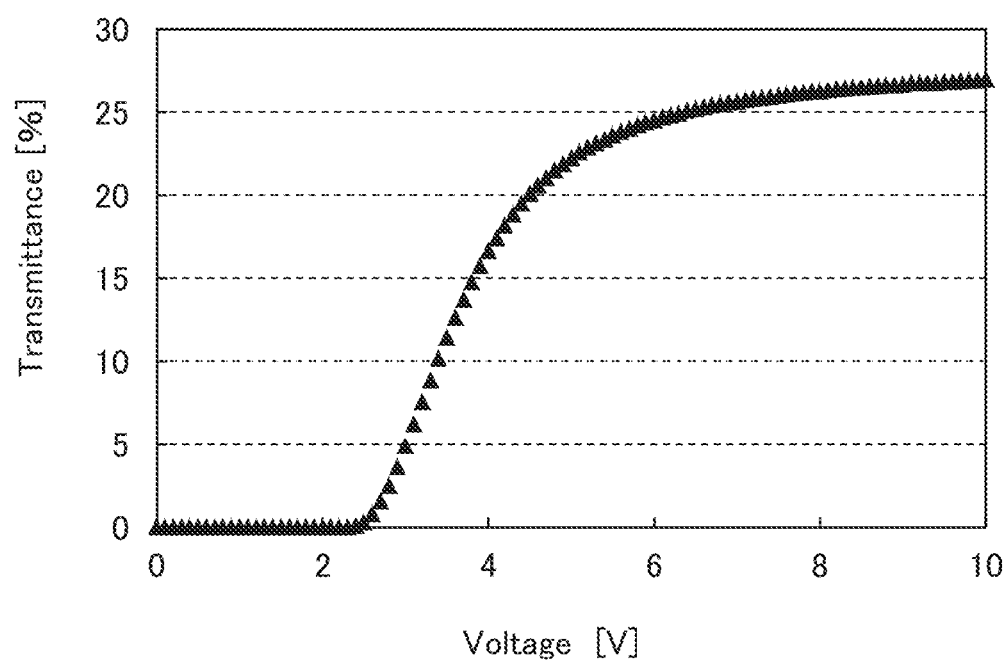
FIG. 24 shows the voltage-transmittance characteristics of a liquid crystal element according to Example 2.

FIG. 24 shows the voltage-transmittance characteristics of the formed liquid crystal element. As shown, the liquid crystal element had normally black characteristics with extremely low transmittance when not applied with a voltage.

[Formation of Display Device]

A method for manufacturing a display device including a light-emitting element and a liquid crystal element between a pair of substrates is described below. FIGS. 25A to 25F are schematic views illustrating a manufacturing process.

Figure 25A:
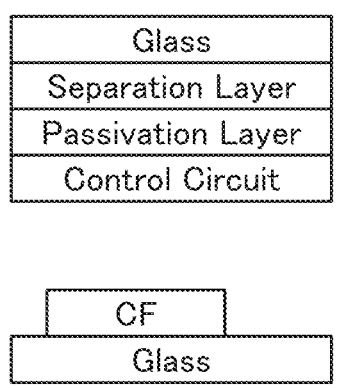
FIGS. 25A to 25F illustrate a method for manufacturing a display device according to Example 2.
Figure 25B:
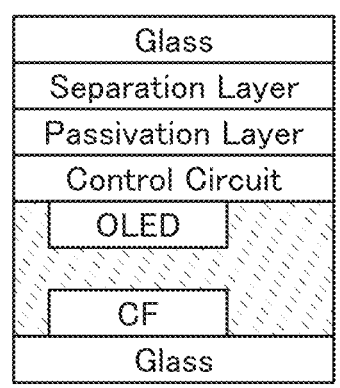
Figure 25C:
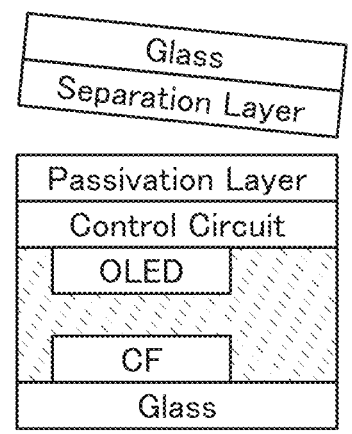
Figure 25D:
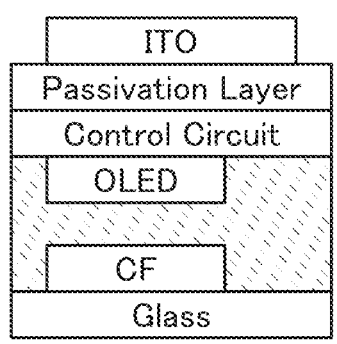
Figure 25E:
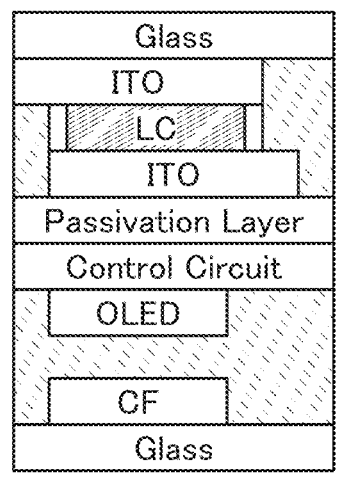
Figure 25F:
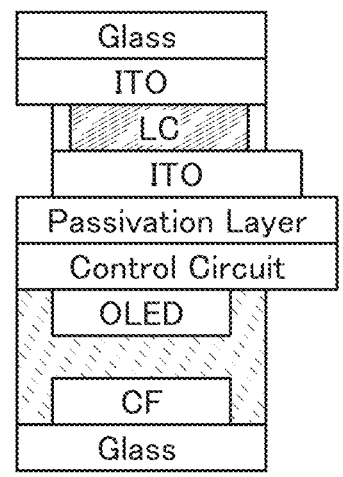

As shown in FIG. 25A, first, a separation layer (Separation Layer), an insulating layer (Passivation Layer), a control circuit including a transistor and the like (Control Circuit) were formed in this order over a glass substrate (Glass). A color filter (CF) was formed over another glass substrate. To improve the transmittance in the transmission mode, no black matrix was formed. Next, as shown in FIG. 25B, a light-emitting element (OLED) was formed over the control circuit, and the two glass substrates were attached to each other with a sealing resin. Then, as shown in FIG. 25C, separation was performed between the separation layer and the insulating layer. After that, as shown in FIG. 25D, a transparent conductive film (ITO) serving as one electrode of the liquid crystal element was formed over the insulating layer. Subsequently, a transparent conductive film serving as the other electrode of the liquid crystal element was similarly formed over another glass substrate. As shown in FIG. 25E, the two glass substrates were attached to each other with liquid crystal (LC) therebetween. In this way, a thin display device in which the light-emitting element, the control circuit, and the liquid crystal element were between the two glass substrates was obtained. Finally, as shown in FIG. 25F, the glass substrates were partly cut so that a terminal portion was exposed.

Table 1 shows the specifications of the formed display device, and Table 2 shows the specifications of the liquid crystal element. A zigzag arrangement shown in FIGS. 6A to 6D was employed for the pixel structure, and the display device had an extremely high definition of 1,058 ppi.

TABLE 1

| | Specifications |
| --- | --- |
| Screen Diagonal | 2.78 inches |
| Driving Method | Active Matrix |
| Resolution | 2560 × RGB × 1440 (WQHD) |
| Pixel Density | 1058 ppi |
| Pixel Pitch | 24 μm × 24 μm (approx.) |
| Aperture ratio (OLED) | 10.8% |
| Effective transmission area ratio | 66.1% |
| Pixel Arrangement | zigzag |
| Coloring Method | White Tandem OLED + Color Filter |
| Pixel Circuit | 2 Tr + 1 C/pixel |
| Source Driver | COF + Demultiplexer |
| Scan Driver | Integrated |
| Emission Type | Dual Emission |

TABLE 2

| | Specifications |
| --- | --- |
| Screen Diagonal | 3.26 inches |
| Driving Method | Passive |
| LC | VA mode |

[Measurement of Transmittance]

To confirm that the transmittance of a display device in the transmission mode would increase by the use of a transparent pixel including visible-light-transmitting conductive films for conductive layers other than a bus line of the display device, the following two samples were formed and the transmittances thereof were measured.

In each of the samples, a control circuit was formed over a glass substrate, and sealed by another glass substrate with a sealing resin. Thus, each of the samples included no light-emitting element and no liquid crystal element. One of the samples included visible-light-transmitting conductive films for conductive layers other than a bus line and had a transparent pixel. The other of the samples included visible-light-blocking conductive films also for conductive layers other than a bus line.

Figure 26A:
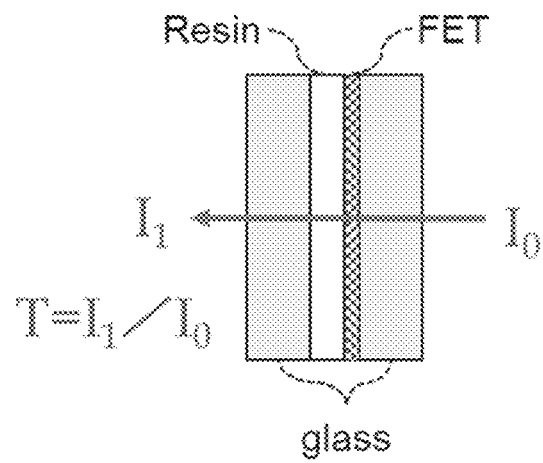
FIGS. 26A to 26C show the measurement results of transmittance according to Example 2.

As shown in FIG. 26A, intensity $I_1$ of light transmitted through each of the samples was measured. Transmittance T was a value obtained by dividing the transmission light intensity $I_1$ by incident light intensity $I_0$.

Figure 26B:
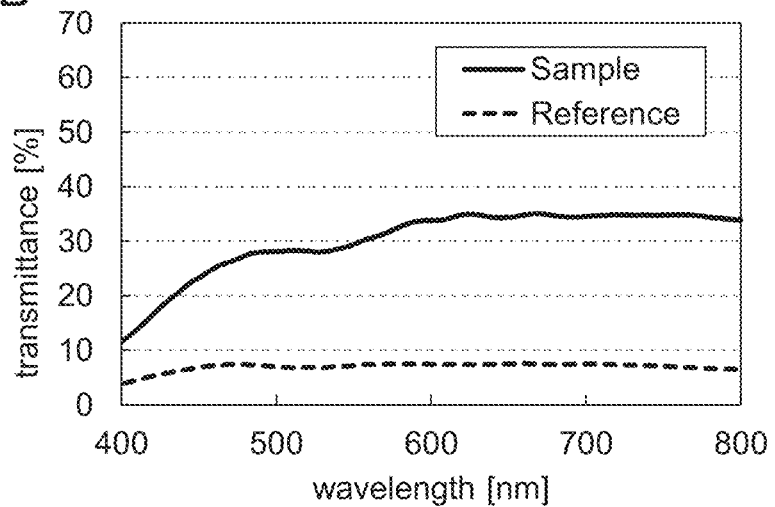
Figure 26C:
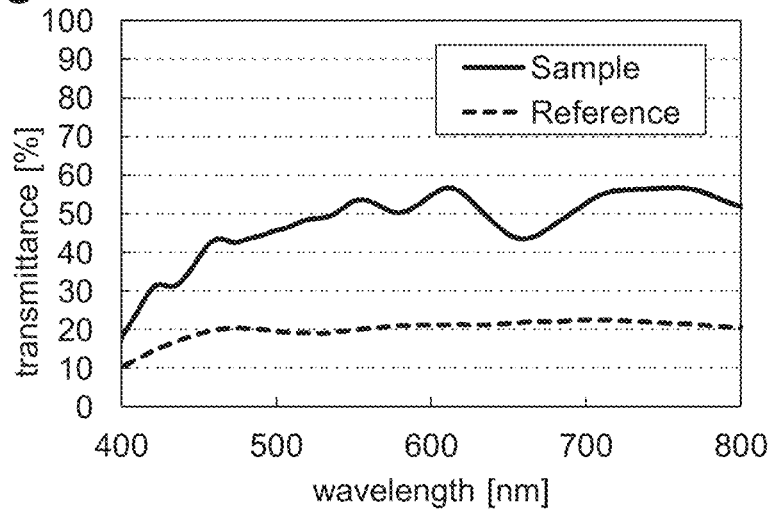

FIGS. 26B and 26C show the measured transmittance of the sample with the transparent pixel (Sample) and that of the sample without a transparent pixel (Reference). FIG. 26B shows the measurement results of the transmittance in a straight direction, and FIG. 26C shows the measurement results of the transmittance in all directions with an integrating sphere. In each of FIGS. 26B and 26C, the horizontal axis represents wavelength and the vertical axis represents transmittance. As shown in FIG. 26B, while the transmittance of the sample without a transparent pixel was approximately 7%, the transmittance of the sample with the transparent pixel reached approximately 30%. As in FIG. 26C showing the measurement results in all directions, while the sample without a transparent pixel had a transmittance of approximately 20%, the sample with the transparent pixel had an improved transmittance of approximately 48% on average. As shown, the use of the transparent pixel increased the transmittance.

[Display Device 1]

A display panel with extremely high definition was formed with a transparent pixel. The display panel formed here included no liquid crystal element, and the specifications of the display panel were the same as those in Table 1.

Figure 27:
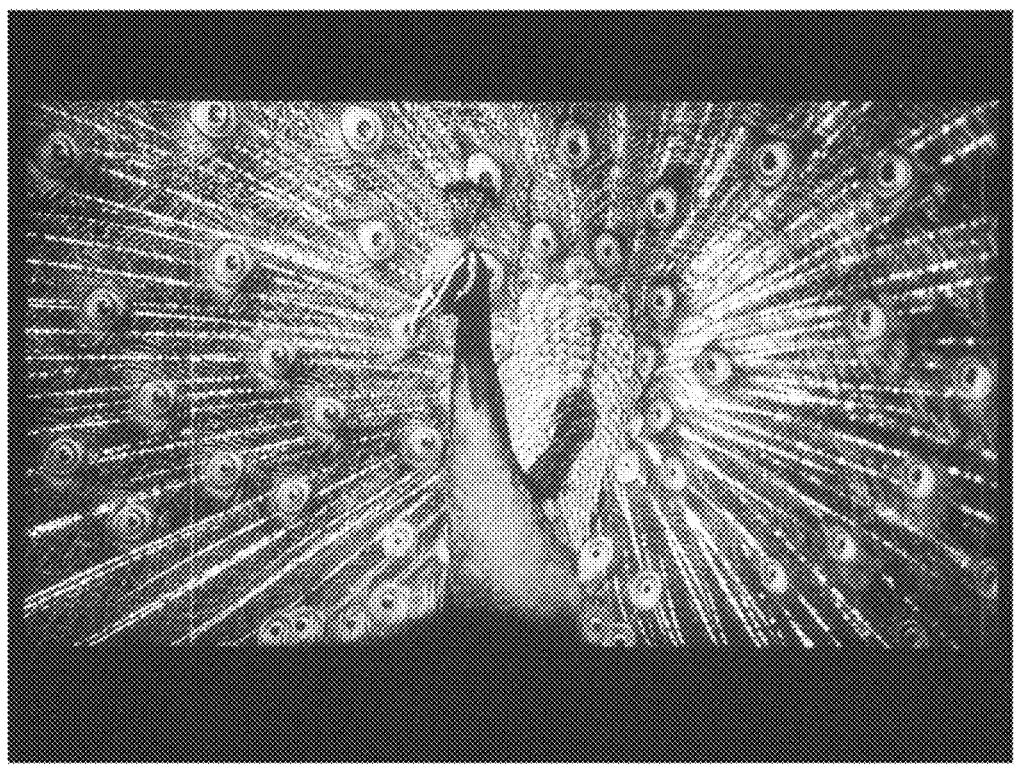
FIG. 27 is a photograph of a display panel according to Example 2.

FIG. 27 is a photograph of the display panel including the transparent pixel that was in the display state. This display panel did not include a liquid crystal element but included a control circuit, a light-emitting element, and a color filter that were sealed between a pair of substrates. FIG. 27 shows that the display panel with the transparent pixel operated normally.

[Display Device 2]

A display panel that included a light-emitting element and a liquid crystal element between a pair of substrates and was capable of switching between the VR mode and the AR mode was formed. This display panel included a pixel including a light-blocking conductive film, not a transparent pixel.

Figure 28A:
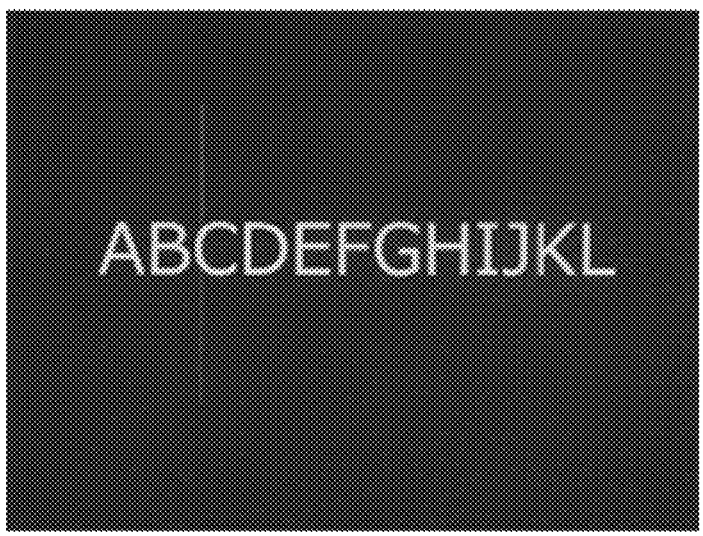
FIGS. 28A to 28D are photographs of a display panel according to Example 2 and schematic views for showing states in photographing.
Figure 28B:
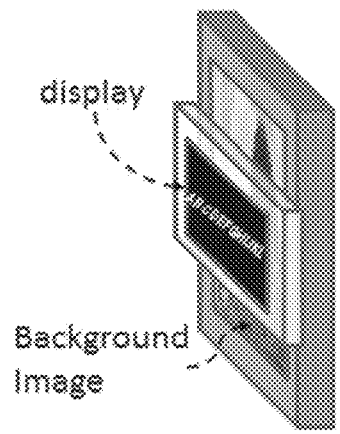
Figure 28C:
Figure 28D:
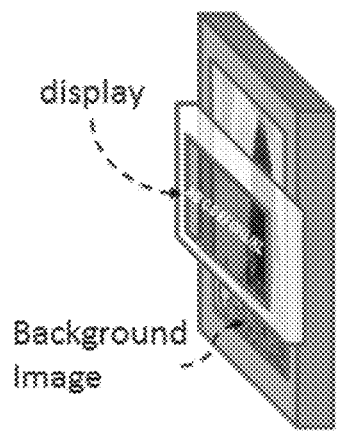

FIG. 28A is a photograph of the display panel displaying an image in VR mode, and FIG. 28C is a photograph of the display panel displaying an image in AR mode. FIGS. 28B and 28D are schematic views showing the situation in photographing. The formed display panel was positioned over the screen of a smartphone displaying a background image, and the photograph of the formed display panel was taken from the top surface side.

In VR mode, the background image was not seen because the liquid crystal element was in the light-blocking state; thus, an image displayed only with the light-emitting element was seen. In contrast, in AR mode, the image displayed with the light-emitting element was superimposed on the background image transmitted through the display panel.

The display panel shown here included no transparent pixel. When a transparent pixel is used instead, the transmission image can be seen more clearly.

The above is the description of Example 2. At least part of this example can be implemented in combination with any of the other embodiments and the other examples described in this specification as appropriate.

Example 3

An optical system including the display device formed in Example 2 is described here.

Figure 29A:
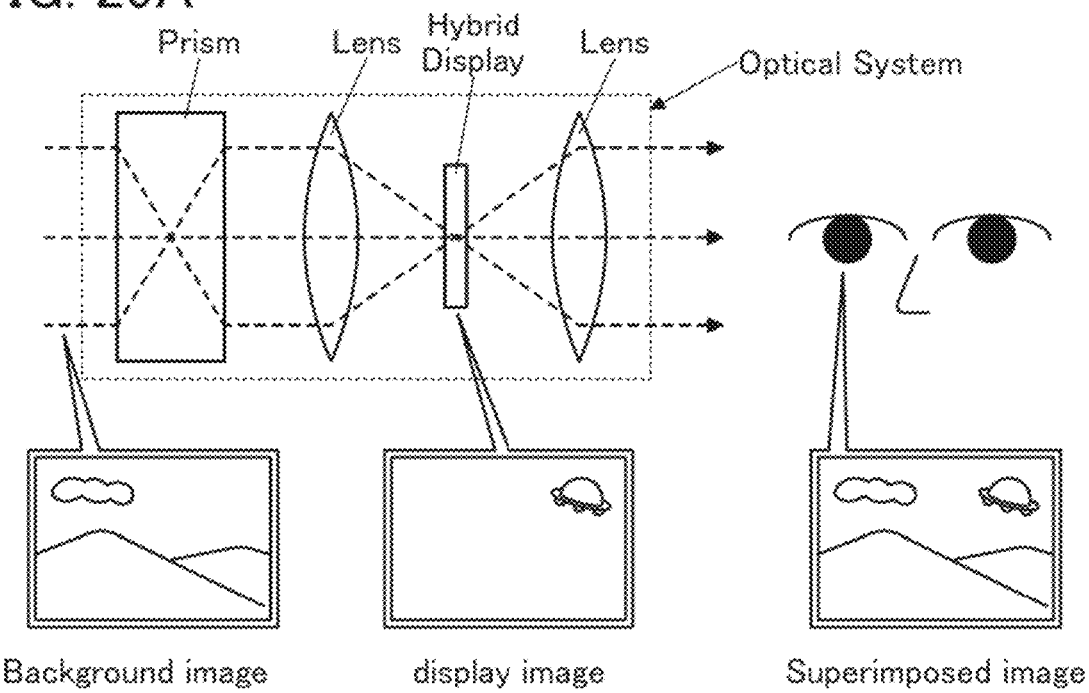
FIGS. 29A to 29D are schematic views of an optical system according to Example 3 and photographs of the optical system in a display state.

FIG. 29A is a schematic diagram of an optical system (Optical System). The optical system included a pair of lenses (Lens) between which the display panel (Hybrid Display) was sandwiched. A prism (Prism) for inverting an image was positioned opposite to an observer. The display panel was positioned at a focal point of the pair of lenses. For the pair of lenses, biconvex lenses with the same focal distance were used.

Figure 29B:
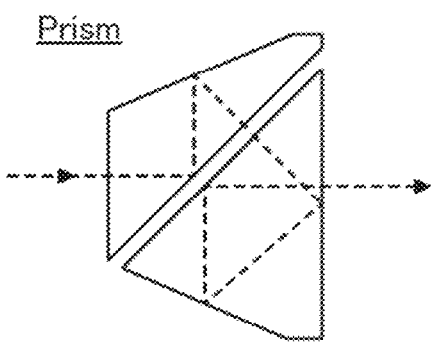

As the prism, a Schmidt-Pechan erect prism like one shown in FIG. 29B was used. Any erect prism can be used as the prism, and for example, an Abbe-Koenig prism may be used.

As shown in FIG. 29A, light entering the prism (the light is indicated by a dashed line) was inverted by the prism, refracted by the first lens, transmitted through the display panel, and inverted again when refracted by the second lens; accordingly, the observer was able to see an erected image.

FIG. 29A schematically shows a background image (Background image), a display image (display image) shown by the display panel, and a combined image (Superimposed image).

Figure 29C:
Figure 29D:
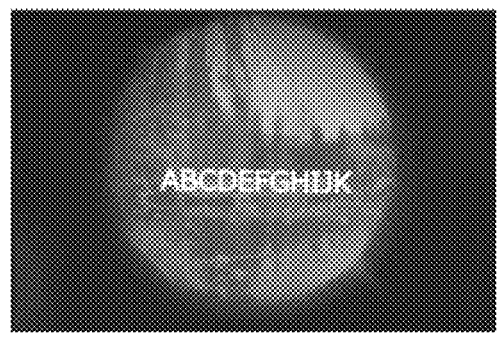

Image display was performed with the optical system shown in FIG. 29A. FIG. 29C is a photograph of the display panel displaying an image in VR mode, and FIG. 29D is a photograph of the display panel displaying an image in AR mode. As shown, the background image was observed clearly in AR mode, unaffected by diffraction due to the pixel periodicity of the display panel. In addition, the combined image in which both the background image and the display image were erected was obtained.

The above is the description of Example 3.

REFERENCE NUMERALS

10: display device, 10a: electronic device, 10EL: display portion, 10LC: transmission control portion, 11: control portion, 12: optical sensor, 13EL: driver portion, 13LC: driver portion, 15: arithmetic portion, 20B: light, 20e: light, 20G: light, 20in: light, 20R: light, 20t: transmission light, 21: substrate, 22: display region, 23: conductive layer, 24: liquid crystal, 25: conductive layer, 30: pixel, 31: substrate, 39a: polarizing plate, 39b: polarizing plate, 40: liquid crystal element, 41a: pixel circuit, 41b: pixel circuit, 42a: pixel circuit, 42b: pixel circuit, 43a: pixel circuit, 43b: pixel circuit, 45: functional layer, 45a: functional layer, 45b: functional layer, 50: subpixel, 50a: subpixel, 51: wiring, 51a: wiring, 51b: wiring, 52: wiring, 52a: wiring, 52b: wiring, 52c: wiring, 52d: wiring, 53: wiring, 53a: wiring, 53b: wiring, 53c: wiring, 55: semiconductor layer, 56: conductive layer, 57: conductive layer, 58: conductive layer, 59: wiring, 60: display element, 61: transistor, 61a: transistor, 61b: transistor, 61c: transistor, 61d: transistor, 62: transistor, 62a: transistor, 63: capacitor, 64: pixel electrode, 70: pixel unit, 70a: pixel, 70b: pixel, 71a: subpixel, 71b: subpixel, 72a: subpixel, 72b: subpixel, 73a: subpixel, 73b: subpixel, 81: insulating layer, 83: insulating layer, 84: insulating layer, 89: adhesive layer, 90: light-emitting element, 90B: light-emitting element, 90G: light-emitting element, 90R: light-emitting element, 90W: light-emitting element, 91: conductive layer, 91B1: pixel electrode, 91B2: pixel electrode, 91G1: pixel electrode, 91G2: pixel electrode, 91R1: pixel electrode, 91R2: pixel electrode, 92: EL layer, 92B: EL layer, 92G: EL layer, 92R: EL layer, 93: conductive layer, 100: image display device, 100a: image display device, 101: housing, 102: display portion, 102EL: display panel, 102p: display panel, 103: camera, 104: mounting fixture, 117: insulating layer, 130a: polarizing plate, 130b: polarizing plate, 133a: alignment film, 133b: alignment film, 134: coloring layer, 161: adhesive layer, 162: adhesive layer, 191: conductive layer, 192: EL layer, 193: conductive layer, 194: insulating layer, 201: transistor, 202: transistor, 204:

connection portion, 205: transistor, 206: transistor, 207: connection portion, 208: transistor, 209: wiring, 211: insulating layer, 212: insulating layer, 213: insulating layer, 214: insulating layer, 215: insulating layer, 216; insulating layer, 217: insulating layer, 220: insulating layer, 221: conductive layer, 221*t*: conductive layer, 222: conductive layer, 222*t*: conductive layer, 223: conductive layer, 224: conductive layer, 231: semiconductor layer, 242: connection layer, 243: connector, 252: connection portion, 300: display panel, 311: conductive layer, 312: liquid crystal, 313: conductive layer, 340: liquid crystal element, 351: substrate, 351*a*: substrate, 351*b*: substrate, 352: adhesive layer, 360: light-emitting element, 361: substrate, 361*a*: substrate, 361*b*: substrate, 362: display portion, 364: circuit, 365: wiring, 366: touch sensor, 372: FPC, 373: IC.

This application is based on Japanese Patent Application Serial No. 2016-219350 filed with Japan Patent Office on Nov. 10, 2016, Japanese Patent Application Serial No. 2016-233422 filed with Japan Patent Office on Nov. 30, 2016, and Japanese Patent Application Serial No. 2017-099585 filed with Japan Patent Office on May 19, 2017, the entire contents of which are hereby incorporated by reference.

What is claimed is:

1. A display device comprising:
    a plurality of light-emitting elements arranged in a first matrix;
    a plurality of liquid crystal elements arranged in a second matrix and overlapping with the plurality of light-emitting elements;
    a wiring;
    a first plurality of pixel circuits; and
    a second plurality of a pixel circuits, wherein each of the first plurality of pixel circuits is electrically connected to the wiring,
    wherein the wiring has a light-blocking property,
    wherein each of the first plurality of pixel circuits is electrically connected to one of the plurality of light-emitting elements which belong to a first column of the first matrix,
    wherein each of the first plurality of pixel circuits comprises a first transistor and a second transistor,
    wherein in each of the first plurality of pixel circuits:
    the first transistor comprises a first gate electrode and a first semiconductor layer;
    the second transistor comprises a second semiconductor layer;
    at least one of the first gate electrode, the first semiconductor layer, and the second semiconductor layer has a light-transmitting property; and
    the wiring comprises a bend portion between a region overlapping the first semiconductor layer of the first transistor and a region overlapping the second semiconductor layer of the second transistor,
    wherein each of the second plurality of pixel circuits comprises a third transistor, wherein in each of the second plurality of pixel circuits:
    the third transistor is electrically connected to one of the plurality of liquid crystal elements,
    wherein the plurality of liquid crystal elements are arranged to give a definition lower than the plurality of light-emitting elements, and
    wherein the first transistors of the first plurality of the pixel circuits, the second transistors of the first plurality of the pixel circuits, and the third transistors of the second plurality of the pixel circuits are on the same plane.

2. The display device according to claim 1, wherein the plurality of light-emitting elements are arranged to give a definition higher than or equal to 300 ppi and lower than or equal to 10,000 ppi.

3. The display device according to claim 1, wherein the at least one of the first gate electrode, the first semiconductor layer and the second semiconductor layer includes a metal oxide.

4. The display device according to claim 1, wherein the third transistor comprises a second gate electrode and a third semiconductor layer, and
    wherein at least one of the second gate electrode and the third semiconductor layer has a light-transmitting property.

5. The display device according to claim 4, wherein the at least one of the second gate electrode and the third semiconductor layer includes a metal oxide.

6. The display device according to claim 1,
    wherein each of the first plurality of pixel circuits comprises a capacitor,
    wherein the capacitor comprises a first electrode overlapping the wiring, and a dielectric layer positioned between the wiring and the first electrode,
    wherein the first gate electrode is electrically connected to the first electrode, and
    wherein the second semiconductor layer is electrically connected to the first electrode.

7. A display device comprising: first to n-th light-emitting elements, wherein n is an integer of 2 or more; a first liquid crystal element;
    a wiring;
    first to n-th pixel circuits electrically connected to the first to n-th light-emitting elements; and
    an (n+1)th pixel circuit electrically connected to the first liquid crystal element,
    wherein each of the first to n-th light-emitting elements comprises a pixel electrode and a light-emitting layer overlapping with the pixel electrode,
    wherein each of the first to n-th pixel circuits comprises a first transistor and a second transistor,
    wherein the first transistor comprises a first gate electrode, a first source electrode, a first drain electrode, and a first semiconductor layer, wherein the second transistor comprises a second semiconductor layer,
    wherein the (n+1)-th pixel circuit comprises a third transistor,
    wherein the third transistor comprises a second gate electrode, a second source electrode, a second drain electrode, and a third semiconductor layer,
    wherein the first transistor, the second transistor, and the third transistor are on the same plane,
    wherein the one of the first source electrode and the first drain electrode of the first transistor of a m-th pixel circuit is electrically connected to the m-th light-emitting element, wherein m is an integer higher than or equal to 1 and lower than or equal to n,
    wherein the first liquid crystal element comprises a first electrode, a second electrode, and a liquid crystal layer between the first electrode and the second electrode,
    wherein the first electrode overlaps with each of the first to n-th light-emitting elements, wherein the first electrode is electrically connected to one of the second source electrode and the second drain electrode of the third transistor, wherein the wiring has a light-blocking property, wherein the wiring comprises first to n-th bend portions, wherein the m-th bend portion is between a region overlapping the first semiconductor layer of the first transistor and a region overlapping the second semiconductor layer of the second transistor in the m-th pixel circuit, and wherein at least one of the first gate electrode, the second gate electrode, the first semiconductor layer, the second semiconductor layer and the third semiconductor layer has a light-transmitting property.

8. The display device according to claim 7, wherein the at least one of the first gate electrode, the second gate electrode, the first semiconductor layer, the second semiconductor layer and the third semiconductor layer includes a metal oxide.

9. The display device according to claim 7, wherein at least one of the first source electrode, the second source electrode, the first drain electrode and the second drain electrode has a light-transmitting property.

10. The display device according to claim 7, wherein at least one of the first source electrode, the second source electrode, the first drain electrode and the second drain electrode has a light-transmitting property and includes a metal oxide.

* * * * *